US012615699B2

(12) United States Patent
Kim et al.

(10) Patent No.: US 12,615,699 B2
(45) Date of Patent: Apr. 28, 2026

(54) COOKING APPLIANCE

(71) Applicant: LG ELECTRONICS INC., Seoul (KR)

(72) Inventors: Dong Hun Kim, Seoul (KR); Dong kwan Yu, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 775 days.

(21) Appl. No.: 17/973,329

(22) Filed: Oct. 25, 2022

(65) Prior Publication Data

US 2023/0137868 A1     May 4, 2023

(30) Foreign Application Priority Data

Oct. 28, 2021 (KR) ........................ 10-2021-0146152
Jan. 5, 2022 (KR) ........................ 10-2022-0001815

(51) Int. Cl.
*H05B 6/12* (2006.01)
*H05B 6/64* (2006.01)
*H05K 9/00* (2006.01)

(52) U.S. Cl.
CPC ......... *H05B 6/1245* (2013.01); *H05B 6/6402* (2013.01); *H05K 9/0052* (2013.01)

(58) Field of Classification Search
None
See application file for complete search history.

(56) References Cited

U.S. PATENT DOCUMENTS

| | | | |
|---|---|---|---|
| 5,698,125 A | 12/1997 | Kwon | |
| 8,772,686 B2 | 7/2014 | Louie et al. | |
| 12,069,791 B2 * | 8/2024 | Lee | H05B 6/6411 |
| 2002/0190063 A1 | 12/2002 | Lee | |
| 2008/0148961 A1 | 6/2008 | Hwang et al. | |
| 2018/0058702 A1 | 3/2018 | Jang et al. | |
| 2021/0235555 A1 * | 7/2021 | Lim | H05B 6/6411 |
| 2021/0267026 A1 * | 8/2021 | Kim | H05B 6/6482 |
| 2022/0418056 A1 * | 12/2022 | Lee | H05B 6/6411 |

(Continued)

FOREIGN PATENT DOCUMENTS

| | | |
|---|---|---|
| CN | 110613363 A | 12/2019 |
| CN | 210354393 U | 4/2020 |

(Continued)

*Primary Examiner* — Thor S Campbell

(74) *Attorney, Agent, or Firm* — Bryan Cave Leighton Paisner LLP

(57) ABSTRACT

A cooling appliance is proposed. A cavity (S) may be provided inside a casing (100, 200). A first heat source module (400) may be arranged in the casing (100, 200) and emit microwaves. A second heat source module (500) may be arranged at a bottom surface of the casing (100, 200) and emit magnetic fields. In addition, the second heat source module (500) may include a base plate (510) having a base hole (512) that is open at a center portion thereof, and a supporter (520) arranged below the base plate (510). A coil assembly (550) may be arranged between base plate (510) and the supporter (520). At this point, a shield filter (540) of the second heat source module (500) covers a working coil (570) of the coil assembly (550), and an outer end of the shield filter (540) may be arranged between the base plate (510) and a coil base (560).

20 Claims, 40 Drawing Sheets

(56)     References Cited

U.S. PATENT DOCUMENTS

2023/0086024 A1 *   3/2023   Jeong ................... A47J 37/0635
                                                  99/339
2023/0180358 A1 *   6/2023   Shin ....................... H05B 6/129
                                                  219/601
2024/0057228 A1 *   2/2024   Ha ........................ H05B 6/6482
2024/0196489 A1 *   6/2024   Ha ........................ H05B 6/6494
2024/0251487 A1 *   7/2024   Hong ................... H05B 6/6482

FOREIGN PATENT DOCUMENTS

JP          H02183993  A       7/1990
JP          2003157964 A       5/2003
WO          2016056247 A1      4/2016
WO      WO-2021215593 A1 *  10/2021   ............... H05B 6/76
WO      WO-2022239893 A1 *  11/2022   ........... H05B 6/6408

* cited by examiner

COOKING APPLIANCE

CROSS-REFERENCE TO RELATED APPLICATION

This application claims priority to and the benefit of Korean Patent Application No. 10-2021-0146152, filed on Oct. 28, 2021, and Korean Patent Application No. 10-2022-0001815, filed on Jan. 5, 2022, the disclosures of which are incorporated herein by reference in their entirety.

BACKGROUND OF THE INVENTION

Field of the Invention

The present disclosure relates generally to a cooking appliance.

Description of the Related Art

Various types of cooking appliances are used to heat food at home or in restaurants. For example, such cooking appliances may include microwave ovens, induction heating electric ranges, and grill heaters.

A microwave oven heats food by using molecules in a high-frequency electric field vibrating strongly to generate heat. The microwave oven can heat food evenly in a short time.

An induction heating electric range is a cooking appliance that uses electromagnetic induction to heat an object to be heated. Specifically, when high-frequency power of a predetermined size is applied to a coil, the induction heating electric range generates eddy currents in the object to be heated, which is made of a metal substance, using a magnetic field generated around the coil, and thus heating the object to be heated.

A grill heater is a cooking appliance that heats food by radiating or convection of infrared heat. The grill heater allows infrared heat to pass through the food, so that the food can be cooked evenly throughout.

Accordingly, as the cooking appliances using various types of heat sources are released, the number and types of cooking appliances provided to users have increased, and there is a problem in that the cooking appliances occupy a large volume in the living space. Accordingly, there is increased demand i for a composite cooking appliance having a plurality of heating modules. In addition, it is necessary to develop a cooking appliance that simultaneously uses a plurality of heating methods so that food in the object to be heated is cooked more uniformly and quickly.

U.S. Pat. No. 6,987,252 B2 (related art 1) disclosed the technique for cooking food using radiant heat and convection heat along with microwaves. However, microwaves or radiant heat and convection heat using heaters are limited in rapidly heating food. In order to solve this problem, recently, induction heating type cooking appliances are being used.

For example, Korean Patent Application Publication No. 10-2018-0115981 (related art 2) disclosed a cooking appliance for using microwave and inductive heat sources at the same time in one device.

However, the cooking appliance in the related art 2 is configured to cover induction heating coils by a shield cover in order to prevent microwaves from approaching the inductive heat source during usage of the microwave heat source. Therefore, in the case of the related art 2, the two types of heat sources are not used at the same time, and furthermore, the cooking appliance in the related art 2 has a discomfort in that the shielding cover must be rotated each time the microwave heat source is used.

SUMMARY OF THE INVENTION

Accordingly, the present disclosure has been made keeping in mind the above problems occurring in the related arts, and an objective of the present disclosure is to use a microwave heat source (first heat source module) and an inductive heat source (second heat source module) at the same time.

Another objective of the present disclosure is to fix a shield filter for blocking microwaves an inductive heat source without a separate fastening tool.

A further objective of the present disclosure is to prevent microwaves and foreign materials from transferring into the inside space of the coil assembly.

According to features of the present disclosure for achieving the above-described objectives, a casing may have a cavity therein, and a first heat source module may be arranged in the casing, and be configured to emit microwaves. A second heat source module may be arranged at a bottom surface of the casing and be configured to emit magnetic fields. In addition, the second heat source module may include a base plate having a base hole that is open at a center portion thereof, and a supporter arranged below the base plate. A coil assembly may be arranged between the base plate and the supporter, and the coil assembly may include a coil base and a working coil.

Herein, a shield filter of the second heat source module may cover the working coil, and an outer end of the shield filter may be arranged between the base plate and the coil base. The shield filter may prevent electromagnetic waves generated when a microwave heat source (first heat source module) is used from affecting the second heat source module, so that the microwave heat source (first heat source module) and the inductive heat source (second heat source module) may be used at the same time.

In addition, the outer end of the shield filter may be pressed between the base plate and the coil base. Therefore, the shield filter may e fixed between the base plate and the coil assembly without a separate fastening tool.

Furthermore, the base plate may include a filter cover portion arranged along a rim of the base hole, and the filter cover portion may be stacked on the shield filter. Therefore, the filter cover portion may fix an upper portion of the shield filter.

Furthermore, an outer end of the coil base may include a filter supporter arranged parallel to the filter cover portion, and the filter supporter may be stacked under the shield filter. Therefore, the upper and lower portions of the shield filter may be fixed by the filter cover portion and the filter supporter.

Specifically, the filter cover portion and the filter supporter may be respectively in surface-contact with the shield filter. Accordingly, a gap through which microwaves may leak may be further narrowed.

Furthermore, the filter cover portion may be connected to a first inclined portion, and the filter supporter may be connected to the second inclined portion. Herein, the first inclined portion and the second inclined portion may be arranged to face each other at positions outside the outer end of the shield filter in a radial direction of the shield filter. Therefore, foreign materials, etc. may be prevented from leaking toward the shield filter.

Furthermore, a gap between the first inclined portion and the second inclined portion may be formed to be gradually narrowed as going further from the outer end of the shield filter. In this state, the first inclined portion and the second inclined portion may press the outer end of the shield filter.

The coil base may have a clearance between the filter cover portion and an outer end of the working coil, and the clearance may be continuously formed in a circumferential direction of the coil base. The clearance may form an empty space around the working coil, so that transfer of microwaves or foreign materials into the working coil may be prevented.

Furthermore, a diameter of the shield filter may be larger than a diameter of the working coil, and may be smaller than a diameter of the supporter. Simultaneously, the diameter of the shield filter is larger than a diameter of the base hole, and may be smaller than a diameter of the coil base. Therefore, the shield filter may fully cover the upper portion of the working coil so that microwaves transferred to the working coil may be effectively blocked, and magnetic fields generated by the working coil may be efficiently transferred to the upper portion via the cover plate.

Furthermore, the filter cover portion, the first inclined portion, the depressed portion, and the seating portion may be sequentially connected to each other at the base plate. Here, the seating portion may be formed higher than the filter cover portion. Accordingly, vibrations transferred to the cover plate when the working coil is operated may be reduced, and noise of the cooking appliance may be reduced.

Furthermore, an outer end of the seating portion may be connected to a seating fence, and the seating fence may protrude upward and surround an edge of the cover plate. In addition, both the seating fence and the cover plate may provide a bottom surface of the cavity, and a surface of the seating fence and a surface of the cover plate may form a continuous surface together. Therefore, the bottom surface of the cavity can be formed flat, and the cavity may be easily cleaned.

Furthermore, the mounting bracket may be arranged between the base plate and the supporter. Here, the mounting bracket may include a bracket lower portion coupled to the supporter and a bracket upper portion coupled to the base plate. In addition, the bracket connection portion may connect the bracket lower portion to the bracket upper portion.

As described above, the cooking appliance according to the present disclosure have at least the following effects.

In the present disclosure, the shield filter is applied to the inductive heat source (second heat source module), and the shield filter can prevent leakage of microwaves. The shield filter can prevent electromagnetic waves generated when the microwave heat source (first heat source module) is used from affecting the second heat source module, so that the microwave heat source (first heat source module) and the inductive heat source (second heat source module) can be used at the same time. Therefore, as the food can quickly heated, the cooling time can be reduced.

In addition, in the present disclosure, the shield filter may be arranged between the base plate and the coil assembly that constitute the second heat source module. Here, the coil assembly can be fixed to the base plate by the supporter, and the shield filter can be fixed between the base plate and the coil assembly without a separate fastening tool. Therefore, the embodiment can eliminate a risk of arc discharge occurring when an electric field is concentrated to an edge of a hole to which the fastening tool is used or a sharp screw thread, and the stability of the cooling appliance can be improved.

Specifically, in the present disclosure, the upper and lower portions of the outer end, the edge of the shield filter, can be respectively pressed by the base plate and the coil base. Therefore, the air-tightness of the shield filter can be improved, and leakage of electromagnetic waves toward the working coil can be efficiently blocked.

Furthermore, in the present disclosure, the first inclined portion of the base plate and the second inclined portion of the coil base can be arranged to face each other with the outer end of the shield filter located between the first and second inclined portions, and the first inclined portion and the second inclined portion can be extended in a direction away from the outer end of the shield filter. The first inclined portion and the second inclined portion can reduce the gap between the base plate and the coil base, thereby preventing both electromagnetic waves and foreign materials from flowing to the shield filter.

Furthermore, the first inclined portion and the second inclined portion are composed of facing inclined surfaces, so when the base plate and the coil assembly are assembled with each other, the two members can be naturally aligned in X and Y-axial directions. Therefore, the assembly performance of the second heat source module can be improved.

Furthermore, the seating portion of the base plate at which the cover plate is placed can be formed higher than the filter cover portion fixing the shield filter. Due to the height difference, the cover plate is prevented from touching the filter cover portion, but can touch only the seating portion, so that the cover plate and the shield filter can be spaced apart from each other. Accordingly, vibrations transferred to the cover plate when the working coil is operated can be reduced, and noise of the cooking appliance can be reduced.

In addition, the diameter of the shield filter may larger than the diameter of the working coil, and may be smaller than the diameters of the cover plate and the supporter. Accordingly, the shield filter can fully cover the upper portion of the working coil so as to efficiently block microwaves transferred to the working coil. On the other hand, magnetic fields generated from the working coil can be efficiently transferred to the upper portion via the cover plate.

Furthermore, in the present disclosure, the outer end of the working coil and the filter supporter of the coil base are spaced apart from each other, and a kind of empty space can be formed therebetween. Therefore, the gap between the outer end of the shield filter and the filter supporter through which electromagnetic waves can flow can be spaced away from the working coil, and transfer of microwaves to the working coil can be completely prevented.

The objects of the present disclosure are not limited to the above-described objects, and other objects and advantages not mentioned may be understood by the following description, and will be more clearly understood by the embodiments of the present disclosure. In addition, it will be easily seen that the objects and advantages of the present disclosure may be realized by the means described in the claims and combinations thereof.

BRIEF DESCRIPTION OF THE DRAWINGS

The accompanying drawings constitute a part of this specification and illustrate one or more embodiments of the present disclosure and together with the specification, explain the present disclosure.

DETAILED DESCRIPTION OF THE INVENTION

Figure 1:
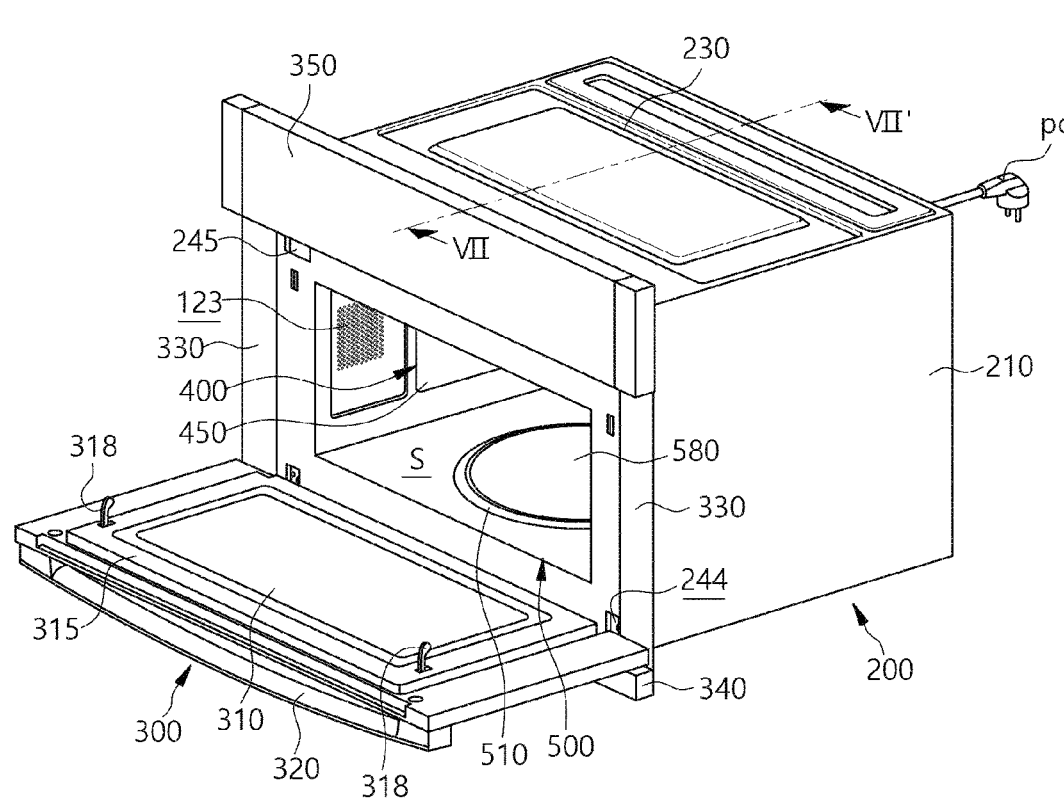
FIG. 1 is a perspective view showing a cooking appliance according to an embodiment of the present disclosure.

The above-described objects, features, and advantages will be described below in detail with reference to the accompanying drawings, and accordingly, those skilled in the art to which the present disclosure pertains will be able to easily practice the technical spirit of the present disclosure. In describing the present disclosure, when it is determined that a detailed description of a known technique related to the present invention may unnecessarily obscure the gist of the present disclosure, the detailed description will be omitted. Hereinafter, embodiments according to the present disclosure will be described in detail with reference to the accompanying drawings. In the drawings, the same reference numerals are used to indicate the same or similar components.

Although the first, second, etc. are used to describe various components, it is understood that these components are not limited by these terms. These terms are only used to distinguish one component from other components, and unless otherwise stated, it is understood that the first component may also be the second component.

As used herein, unless specifically stated otherwise, each component may be singular or plural.

As used herein, the singular expression includes the plural expression unless the context clearly dictates otherwise. In the present disclosure, terms such as "consisting of" or "comprising" should not be construed as necessarily including all of the various components or various steps described in the specification, and should be construed that some components or some steps may not be included, or additional components or steps may be further included.

As used herein, various singular forms "a," "an" and "the" are intended to include various plural forms as well, unless context clearly indicates otherwise. For example, a term "a" or "an" shall mean "one or more," even though a phrase "one or more" is also used herein. Use of the optional plural "(s)," "(es)," or "(ies)" means that one or more of the indicated feature is present.

As used herein, "up-down direction" means the up-down direction of the cooking appliance in a state in which the cooking appliance (or other components) is installed for daily use. "Left-right direction" means a direction perpendicular to the up-down direction, and the front-rear direction means a direction perpendicular to both the up-down direction and the left-right direction. "Bilateral direction" or "lateral direction" has the same meaning as the left-right direction, and these terms may be used interchangeably in the present specification.

Various terminology used herein can imply direct or indirect, full or partial, temporary or permanent, action or inaction. For example, when an element is referred to as being "on," "connected" or "coupled" to another element, then the element can be directly on, connected or coupled to the other element or intervening elements can be present, including indirect or direct variants. In contrast, when an element is referred to as being "directly connected" or "directly coupled" to another element, there are no intervening elements present. A cooking appliance of the present disclosure is provided to cook object to be cooked (hereinbelow, which will be referred to as "food") using a plurality of heat sources. The cooking appliance of the present disclosure may include a first heat source module 400, a second heat source module 500, and a third heat source module 600. The first heat source module 400, the second heat source module 500, and the third heat source module 600 may be respectively arranged in the cooking appliance of the present disclosure, and may consist of different types of heat sources. Hereinbelow, these plurality of heat sources, cooling fan modules for cooling the heat sources, and devices for measuring a state of the cooking appliance will be described in priority.

FIG. 1 is a view showing a cooking appliance according to an embodiment of the present disclosure. As shown, in the embodiment, a cavity S may be provided inside the cooking appliance, and the cavity S may be opened and closed by a door 300. Except for the door 300, the other parts of the cooking appliance may be shielded by a casing 100, 200. The cavity S is an empty portion or hollowed out space, may be referred to as a cooking chamber. The casing 100, 200 may include the inner casing 100 and an outer casing 200. Specific structures of the inner casing 100 and the outer casing 200 will be described below.

In the embodiment shown in FIG. 1, the first heat source module 400 may be arranged at a left portion of the cooking appliance and the second heat source module 500 may be arranged at the bottom of the cooking appliance. The third heat source module 600 may be arranged at an upper portion of the cooking appliance. As described above, in the embodiment, the first heat source module 400, the second heat source module 500, and the third heat source module 600 may be respectively arranged at different surfaces among six surfaces constituting the casing 100, 200, and the arrangement of such is not limited to the particular arrangement shown in FIG. 1.

Figure 2:
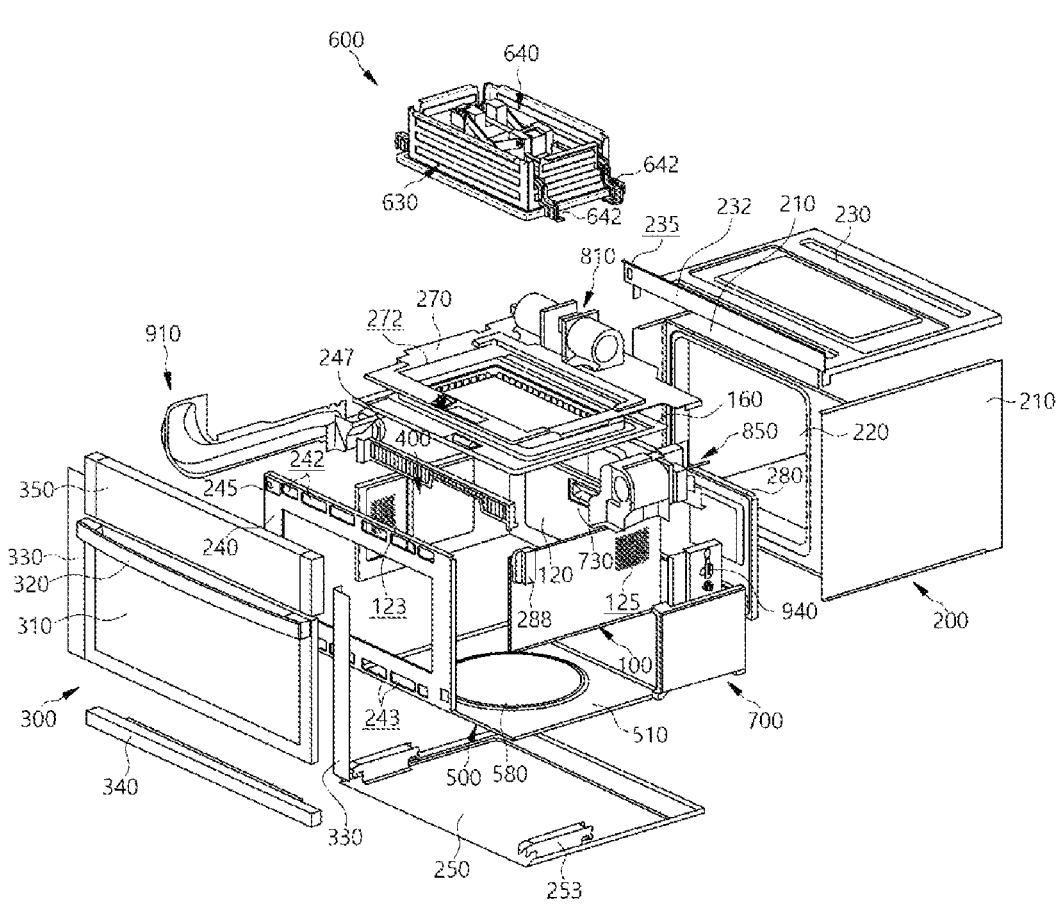
FIG. 2 is an exploded-perspective view showing components constituting the cooking appliance according to the embodiment of the present disclosure.

FIG. 2 is a view showing disassembled components constituting the cooking appliance, wherein the third heat source module 600 is exposed. In the embodiment, the third heat source module 600 may move between a first location and a second For example, as shown, the third heat source module 600 may move toward the bottom surface of the cavity S while being raised, i.e., toward the second heat source module 500.

Alternatively, for example, the first heat source module 400 may be arranged at a right portion of the cooking appliance, and the third heat source module 600 may be arranged at a rear surface of the cooking appliance. Furthermore, the third heat source module 600 may be fixed to the casing 100, 200 without moving.

As shown in FIG. 2, the inner casing 100 constituting the casing 100, 200 may be provided to surround the cavity S. The inner casing 100 may include a pair of inner side plates 110 and an inner rear plate 120 connecting the pair of inner side plates 110 to each other. The pair of inner side plates 110 and the inner rear plate 120 may be formed approximately in a "⊂"-like shape.

The third heat source module 600 may be arranged at an upper portion of the inner casing 100. In other words, the third heat source module 600 may shield an upper portion of the cavity S. The second heat source module 500 may be arranged at a lower portion of the inner casing 100. The second heat source module 500 may shield a lower portion of the cavity S. Therefore, the second heat source module 500 and the third heat source module 600 may also be considered as a part of the inner casing 100 surrounding the cavity S.

The pair of inner side plates 110 may respectively include an inlet port 123 and an outlet port 125. The inlet port 123 and the outlet port 125 may be respectively on the pair of side plates, and may be arranged at the opposite sides to each other. The inlet port 123 and the outlet port 125 are open toward the cavity S to connect the cavity S to the outside space.

The inlet port 123 may be open toward the cavity S. A supply duct 910 to be described below may be arranged on an outer surface of one of the pair of side plate with the inlet port 123 and air may be supplied through the inlet port 123. Water evaporates from the food cooked by the first heat source module 400, so that moisture may be generated inside the cavity S. In order to remove such moisture, it is necessary to supply air into the cavity S. In the embodiment, air may be injected through the inlet port 123 and may be discharged through the outlet port 125 located opposite to the inlet port 123. Herein, air supplied through the inlet port 123 may be a part of air acting heat dissipation (cooling) while passing through the inside space of the casing 100, 200.

Figure 3:
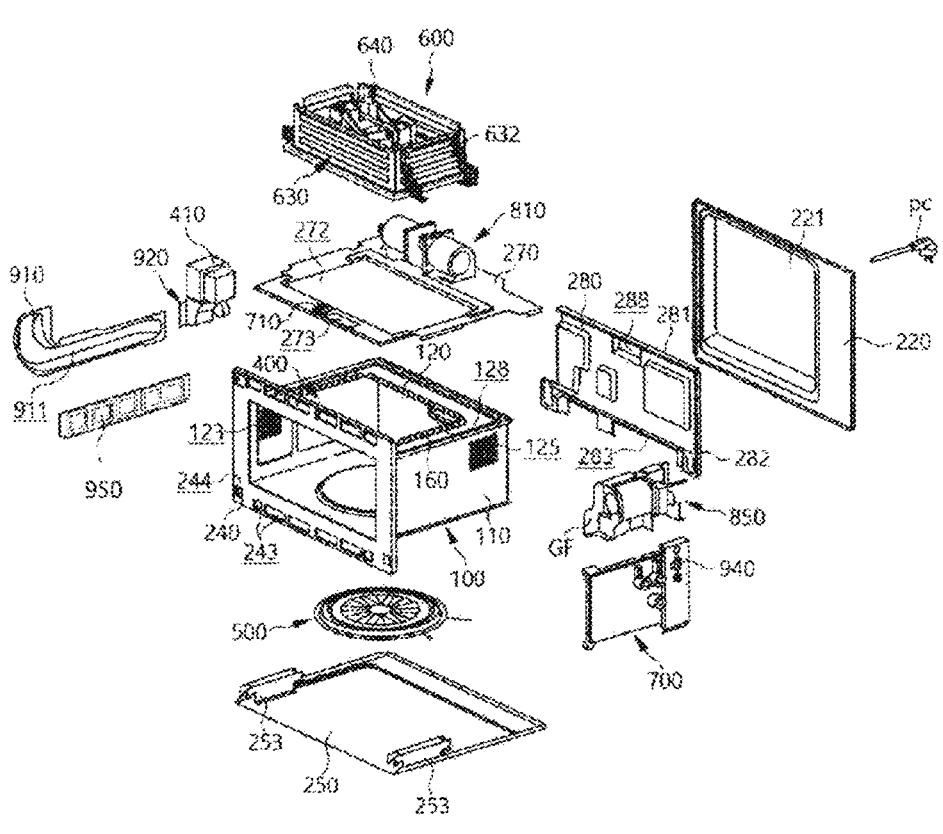
FIG. 3 is an exploded perspective view showing remaining components of excluding a door, an outer side plate, and an outer upper plate from the components constituting the cooking appliance according to the embodiment of the present disclosure.

As shown in FIG. 3, the inner rear plate 120 may include a camera mounting part 128. A camera module 730 to be described below may be mounted to the camera mounting part 128. The camera mounting part 128 may have a shape of recessing rearward from the cavity S, but, at a view taken from the rear side of the inner rear plate 120, the camera mounting part 128 may have a protruding structure. Preferably, the camera mounting part 128 may be arranged at a center portion of the inner rear plate 120, so that the camera module 730 may face the center of the cavity S. A specific structure of the camera mounting part 128 will be described below with the camera module 730.

Figure 4:
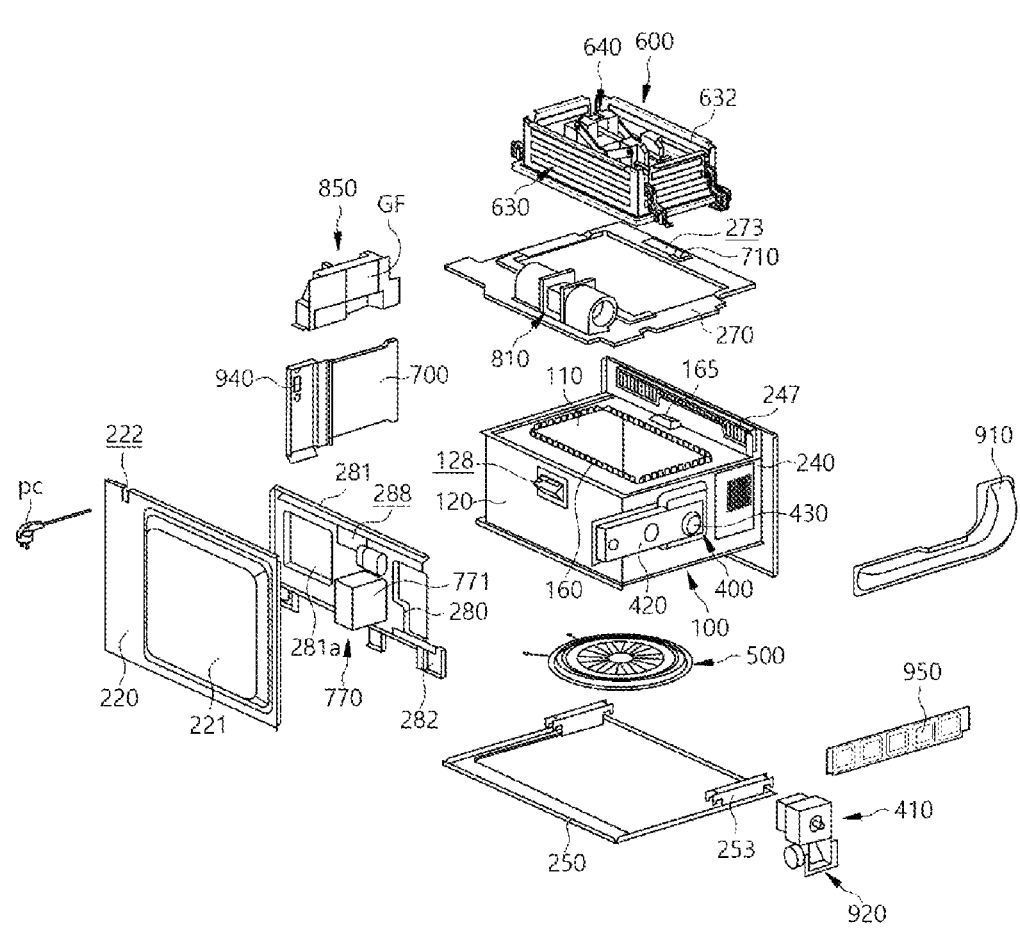
FIG. 4 is an exploded-perspective view showing the structure shown in FIG. 3 at the opposite angle of FIG. 3.

An inner upper plate 160 may be arranged at an upper portion of the pair of inner side plates 110. Referring to FIGS. 3 and 4, the inner upper plate 160 may have approximately a rectangular frame shape, and may be arranged along an upper edge of the pair of side plates. An upper plate opening 162 (referring to FIG. 14), i.e., a kind of empty or hollow portion, may be provided in a center portion of the inner upper plate 160. The third heat source module 600 may be raised and lowered through the upper plate opening 162.

Figure 14:
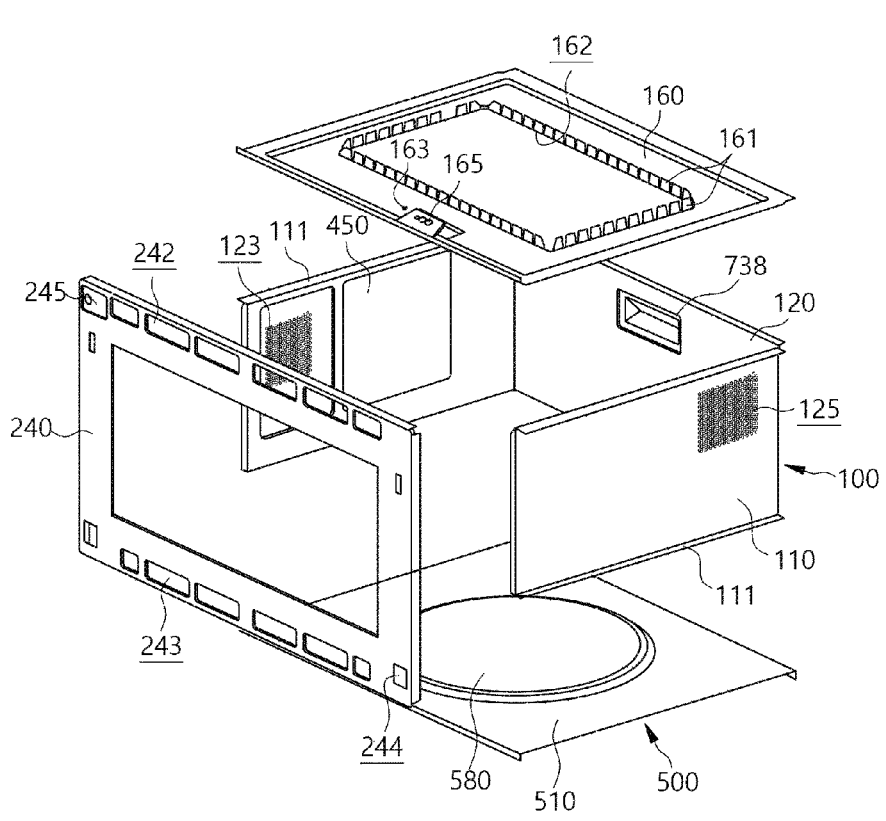
FIG. 14 is an exploded-perspective view showing the inner casing, an outer front plate, an outer upper plate, and a second heat source module that constitute the cooking appliance according to the embodiment of the present disclosure.

Referring to FIG. 14, a chock part 161 may be provided at the inner upper plate 160. The chock part 161 may be an electromagnetic wave shielding structure to prevent electromagnetic waves in the cavity S from leaking outward through a gap between the cavity S and the upper plate opening 162. The chock part 161 may be provided along an edge of the upper plate opening 162.

The inner upper plate 160 may include a lighting mounting part 165. The lighting mounting part 165 may be provided at an upper portion of the inner upper plate 160. A lighting fixture 790 to be described below may be arranged in the lighting mounting part 165. In the embodiment, the lighting mounting part 165 may be provided at a middle portion of a front portion of the inner upper plate 160, which is close to the door 300.

Referring to FIG. 14, the lighting mounting part 165 may have an inclined shape. Therefore, when the lighting fixture 790 is arranged in the lighting mounting part 165, an angle emitting light may be an angle inclined toward the center of the cavity S. For reference, in FIG. 14, Reference numeral 163 is a sensing hole, and a distance sensor 710 to be described below may be arranged in the sensing hole 163.

The outer casing 200 may be arranged outside of the inner casing 100. The outer casing 200 may enclose the inner casing 100. An electric chamber, i.e., a kind of space, may be provided between the inner casing 100 and the outer casing 200. A main controller 700, a first cooling fan module 810, a second cooling fan module 850, and a power supply unit 770 that will be described below may also be arranged in the electric chamber. The third heat source module 600 may also be arranged between the inner casing 100 and the outer casing 200.

As shown in FIG. 2, the outer casing 200 may include a pair of outer side plates 210, an outer rear plate 220 connecting the pair of outer side plates 210 to each other, an outer upper plate 230 arranged at an upper portion of the outer casing 200, an outer front plate 240 arranged at a front portion of the outer casing 200, and the outer lower plate 250. The outer casing 200 may cover the entire outer surfaces of the inner casing 100, and therefore, the inner casing 100 may be covered from the outside space by the outer casing 200.

Figure 10:
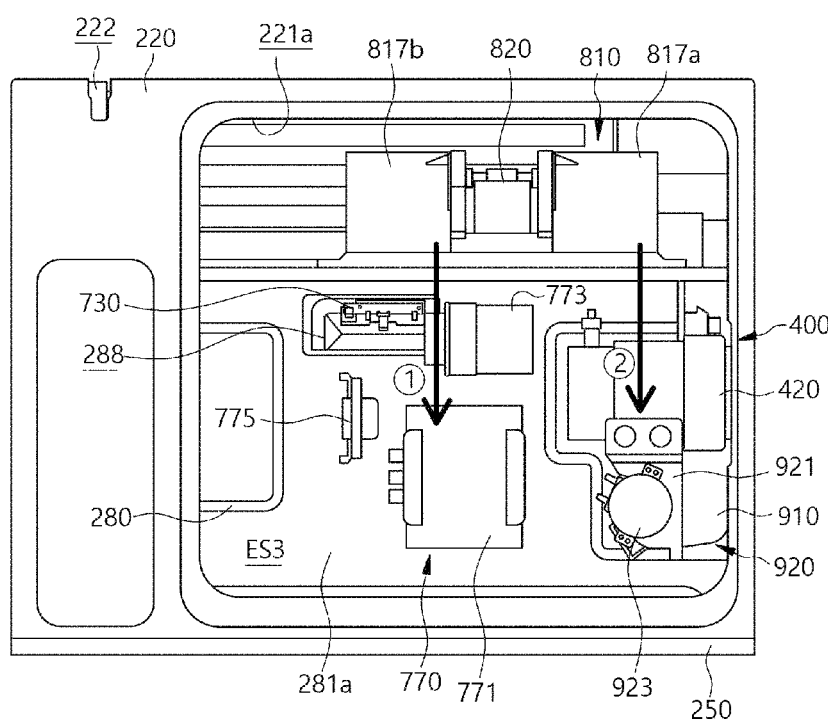
FIG. 10 is a rear view showing the cooking appliance according to the embodiment of the present disclosure without the door and a part of the outer casing among the components constituting the cooking appliance.

A part of the outer rear plate 220 may be separated from the outer casing. Referring to FIG. 10, when a part of the outer rear plate 220 is separated, the inside space of a third electric chamber ES3 may be exposed outward through a rear plate through portion 221a. An operator may maintain parts by approaching the exposed inside space of the third electric chamber ES3. Reference numeral 222 may be a cable through portion provided to discharge a power cable to the outside space.

The outer upper plate 230 may be formed approximately in a rectangular plate. The outer upper plate 230 may be arranged above the third heat source module 600. The outer upper plate 230 may shield the third heat source module 600. The outer upper plate 230 may be considered as a part arranged at the outer mouse side of the upper portion of the cooking appliance.

An upper plate shielding part 232 may be provided at a front portion of the outer upper plate 230. The upper plate shielding part 232 may be formed such that the front portion of the outer upper plate 230 is perpendicularly bent. The upper plate shielding part 232 may support a display substrate (not shown) provided in a display module 350 to be described below, in a rear-to-front direction. The upper plate shielding part 232 may prevent the inner structure of the cooking appliance from being exposed forward through the display module 350. Reference numeral 235 may be a hole through which a part of a wire harness may pass rearward, and may be omitted.

The outer front plate 240 may be arranged at the rear side of the door 300. The outer front plate 240 may have approximately a rectangular frame shape. A center portion of the outer front plate 240 may be empty to expose the inside space of the cavity S to the outside space. The outer front plate 240 may be coupled to front portions of the pair of inner side plates 110 constituting the inner casing 100. Therefore, the outer front plate 240 may be considered as a part of the inner casing 100, not a part of the outer casing 200.

In the embodiment, the height of the outer front plate 240 is above the pair of inner side plates 110 constituting the inner casing 100, so that an upper rear portion and a lower rear portion of the outer front plate 240 may have empty portions, respectively. These empty portions may serve as electric chambers in which parts are mounted and may serve as a heat dissipation space to dissipate heat of the parts. For example, the first cooling fan module 810, the second cooling fan module 850, and the third heat source module 600, which will be describe below, may be arranged at a rear side of a portion of the outer front plate 240, the portion protruding further upward than the pair of inner side plates 110.

Figure 8:
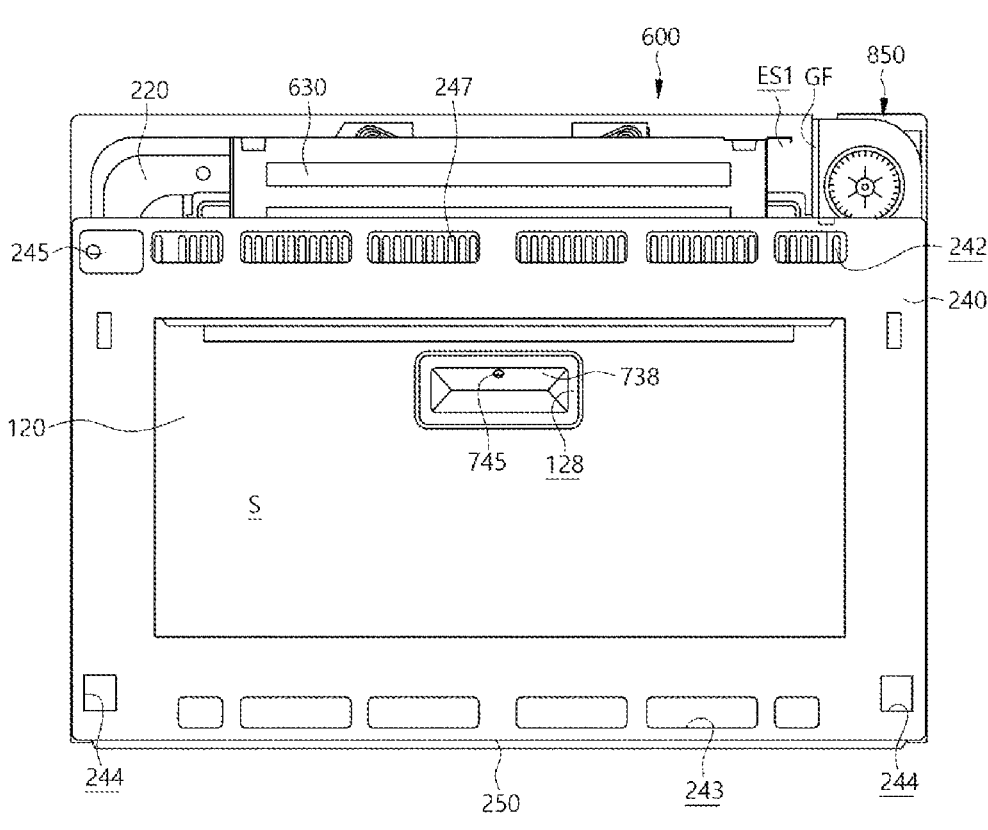
FIG. 8 is a front view showing the cooking appliance according to the embodiment of the present disclosure without the door and a part of the outer casing among the components constituting the cooking appliance.

The outer front plate 240 may have an inlet part 242 and an air outlet part 243. In the embodiment, the air inlet part 242 may be arranged in an upper portion of the outer front plate 240 and the air outlet part 243 may be arranged in a lower portion of the outer front plate 240. Referring to FIG. 8, the air inlet part 242 and the air outlet part 243 may extend in a transverse direction of the outer front plate 240. Outside air may be introduced into a first electric chamber ES1 through the air inlet part 242 to cool the parts including heat sources, and air heated by heat of the parts may be discharged to the outside space through the air outlet part 243.

Figure 5:
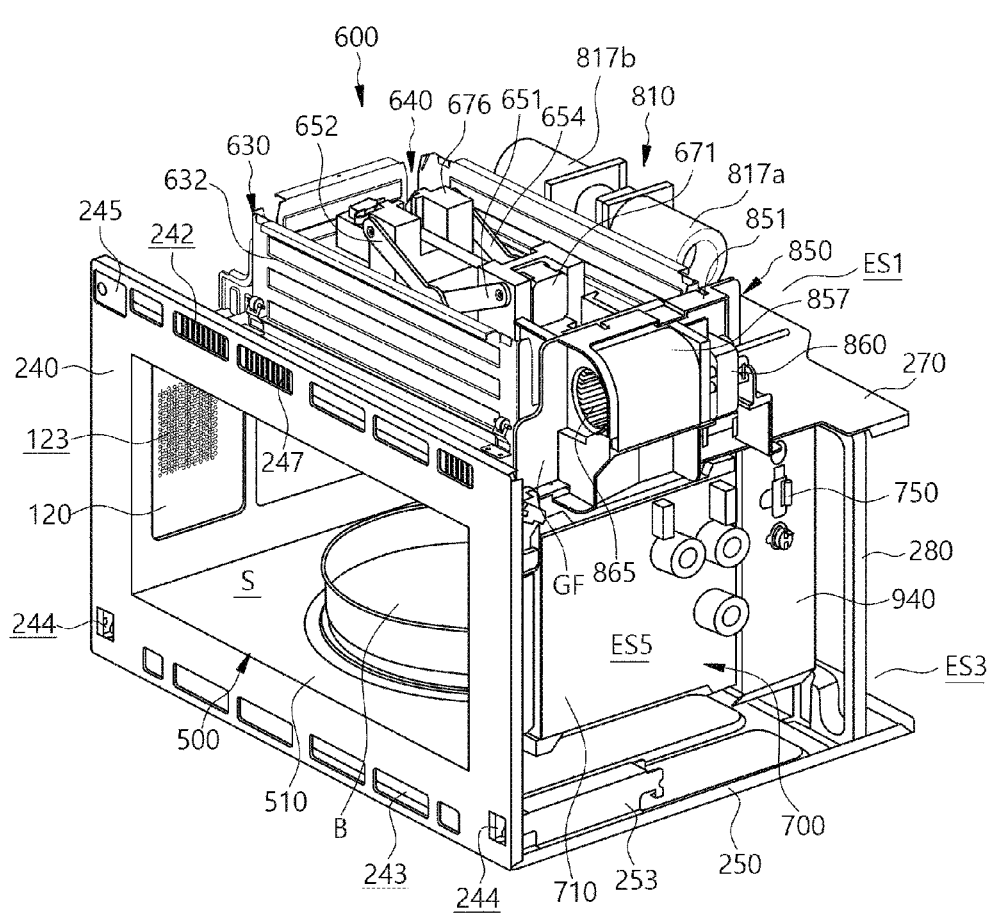
FIG. 5 is a perspective view showing the embodiment shown in FIG. 1 without the door and the outer casing.

As shown in FIG. 5, the air inlet part 242 may be formed in the portion of the outer front plate 240, the portion protruding further upward than the pair of inner side plates 110. The first cooling fan module 810 and the second cooling fan module 850 may be arranged at the rear side of the air inlet part 242. Therefore, when the first cooling fan module 810 and the second cooling fan module 850 are operated, outside air may be introduced, through the air inlet part 242, into the first electric chamber ES1 provided between the outer upper plate 230 and the inner upper plate 160.

The air outlet part 243 may be formed in a portion of the outer front plate 240, the portion protruding further downward than the second heat source module 500. A second electric chamber ES2 formed between the second heat source module 500 and the outer lower plate 250 may be provided at the rear side of the air outlet part 243. Air introduced into the cooking appliance through the air inlet part 242 may be discharged to the air outlet part 243 through the second electric chamber ES2.

Referring to FIG. 5, a hinge hole 244 may be provided in a lower portion of the outer front plate 240. The hinge hole 244 may be a portion through which a hinge assembly (not shown) of the door 300 may pass. The hinge assembly may pass through the hinge hole 244, and then be coupled to a hinge holder 253 provided at the outer lower plate 250.

A connector 245 may be provided at the upper portion of the outer front plate 240. The connector 245 may be arranged at the upper portion of the outer front plate 240. The connector 245 is electrically connected to the main controller 700, and an operator may control the main controller 700 by contacting the connector 245. The connector 245 may be omitted or be arranged at the outer rear plate 220 or the pair of outer side plates 210.

A shield frame 247 may be provided at the rear side of the outer front plate 240. The shield frame 247 may be arranged behind the air inlet part 242 of the outer front plate 240, and may block access to wire harness from the outside space, and shield the parts in the cooking appliance. The shield frame 247 may have a plurality of slits, so that the air introduced through the air inlet part 242 may pass through the plurality of slits.

The outer casing 200 may include the outer lower plate 250. The outer lower plate 250 may be arranged below the inner casing 100. In the embodiment, the outer lower plate 250 may connect the outer rear plate 220 to the outer front plate 240. Furthermore, the outer lower plate 250 may be connected to an insulation rear plate 280 to be described below. As shown in FIG. 5, the outer lower plate 250 may be spaced apart from the second heat source module 500, and the gap between the outer lower plate 250 and the second heat source module 500 may serve as the second electric chamber ES2.

Figure 6:
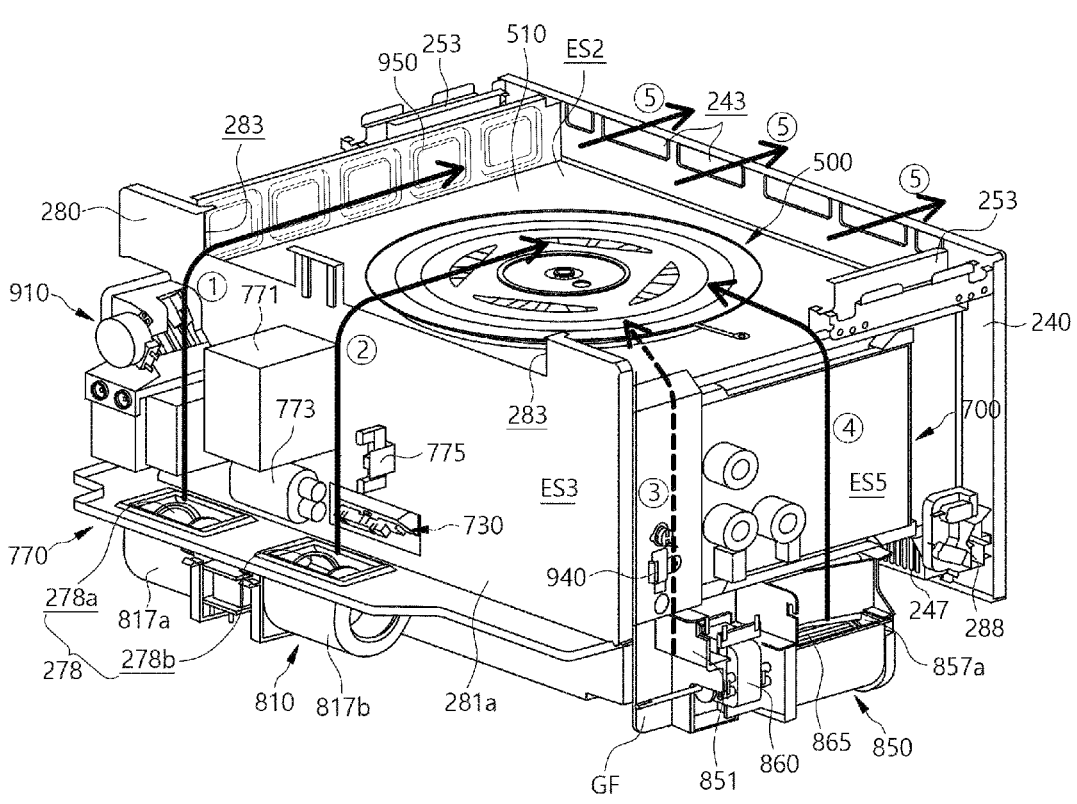
FIG. 6 is a perspective view showing the embodiment shown in FIG. 1 without the door and the outer casing at the opposite angle of FIG. 2.

For reference, in FIG. 6, the outer lower plate 250 is shown in an omitted state, as shown in FIG. 6, the second electric chamber ES2, i.e., a kind of an empty portion or space, may be provided between the outer front plate 240 and the insulation rear plate 280. Air may flow through the second electric chamber ES2, and finally the air may be discharged to the outside space through the air outlet part 243.

Meanwhile, regarding the electric chamber as described above, the electric chamber may be divided into a plurality of spaces. According to the embodiment, the electric chamber may be divided into the first electric chamber ES1 to a fifth electric chamber ES5: (i) the first electric chamber ES1 may be provided between the inner upper plate 160 and the outer upper plate 230 (referring to FIG. 9); (ii) the second electric chamber ES2 may be provided between the second heat source module 500 and the outer lower plate 250 (referring to FIG. 7); (iii) the third electric chamber ES3 may be provided between the insulation rear plate 280 to be described below and the outer rear plate 220 (referring to FIG. 10); and (iv) the fourth electric chamber ES4 and the fifth electric chamber ES5 may be respectively provided between the pair of inner side plates 110 and the pair of outer side plates 210 (referring to FIGS. 11 and 12). The first electric chamber ES1 and the fifth electric chamber ES5 may be arbitrarily divided, and may be connected to each other.

Herein, each electric chamber may be provided at each surface of the casing. The first electric chamber to the fifth electric chamber (ES1~ES5) may be provided at different surfaces of the hexahedron casing. The first heat source module 400, the second heat source module 500, and the third heat source module 600 may be arranged at different surfaces of the casing.

The outer casing 200 may include the insulation upper plate 270. The insulation upper plate 270 may be arranged between the outer upper plate 230 and the inner upper plate 160. Since high heat is generated during the cooking process in the cavity S, the temperature of the inner upper plate 160 may increase. The insulation upper plate 270 may reduce heat transferred from the inner upper plate 160 to the outer upper plate 230. The insulation upper plate 270 may have a rectangular frame shape with an empty center portion same as the inner upper plate 160. A movable opening 272 provided in a center portion of the insulation upper plate 270 may be connected to the upper plate opening 162 of the inner upper plate 160, and the third heat source module 600 may move through the movable opening 272 and the upper plate opening 162.

As shown in FIGS. 3 to 5, the distance sensor 710 and a cooling fan module 810, 850 may be arranged at an insulation upper plate 270. As the distance sensor 710 and the cooling fan module 810, 850 are arranged at the insulation upper plate 270, heat in the cavity S may be prevented from being directly transferred to the distance sensor 710 and the cooling fan module 810, 850. Therefore, the durability of the distance sensor 710 and the cooling fan module 810, 850 may be improved.

Figure 17:
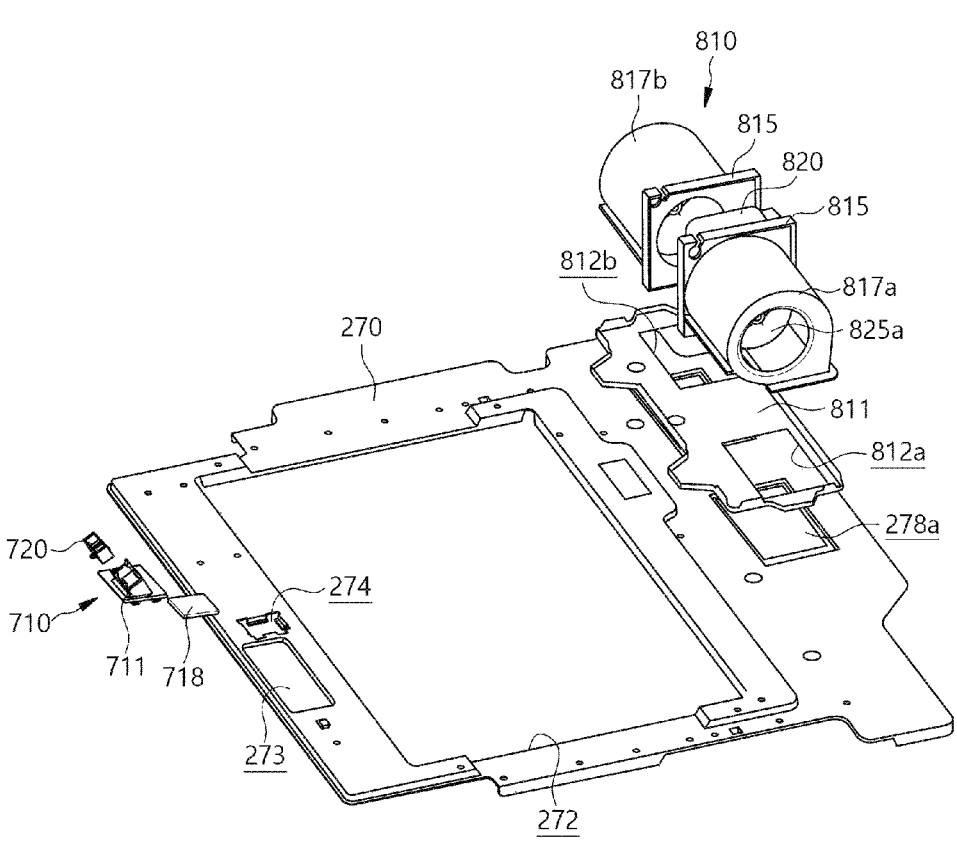
FIG. 17 is an exploded-perspective view showing the outer upper plate, a first cooling fan module arranged at the outer upper plate, and a distance sensor module of the cooking appliance according to the embodiment of the present disclosure.

Referring to FIG. 17, a lighting through portion 273 may be provided in the insulation upper plate 270. The lighting through portion 273 may be disposed at a location corresponding to the above-described lighting mounting part 165 of the inner upper plate 160. The lighting fixture 790 may be arranged in the lighting mounting part 165 through the lighting through portion 273.

A sensor mounting portion 274 may be provided at a portion of the insulation upper plate 270, which is close to the lighting through portion 273. The sensor mounting portion 274 may be provided at a front portion, which is close to the door 300, of the insulation upper plate 270. The distance sensor 710 may be mounted at the sensor mounting portion 274. When the distance sensor 710 is arranged at the sensor mounting portion 274, a distance sensing part 720 of the distance sensor 710 may face the center portion of the cavity S. The distance sensing part 720 may be exposed in a direction toward the center portion of the cavity S through the sensing hole 163 of the inner upper plate 160.

A protection cover 276 (referring to FIG. 28) may be provided at the insulation upper plate 270 to block electromagnetic wave introduced through a gap between a moving assembly 630 and a fixed assembly 640 to be described below. The protection cover 276 may surround an edge of a fan through portion 278a, 278b provided at a center portion of the insulation upper plate 270. The protection cover 276 will be described in more detail below.

As shown in FIG. 6, the insulation upper plate 270 may have the fan through portion 278a, 278b. The fan through portion 278a, 278b may be formed at a portion of the insulation upper plate 270, which protrudes rearward more than the inner casing 100. Therefore, the fan through portion 278a, 278b may be open to the outside space of the inner casing 100. In the embodiment, the fan through portion 278a, 278b may be open rearward from the insulation rear plate 280 coupled to the inner casing 100.

The fan through portion 278a, 278b may be open toward the third electric chamber ES3. The first cooling fan module 810 may be arranged in one portion of the fan through portion 278a, 278b. The power supply unit 770 may be arranged below the fan through portion 278a, 278b. Therefore, air discharged from the first cooling fan module 810 may be discharged to the power supply unit 770 through the fan through portion 278a, 278b.

In the embodiment, the fan through portion 278a, 278b may include a first through portion 278a and a second through portion 278b. The first through portion 278a and the second through portion 278b may be respectively formed at locations corresponding to a first drive blade 825a and a second drive blade 825b constituting the first cooling fan module 810. The first through portion 278a may be open toward a high voltage transformer 771 of the power supply unit 770, and the second through portion 278b may be formed to be closer to a center portion of the third electric chamber ES3 than the first through portion 278a.

As shown in FIG. 2, the insulation rear plate 280 may be arranged between the inner rear plate 120 and the outer rear plate 220. The insulation rear plate 280 is coupled to the inner rear plate 120, and the third electric chamber ES3 may be provided between the insulation rear plate 280 and the outer rear plate 220. The insulation rear plate 280 may supply heat transferred from the inner rear plate 120 to the outer rear plate 220 like the insulation upper plate 270.

As shown in FIGS. 3 and 4, the insulation rear plate 280 may have a rectangular plate shape (not limited thereto). A first surface of the insulation rear plate 280 may face the inner rear plate 120 and a second surface of the insulation rear plate 280 may face the outer rear plate 220. The insulation rear plate 280 may be coupled to the inner rear plate 120, and the power supply unit 770 may be arranged on the surface 281 of the insulation rear plate 280 (referring to FIG. 18), the surface facing the outer rear plate 220. Therefore, the insulation rear plate 280 may prevent or substantially reduce heat of the inner upper plate 160 from being directly transferred to the power supply unit 770.

A spacer 282 may be arranged at a lower portion of the insulation rear plate 280. The spacer 282 may protrude downward from the insulation rear plate 280. The spacer 282 may be provided to space a lower end of the insulation rear plate 280 from the outer lower plate 250. As shown in FIG. 6, air may flow into an empty portion between the lower end of the insulation rear plate 280 and the outer lower plate 250, the empty portion being generated by the spacer 282. Reference numeral 283 may represent a ventilation part through which air flows. The spacer 282 may be integrally formed with the insulation rear plate 280 or be a separate object assembled to the insulation rear plate 280.

As shown in FIG. 1, the door 300 may be provided at front of the outer front plate 240. The door 300 may open and close the cavity S. The door 300 may be swung by coupling the hinge assembly provided at a lower portion of the door 300 to a hinge holder 253 (referring to FIG. 2) provided at the outer lower plate 250. A penetration part 310 of the door 300 may be made of a transparent or translucent material so that a user can observe the cavity S from the outside space. Reference numeral 320 may represent a handle of the door 300.

Left and right frames 330 may be coupled to side surfaces of the door 300, and a lower frame 340 may be coupled to a lower end of the door 300. Although not shown in the drawing, an upper frame may be provided to an upper portion of the door 300. The frames may surround the penetration part 310 to form the frame of the door 300.

The display module 350 may be arranged at an upper portion of the door 300. The display module 350 may indicate a cooking state of the cooking appliance, and may include an interface for the user to manipulate the cooking appliance. The air inlet part 242 is arranged below the display module 350, thereby preventing the display module 350 from interfering with the air inlet part 242.

The first heat source module 400 may be arranged at the inner casing 100. The first heat source module 400 may generate microwaves to cook the food. In the embodiment, the first heat source module 400 may be arranged at the pair of inner side plates 110 of the inner casing 100. Referring to FIG. 2, the first heat source module 400 may be arranged at an outer portion of a left one of the pair of inner side plates 110.

Since a magnetron 410 of the first heat source module 400 is arranged at the insulation rear plate 280, the first heat source module 400 may be arranged at both the fourth electric chamber ES4 and the fifth electric chamber ES5. Otherwise, the first heat source module 400 may be arranged at an outer portion of a right one of the pair of inner side plates 110, or at an outer portion of the inner rear plate 120.

Referring to FIGS. 3 and 4, the first heat source module 400 may include the magnetron 410 oscillating microwaves and a wave guide 420 guiding the microwaves oscillated from the magnetron 410 to the cavity S. Herein, the magnetron 410 may be mounted to a portion of the wave guide 420, the portion protruding from the inner side plate 110.

Figure 15:
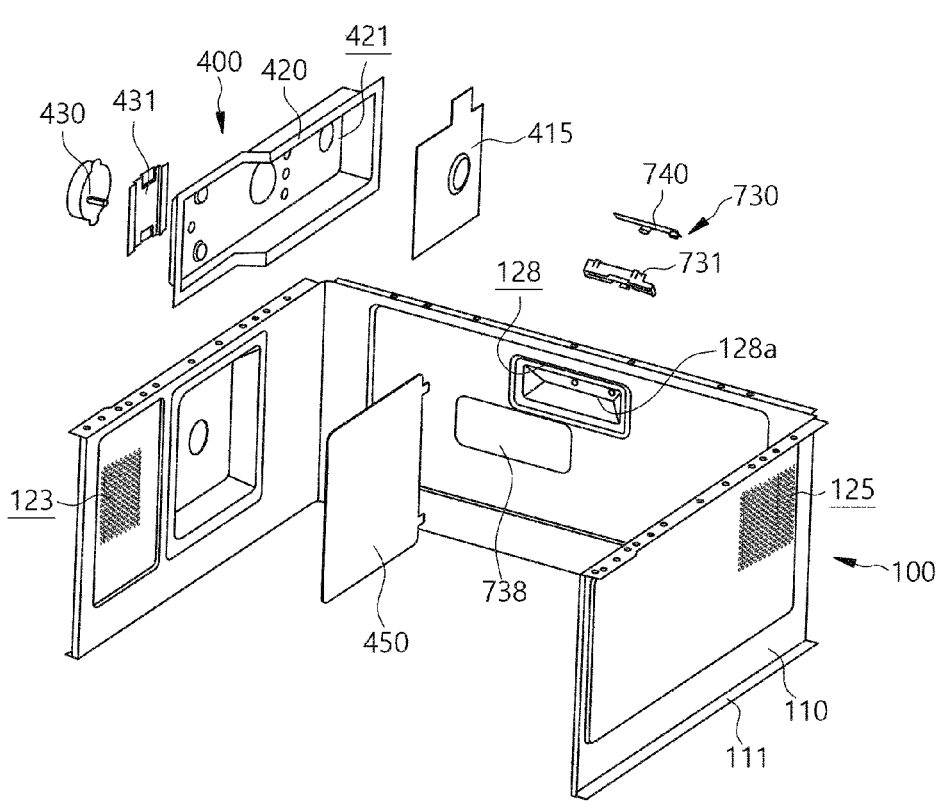
FIG. 15 is an exploded-perspective view showing the configuration of the inner casing and a first heat source module that constitute the cooking appliance according to the embodiment of the present disclosure.
Figure 16:
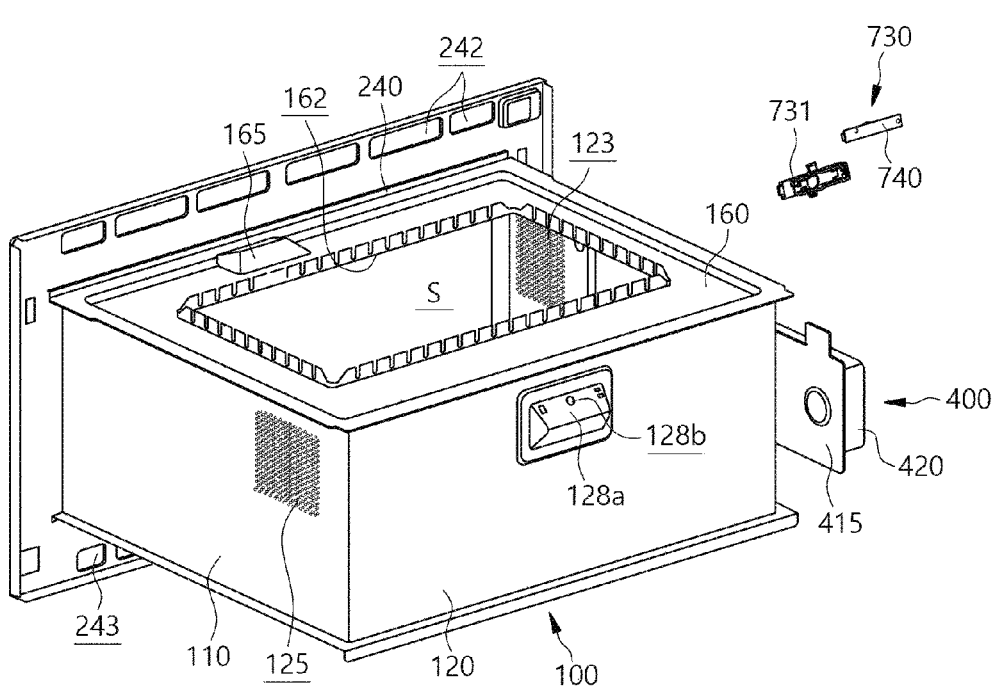
FIG. 16 is a perspective view showing an assembled state of the configuration of the inner casing and the first heat source module that constitute the cooking appliance according to the embodiment of the present disclosure.

Referring to FIGS. 15 and 16, the wave guide 420 may have a guide space 421 that is open toward the inner side plate 110, and the wave guide 420 may include a stirrer (not shown) to diffusely reflect microwaves transferred through the wave guide 420. Reference numeral 430 represents a stirrer motor for rotation of the stirrer, and Reference numeral 431 represents a bracket for mounting the stirrer motor.

As shown in FIG. 16, a mounting plate 415 may be coupled to the wave guide 420. The magnetron 410 may be mounted to the mounting plate 415. The microwaves generated by the magnetron 410 may be transferred to the cavity S through the wave guide 420. Reference numeral 450 is a cover coupled to the inner side plate 110 facing the cavity S, and the cover 450 may prevent the stirrer to be damaged.

Next, the second heat source module 500 will be described. The second heat source module 500 may be arranged at a bottom surface of the casing 100, 200. The second heat source module 500 may heat food rapidly by induction heating method. The second heat source module 500 may be fixed on the bottom surface of the casing 100, 200. As shown in FIGS. 2 and 3, the second heat source module 500 may form the bottom of the inner casing 100. In other words, an upper portion of the second heat source module 500 may be exposed to the cavity S.

The second heat source module 500 may be controlled by the main controller 700. The main controller 700 may control the second heat source module 500 in an inverter manner, and may control power of the second heat source module 500 linearly. Therefore, detailed control of the second heat source module 500 may be realized.

As shown in FIG. 5, a bowl B may be provided on the second heat source module 500 to put food thereon. A bottom portion of the bowl B may be made of a metal material having magnetism such as stainless steel sheet. When the bowl B is heated by a magnetic field generated by a working coil 570, food or items in the bowl B may be heated together.

As shown in FIG. 1, a cover plate 580 may be provided at a center portion of the second heat source module 500, and the bowl B may be placed on the cover plate 580. The cover plate 580 may be arranged at a location facing a heating unit 610 (referring to FIG. 28) constituting the third heat source module 600. Therefore, a lower portion of the food may be heated by the second heat source module 500, and an upper portion of the food may be heated by the third heat source module 600.

FIGS. 19 to 22 show the structure of the second heat source module 500. As shown in the drawings, the second heat source module 500 may include a base plate 510 and a supporter 520. A mounting bracket 530, a shield filter 540, and a coil assembly 550 may be arranged between the base plate 510 and the supporter 520. This coupling structure between the parts will be described in more detail below.

The base plate 510 may have approximately a rectangular plate shape (not limited thereto) having an empty base hole 512 at a center portion thereof, and may be regarded as a lower plate of the inner casing 100 forming the bottom surface of the cavity S. The cover plate 580 may be arranged at the base hole 512, and the cover plate 580 may be composed of a non-magnetic substance. The base plate 510 may be made of a metal material of a magnetic substance. The base plate 510 composed of a magnetic substance may prevent or substantially reduce the microwaves generated by the first heat source module 400 from reaching the working coil 570.

Figure 20:
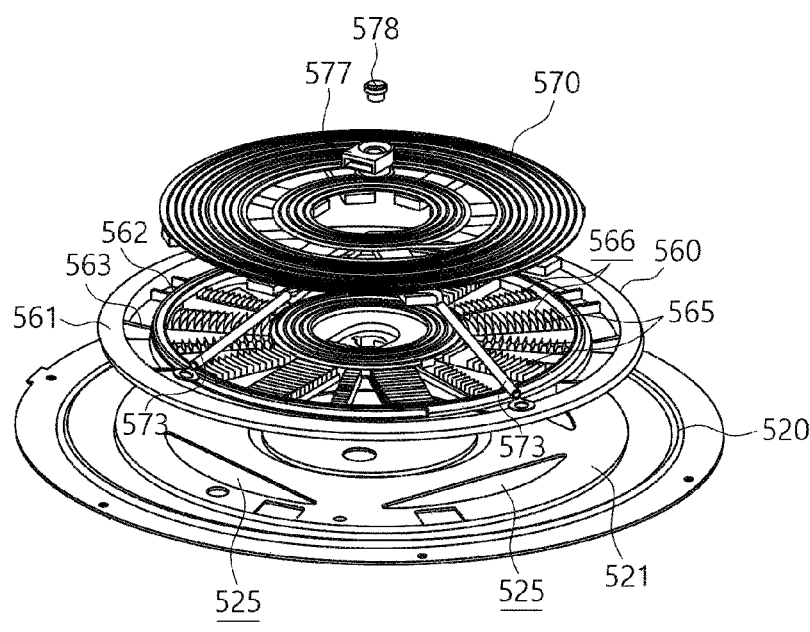
FIG. 20 is a perspective view showing the configuration of a lower supporter and a working coil assembly among the components of the second heat source module of the cooking appliance according to the embodiment of the present disclosure.

As shown in FIG. 20, the supporter 520 may have approximately a circular plate shape (not limited thereto), and the supporter 520 may have a plurality of heat dissipation slits 525 for heat dissipation. An upper surface 521 of the supporter 520 may include a coil base 560 and the working coil 570 constituting the coil assembly 550. The supporter 520 may function to shield electromagnetic interference (EMI).

Figure 21:
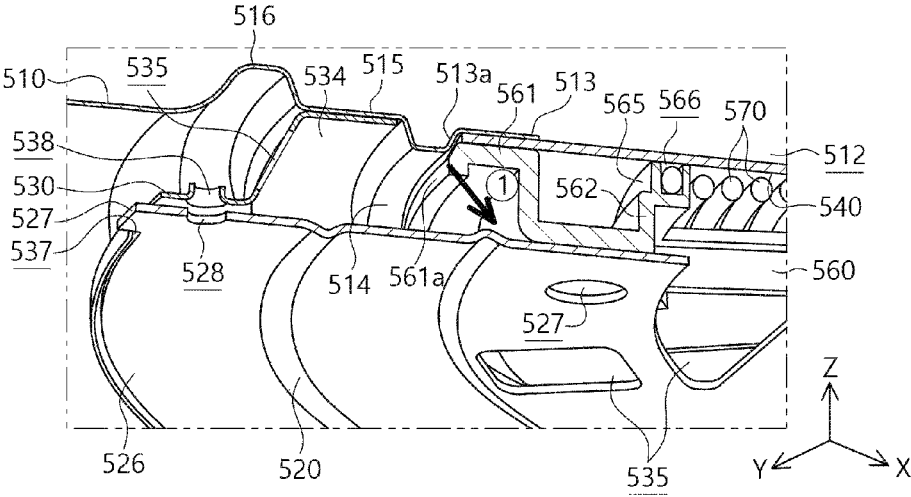
FIG. 21 is a sectional view showing the inner structure of the second heat source module of the cooking appliance according to the embodiment of the present disclosure.

FIG. 21 is a section view showing the inner structure of the second heat source module 500 according to an embodiment of the invention. The mounting bracket 530 may be arranged between the base plate 510 and the supporter 520. The mounting bracket 530 may be coupled to both the base plate 510 and the supporter 520 to connect the base plate 510 to the supporter 520. In the embodiment, the base plate 510 and the mounting bracket 530 are coupled to each other by welding, and the mounting bracket 530 and the supporter 520 may be coupled to each other by screwing. According to another embodiment, the base plate 510 and the supporter 520 may be coupled to each other by screwing, and the mounting bracket 530 and the supporter 520 may be coupled to each other by welding.

Herein, the supporter 520 and the coil base 560 may also be coupled to each other by screwing. Accordingly, the coil assembly 550 may be fixed to the base plate 510 with the mounting bracket 530 as a medium as well as to the supporter 520. Therefore, both upper portion and lower portion of the coil assembly 550 may be securely fixed.

The base plate 510 may have a plurality of uneven structures. The uneven structures may be provided to be coupled to the mounting bracket 530, the shield filter 540, and the coil base 560. In the embodiment, the shield filter 540 may be arranged between the uneven structures of the base plate 510 and the coil base 560. The shield filter 540 may be securely fixed between the uneven structures and the coil base 560.

Figure 22:
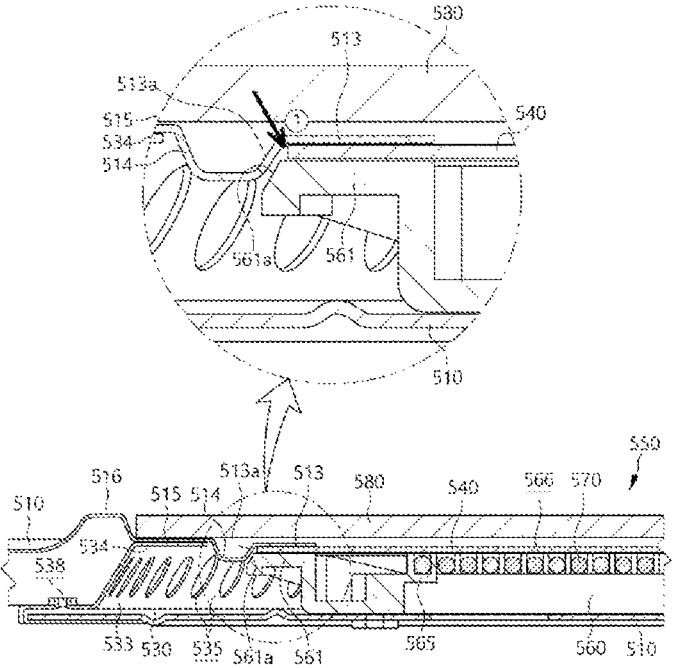
FIG. 22 is a sectional view showing the inner structure of the second heat source module of the cooking appliance according to the embodiment of the present disclosure.

As shown in FIGS. 21 and 22, a filter cover portion 513 may be provided at a location adjacent to an edge of the base hole 512. The filter cover portion 513 may cover a part of an edge of the shield filter 540. An edge of the shield filter 540 may be compressed between the filter cover portion 513 and a filter supporter 561 of the coil base 560. Therefore, the microwaves generated by the first heat source module 400 may be prevented from leaking toward the working coil 570 through a gap between the shield filter 540 and the coil base 560.

A depressed portion 514 may be provided at an outer portion of the filter cover portion 513. The depressed portion 514 is a portion depressed downward from the base plate 510, and may be formed in a circular shape surrounding the filter cover portion 513. A first inclined portion 513*a* may be formed at a portion from the filter cover portion 513 to the depressed portion 514. The first inclined portion 513*a* may be formed to face a second inclined portion 561*a* of the coil base 560 to be described below.

Herein, the first inclined portion 513*a* and the second inclined portion 561*a* may reduce a distance between the base plate 510 and the coil base 560. Accordingly, the base plate 510 and the coil base 560 may be aligned in an X-axis and a Y-axis, and the microwaves generated by the first heat source module 400 may be prevented from leaking through the gap between a gap between the base plate 510 and the coil base 560.

Furthermore, the first inclined portion 513a may press against the edge portion of the shield filter 540. When the first inclined portion 513a presses against the edge portion of the shield filter 540 downward, i.e., in a direction of arrow in FIG. 21, the shield filter 540 may be fixed in the x-axis or the Y-axis. Therefore, the shield filter 540 may be securely fixed without the need for a fastener such as a screw.

A seating portion 515 may be provided at the opposite side of the filter cover portion 513 with the depressed portion 514 located between the filter cover portion 513 and the seating portion 515. The cover plate 580 may be arranged at an upper surface of the seating portion 515. A seating fence 516 may be provided at an outer portion of the seating portion 515 while surrounding the seating portion 515. The seating fence 516 may protrude upward, and may cover an edge of the cover plate 580. Therefore, the cover plate 580 may be aligned inside the seating fence 516.

Herein, as shown in FIG. 22, the seating portion 515 may be formed above the filter cover portion 513. Accordingly, the cover plate 580 does not reach the filter cover portion 513, but may reach the seating portion 515. Furthermore, the cover plate 580 and the shield filter 540 may be spaced apart from each other. Accordingly, when the second heat source module 500 is operated, vibrations generated in the cover plate 580 may be reduced.

As shown in FIG. 21, the plurality of heat dissipation slits 525 for heat dissipation may be provided in the supporter 520. The supporter 520 may have a first fastening hole 526 provided to couple the supporter 520 to the coil base 560. When the fastener, such as a screw (not shown), is coupled to the first fastening hole 526, the supporter 520 and the coil base 560 may be assembled together.

The supporter 520 may have a guide protrusion 527. The guide protrusion 527 may be fitted into a guide hole 537 formed in the mounting bracket 530. When the guide protrusion 527 is fitted into the supporter 520, an initial location between the supporter 520 and the mounting bracket 530 may be aligned. Accordingly, when a second fastening hole 528 of the supporter 520 may be connected to a bracket fastening hole 538 of the mounting bracket 530, the fastener (not shown), such as a bolt or a screw, may be filled into the holes.

Figure 19:
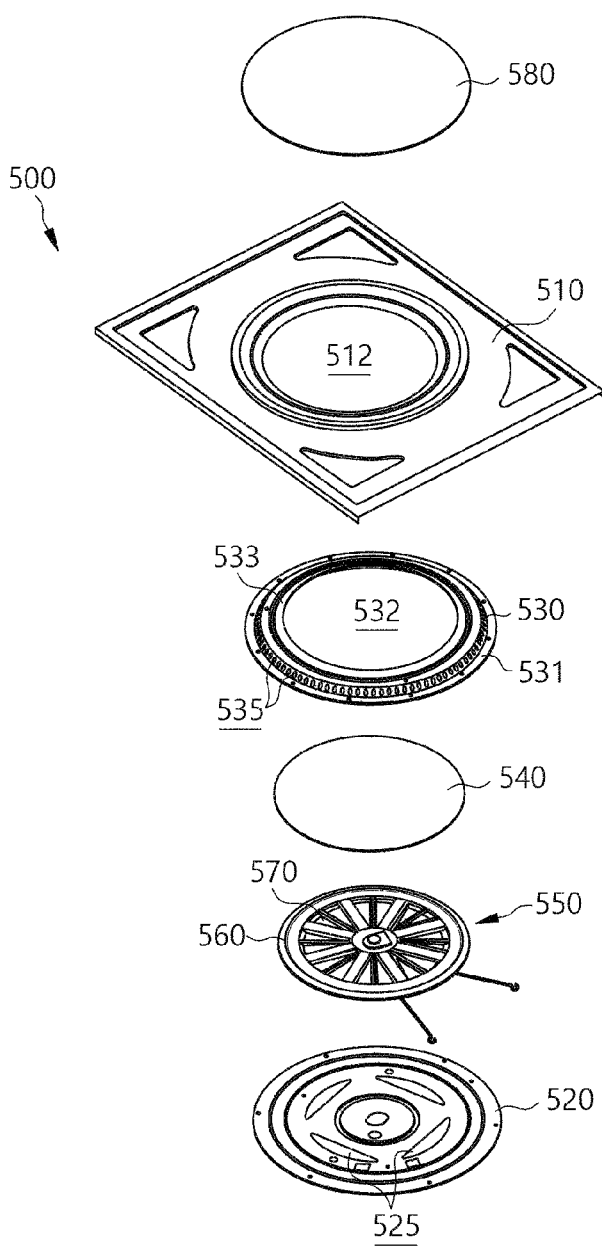
FIG. 19 is an exploded-perspective view showing components of the second heat source module of the cooking appliance according to the embodiment of the present disclosure.

The mounting bracket 530 may connect the base plate 510 to the supporter 520. The mounting bracket 530 may have approximately a circular frame shape (not limited thereto), and a bracket through portion 532 may be formed in a center portion of the mounting bracket 530. As shown in FIG. 19, the mounting bracket 530 may include a bracket lower portion 531 having a relatively wider diameter, a bracket upper portion 534 having a relatively narrower diameter. Thus, the bracket lower portion 531 and the bracket upper portion 534 may be connected to each other by an inclined-shape bracket connection portion 533.

Herein, since the mounting bracket 530 is arranged between the base plate 510 and the supporter 520, the base plate 510 may be spaced apart from the supporter 520 by at least the height of the mounting bracket 530. The coil assembly 550 may be arranged between the spacing between the base plate 510 and the supporter 520. The height of the bracket connection portion 533 may be the height of the mounting bracket 530.

In the embodiment, the mounting bracket 530 are provided as a separate object from the base plate 510 and the supporter 520, but the mounting bracket 530 may be a part of the base plate 510 or the supporter 520. In other words, the mounting bracket 530 may be a part of the base plate

510, or a part of the supporter 520. In this case, the mounting bracket 530, which is a separate object, can be omitted.

As shown in FIGS. 21 and 22, the bracket upper portion 534 may be provided at a lower portion of the seating portion 515, and the bracket upper portion 534 may be arranged between the seating fence 516 and the depressed portion 514. The bracket upper portion 534 may be coupled to the base plate 510 by welding (not limited thereto).

The bracket connection portion 533 may have a bracket heat dissipation hole 535 for heat dissipation. The bracket heat dissipation hole 535 may be opened sideways. The bracket heat dissipation hole 535 may dissipate heat between the supporter 520 and the base plate 510, and outside air may be introduced into the bracket heat dissipation hole 535 to cool the coil assembly 550.

Meanwhile, the bracket lower portion 531 may be coupled to an edge of the supporter 520. The bracket lower portion 531 may have the guide hole 537, and the guide protrusion 527 of the supporter 520 described above may be fitted into the guide hole 537. Reference numeral 538 may represent the bracket fastening hole 538 connected to the second fastening hole 528 of the supporter 520. Therefore, the bracket lower portion 531 may be coupled to the supporter 520 by a screw, etc.

The shield filter 540 may be arranged between the cover plate 580 and the coil assembly 550. The shield filter 540 may have an approximately circular plate structure, and may cover an upper portion of the working coil 570. The shield filter 540 may prevent or substantially prevent microwaves generated from the first heat source module 400 from being transferred to the working coil 570. The shield filter 540 may be composed of any one of graphite, graphene, carbon fabric, carbon paper, and carbon felt.

As described above, when the shield filter 540 is composed of any one of graphite, graphene, carbon fabric, carbon paper, and carbon felt, the shield filter 540 may have excellent microwave shield performance due to high conductivity. Furthermore, since the shield filter 540 may maintain heating by the second heat source module 500, heating performance of the second heat source module 500 may be maximized. Furthermore, when the shield filter 540 is composed of any one of graphite, graphene, carbon fabric, carbon paper, and carbon felt, it is easy to emit heat increased by microwaves due to high thermal conductivity.

In the embodiment, the shield filter 540 may be formed by laminating graphite sheet and mica sheet together. Herein, the mica sheet may be relatively thicker than the graphite sheet. For example, when the thickness of the graphite sheet is 0.2 mm, the thickness of the mica sheet may be 1.0 mm.

The diameter of the shield filter 540 may be larger than the diameter of the working coil 570, and may be smaller than the diameter of the cover plate 580 and the diameter of the supporter 520. Accordingly, the shield filter 540 may completely cover an upper portion of the working coil 570, thereby blocking the microwaves transferred to the working coil 570. Conversely, the shield filter 540 may efficiently transmit the magnetic fields generated by the working coil 570 upward through the cover plate 580.

The shield filter 540 may be fixed to the second heat source module 500 without a separate fastener. However, when a fastener is used, the microwaves may be introduced toward the working coil 570 through a hole for fastening the fastener, a screw thread, or the like to affect the working coil 570. Furthermore, an electric field is concentrated to an edge of a hole or a sharp screw thread so that arc discharge may occur and a fire may occur. Therefore, a structure is applied to the embodiment to fix the shield filter 540 without a fastener.

The shield filter 540 may be pressed between the filter cover portion 513 of the base plate 510 and the filter supporter 561 of the coil base 560. The filter cover portion 513 and the filter supporter 561 may press against the edge of the shield filter 540 and, more specifically, the filter cover portion 513 may be in surface-contact with an upper surface of the shield filter 540, and the filter supporter 561 may be in surface-contact with a lower surface of the shield filter 540. This surface-contact structure may reduce gaps between the shield filter 540, the base plate 510, and the coil base 560, and may prevent or substantially prevent the microwaves from being introduced.

As shown in FIG. 22, the first inclined portion 513*a* provided in a portion where the filter cover portion 513 is connected to the depressed portion 514 and the second inclined portion 561*a* of the coil base 560 may face each other. Thus, a gap between the first inclined portion 513*a* and the second inclined portion 561*a* may be reduced as the gap is further away from the shield filter 540. Accordingly, the first inclined portion 513*a* and the second inclined portion 561*a* may not only strongly press the edge of the shield filter 540 but also block a path through which the edge of the shield filter 540 is in contact with the outside space.

In other words, the first inclined portion 513*a* and the second inclined portion 561*a* may reduce the distance between the base plate 510 and the coil base 560. Accordingly, the base plate 510 and the coil base 560 may be aligned in an X-axis and a Y-axis, and the microwaves generated by the first heat source module 400 may be prevented from leaking through the gap between a gap between the base plate 510 and the coil base 560. Herein, the first inclined portion 513*a* may press against an end of the shield filter 540 in the direction of arrow ① in FIG. 21, and the shield filter 540 may be respectively fixed in the X-axis and the Y-axis. Therefore, even when a fastener, such as a screw, is not used, the shield filter 540 may be securely fixed.

Meanwhile, FIG. 20 is a perspective view showing the structure of the coil assembly 550. As shown, the coil base 560 of the coil assembly 550 may include an approximately circular base body 561, and a plurality of coil guides 565 may be provided in the base body 561. The coil guides 565 may be arranged in a structure composed of a plurality of concentric circles of different diameters. A coil mounting groove 566 may be depressed between the coil guides 565, the working coil 570 may be coiled in the coil mounting groove 566. Reference numeral 563 may represent a reinforcing rib for reinforcing the strength of the coil base 560.

A fixed housing 577 may be provided at a center portion of the coil assembly 550, and a first temperature sensor 578 may be arranged in the fixed housing 577. The first temperature sensor 578 may measure the temperature of the second heat source module 500. Based on the temperature of the second heat source module 500 measured by the first temperature sensor 578, the user can adjust the temperature of the second heat source module 500. Although not shown in the drawings, in order to increase the density of magnetic field generated by the working coil 570, the coil assembly 550 may further include ferrite, which is a magnetic ceramic material having oxidized steel ($Fe2O3$) as a primary component.

The cover plate 580 may be arranged in the base hole 512 of the base plate 510. The cover plate 580 may have an approximately circular plate shape (not limited thereto). The cover plate 580 may cover the base hole 512, and may form an upper surface of the second heat source module 500 in a flat surface structure. The cover plate 580 may be made of a non-metallic substance so that the magnetic fields of the working coil 570 may pass through the cover plate 580. The cover plate 580 may be made of a glass material having heat resistance against heat or the like (for example, ceramics glass). The cover plate 580 may dissipate heat of the shield filter 540.

Figure 23:
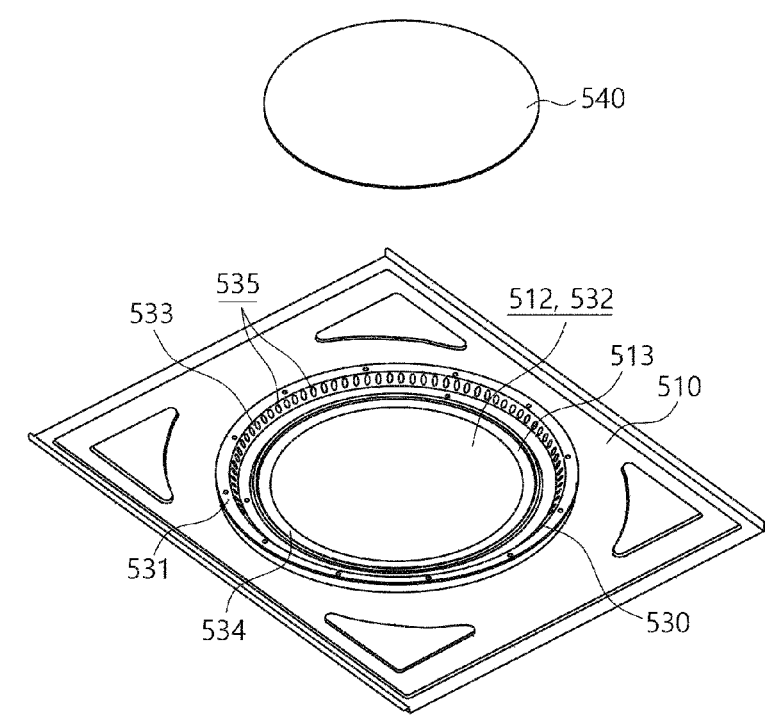
FIGS. 23 to 26 are assembly sequence views showing an assembly process in which the second heat source module of the cooking appliance according to the embodiment of the present disclosure is sequentially assembled.

As shown in FIGS. 23 to 26, an assembly process of the second heat source module 500 will be described. First, as shown in FIG. 23, with the base plate 510 inverted, the mounting bracket 530 may be coupled to the base plate 510. The mounting bracket 530 may be arranged around the base hole 512. Referring to FIG. 21, the bracket upper portion 534 of the mounting bracket 530 may be laminated to the seating portion 515 of the base plate 510. The bracket upper portion 534 and the seating portion 515 may be coupled to each other by welding, etc.

Figure 24:
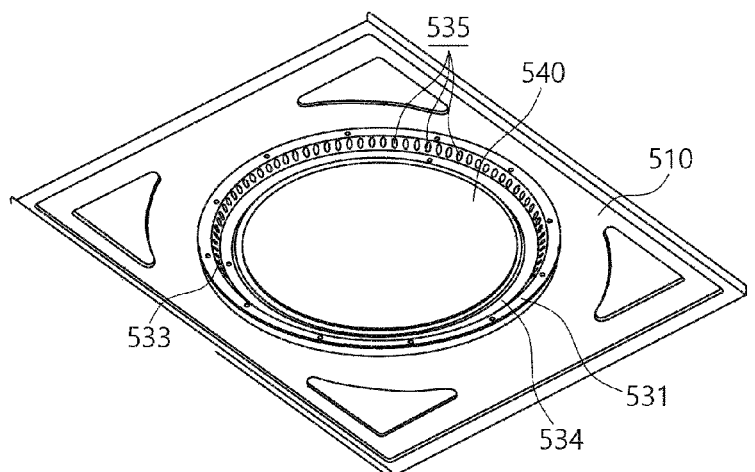
Figure 25:
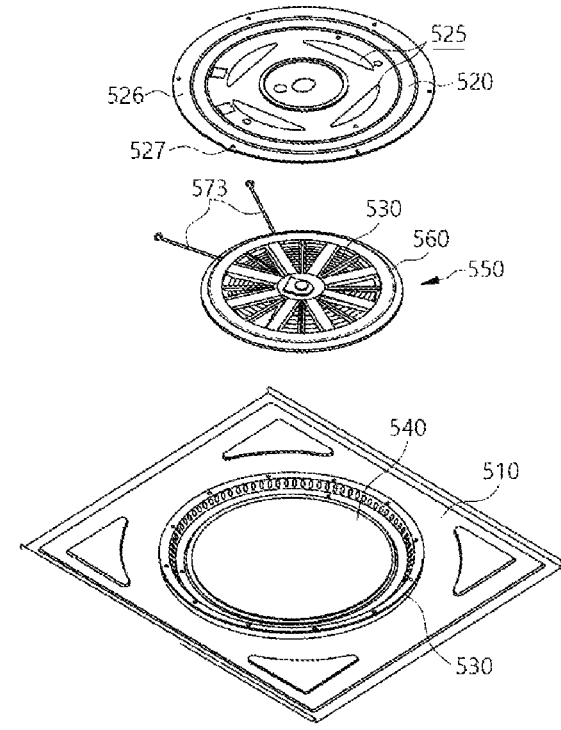

In this state, the shield filter 540 is coupled to the base plate 510 to block the base hole 512 of the base plate 510. The shield filter 540 may be simply seated on the base plate 510, and a fastening process by a tool or a fastener is not performed. FIG. 24 is a view showing the shield filter 540 seated on the seating portion 515 of the base plate 510. Herein, referring to FIG. 21, a location of the edge of the shield filter 540 may be guided by the depressed portion 514 of the base plate 510.

The coil assembly 550 and the supporter 520 may be laminated on the shield filter 540. The coil base 560 of the coil assembly 550 is larger than the shield filter 540, the shield filter 540 may be blocked. Referring to FIGS. 21 and 22, the filter supporter 561 of the coil base 560 may be in surface-contact with the edge of the shield filter 540.

Figure 26:
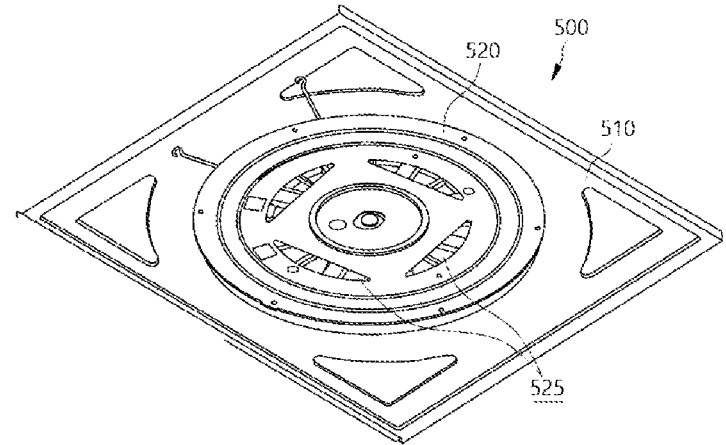

In this state, the supporter 520 may be disposed on the coil assembly 550, and the supporter 520 and the coil base 560 may be coupled to each other by a fastener, such as a screw, etc. Furthermore, the supporter 520 and the mounting bracket 530 may also be coupled to each other by a fastener, such as a screw, etc. Herein, since the mounting bracket 530 has been coupled to the base plate 510 first, the supporter 520 and the coil assembly 550 may also be coupled to the base plate 510 by a medium of the mounting bracket 530. This state is shown in FIG. 26.

In this process, the shield filter 540 may be pressed between the base plate 510 and the coil base 560. In other words, opposite surfaces of the shield filter 540 may be in surface-contact with the seating portion 515 and the filter supporter 561, and may be securely fixed while being pressed without a separate fastener.

Next, the third heat source module 600 will be described with reference to FIGS. 27 to 31. The third heat source module 600 may be arranged at an upper portion of the casing 100, 200. The third heat source module 600 may generate radiant heat inside the cavity S. Therefore, the third heat source module 600 may include a heating unit 610 (referring to FIG. 28). The heating unit 610 may generate radiant heat in a downward direction, i.e., toward the cavity S, and may heat an upper portion of food. The heating unit 610 may be a graphite heater. The heating unit may serve as a kind of a broil heater, and the heating unit may be used as usage of grill using direct fire heat or radiant heat.

The third heat source module 600 may be fixed to the inner casing 100 or the outer casing 200. In the embodiment, the third heat source module 600 may be fixed to the insulation upper plate 270. The third heat source module 600 may be arranged in the first electric chamber ES1. The outer upper plate 230 may be arranged above the third heat source module 600, so that the third heat source module 600 may be shielded. As shown in FIG. 1, the third heat source module 600 may be shielded by the outer upper plate 230.

On the other hand, the third heat source module 600 may move toward to the bottom of the cavity S, i.e., the second heat source module 500. The third heat source module 600 may include the moving assembly 630, so that the heating unit 610 may move. In the embodiment, since the heating unit 610 may move in upward and downward directions, the heating unit 610 may be raised and lowered.

The third heat source module 600 may include the moving assembly 630 including and protecting the heating unit 610 and the fixed assembly 640 provided at the insulation upper plate 270 to control upward and downward movements of the moving assembly 630. The third heat source module 600 may include a link assembly 650 provided at one portion of the moving assembly 630 to movably connect the moving assembly 630 to the fixed assembly 640. Hereinbelow, the above structure will be described in more detail.

The moving assembly 630 may be provided separately from the inner casing 100 and the outer casing 200 to be vertically movable inside the cavity S. Preferably, the moving assembly 630 may be provided to surround a lateral portion of the heating unit 610, so that heat of the heating unit 610 is concentrated downward without being emitted sideways.

The moving assembly 630 may have multiple levels of height. For example, the moving assembly 630 may have a first level at a highest location, a second level located at a middle location, and a third level at a lowest location. When the moving assembly 630 is located at the third level, heat transferred to the heating unit 610 may be strongest. The main controller 700 may adjust the height of the moving assembly 630 for each level.

The moving assembly 630 may include a heater housing 632 surrounding and protecting the heating unit 610, and an insulating member 635 provided at one end of the heater housing 632 and preventing heat or electromagnetic waves. As shown, the heater housing 632 may have a square box shape. A vertical through hole is provided in the bottom surface of the heater housing 632 so that heat of the heating unit 610 may pass through the hole.

The heater housing 632 may move vertically by passing through a gap between a fixed frame 641, which will be described below, and the protection cover 276. Therefore, the heater housing 632 may be shaped in a square box open upward, and have a predetermined thickness. The thickness of four side surfaces of the heater housing 632 may be formed less than a size of the gap between the fixed frame 641 and the protection cover 276.

Figure 28:
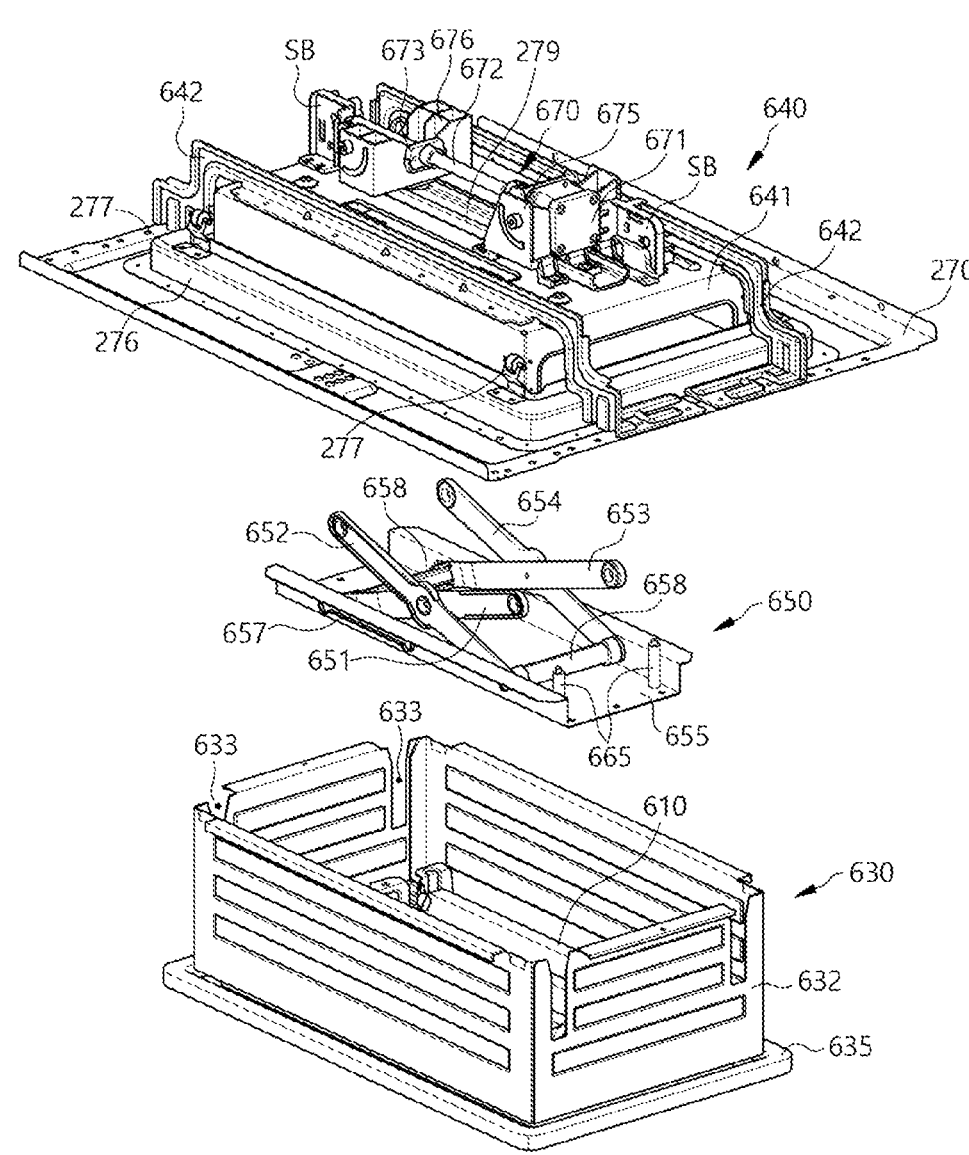
FIG. 28 is an exploded-perspective view showing components of the third heat source module shown in FIG. 27.

The heater housing 632 may have a guide groove 633 selectively storing a fixed guide 642, which will be described below. In other words, as shown in FIG. 28, the guide groove 633 may be formed in each of left and right surfaces of the heater housing 632 by penetrating the surface in a downward direction with a predetermined length. The guide groove 633 may store a frame coupling portion 643 of the fixed guide 642 when the moving assembly 630 is raised.

The insulating member 635 may have a rectangular frame shape as shown in the drawings. Preferably, lateral ends of the insulating member 635 may be formed to protrude outward than the lateral ends of the heater housing 632. In other words, the exterior size of the insulating member 635 may be formed larger than the lateral size of the heater housing 632, so that electromagnetic waves may be prevented from leaking outward through the gap between the fixed frame 641 and the protection cover 276 when the moving assembly 630 is raised.

Figure 7:
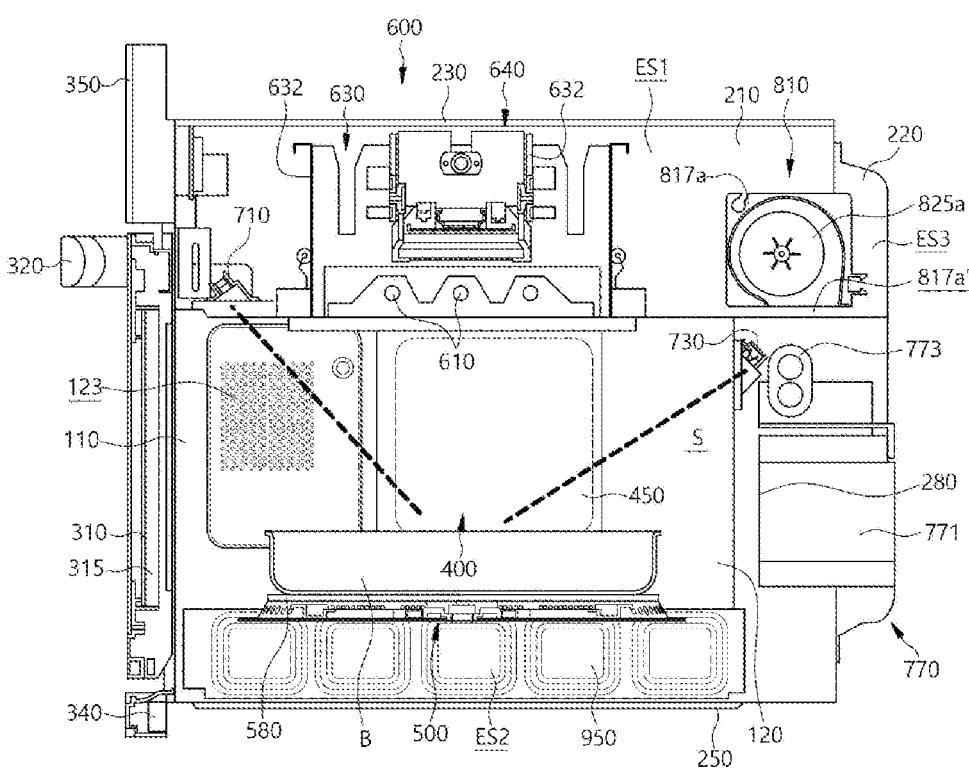
FIG. 7 is a sectional view taken along line VII-VII' in FIG. 1.

The heating unit 610 may be provided inside the heater housing 632. The heating unit 610 may have a transversally or longitudinally long shape, and preferably, a plurality of heating units 610 may be provided and installed in an inner lower end of the heater housing 632. As shown in FIG. 7, the view shows total three heating units 610 arranged in the moving assembly 630.

The three heating units 610 may be operated independently. In other words, among the three heating units 610, any one or two heating units may be operated, or the three heating units 610 may be operated at the same time. The main controller 700 may control the number of operated heating units among the three heating units 610, or control an operating time of the three heating units 610, or control the height of the moving assembly 630 and the height of the heating units 610.

Next, the fixed assembly 640 may be securely provided at an upper portion of the insulation upper plate 270. The fixed assembly 640 may support the moving assembly 630 so that the moving assembly 630 may move in the upward and downward directions while being supported by an upper surface of the insulation upper plate 270. The fixed assembly 640 may include a moving control means 670 to restrict the moving assembly 630 to move in the upward and downward directions by operation of the link assembly 650.

The link assembly 650 may be provided at an upper portion of the moving assembly 630. The link assembly 650 may include at least one link, and may guide the moving assembly 630 to move in the upward and downward directions while being connected to the fixed assembly 640. Herein, upper and lower ends of the link assembly 650 may be rotatably connected to the fixed assembly 640 and the moving assembly 630.

The insulation upper plate 270 may be regarded as a part of the fixed assembly 640. The fixed assembly 640 may include the fixed frame 641 that is provided on the insulation upper plate 270 to support the moving control means 670.

Herein, the fixed frame 641 may be provided to be spaced apart of the protection cover 276 of the insulation upper plate 270. More specifically, the protection cover 276 may also have a rectangular shape like the insulation upper plate 270, and the protection cover 276 may have a vertical through hole at a center portion thereof like the insulation upper plate 270 to form a rectangular frame shape. Accordingly, the moving assembly 630 may move in the upward and downward directions through such the insulation upper plate 270 and the central hole of the protection cover 276.

The fixed frame 641 may have a rectangular shape smaller than the rectangular-shaped central hole of the protection cover 276. Therefore, a predetermined gap may be provided between the fixed frame 641 and the protection cover 276, and the heater housing 632 of the moving assembly 630, which will be described in more detail below, may move in the upward and downward directions through the gap.

The fixed frame 641 may be securely provided on the insulation upper plate 270. For this structure, the fixed guide 642 may be provided between the insulation upper plate 270 and the fixed frame 641. The fixed guide 642 may have an approximately "∩"-like shape (view from the front) as shown in the drawings. Therefore, an upper end of the fixed guide 642 may be coupled to the fixed frame 641, and a lower end of the fixed guide 642 may be fixed to the insulation upper plate 270 or the protection cover 276.

Figure 27:
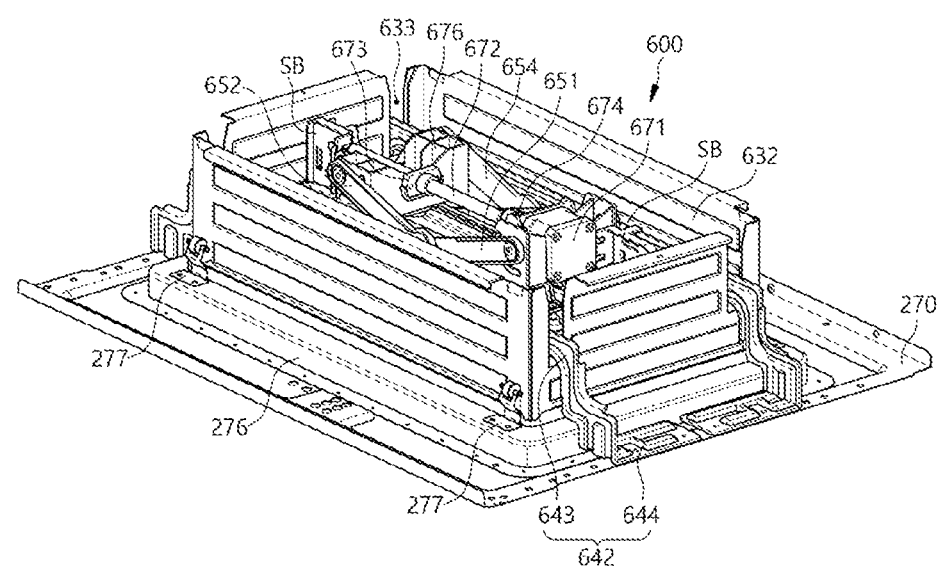
FIG. 27 is a perspective view showing the configuration of a third heat source module of the cooking appliance according to the embodiment of the present disclosure.

Specifically, as shown in FIG. 27, the fixed guide 642 may include the frame coupling portion 643 coupled to the fixed frame 641, and an upper coupling portion 644 fixed to the insulation upper plate 270 or the protection cover 276. In the present disclosure, the upper coupling portion 644, i.e., the lower end of the fixed guide 642, is coupled to the upper surface of the insulation upper plate 270.

The fixed assembly 640 may include a sliding rail 279 supporting a moving bracket 676 or a lead nut 673, which will be described below, to be slidable. The sliding rail 279 may be provided with a transversally predetermined length on an upper surface of the fixed frame 641. The moving bracket 676 or the lead nut 673 may be transversally movably installed on this sliding rail 279.

The moving control means 670 may be provided on the fixed frame 641. The moving control means 670 may include a motor 671 generating rotation power, a lead screw 672 provided at one portion of the motor 67 land rotated in conjunction with the rotation power generated by the motor 671, and the lead nut 673 fastened to the lead screw 672 by screwing.

The motor 671 may generate rotation power and a stepping motor may be used as the motor 671 so as to perform precise rotation control. The stepping motor may supply forward and reverse rotation movements in response to a rotation angle by purse control.

As shown in the drawings, the lead screw 672 may be a fine cylinder of a predetermined length, of which an outer surface is formed in a male screw. Herein, the male screw of the lead screw 672 is coupled to the lead nut 673 having a female screw corresponding to the male screw. Therefore, when the lead screw 672 is rotated by power of the motor 671, the lead nut 673 moves transversally along the lead screw 672. As described above, the lead screw 672 and the lead nut 673 may function to change the forward and reverse rotation movements into a linear movement.

A connection coupling 674 may be provided between the motor 671 and the lead screw 672 to connect one end of the lead screw 672 to a motor shaft. In other words, as shown in FIG. 27, the connection coupling 674 may be provided between a right end of the lead screw 672 and the motor shaft protruding leftward from the motor 671.

The motor 671 may be provided to a fixed bracket 675 securely mounted to the fixed assembly 640, and the lead nut 673 may be mounted to the moving bracket 676 movably installed to the fixed assembly 640. The moving bracket 676 may be movably provided above the fixed frame 641 to move closer to or farther from the fixed bracket 675.

Specifically, the fixed frame 641 may be provided above the insulation upper plate 270 to be spaced apart therefrom by the fixed guide 642, and a gap of predetermined size is formed between the fixed frame 641 and the protection cover 276, thereby forming a moving path of the heater housing 632, which will be described below.

When the lead screw 672 is rotated in response to rotation of the motor 671 mounted to the fixed bracket 675, the lead nut 673 moves transversally, whereby the moving bracket 676 moves transversally along the sliding rail 279.

Upper ends of a link of the link assembly 650 may be rotatably installed to the fixed bracket 675 and the moving bracket 676. In other words, when left and right upper ends of an "X"-shaped link provided in the link assembly 650 are respectively connected to the fixed bracket 675 and the moving bracket 676, the left and right upper ends of the "X"-shaped link may move closer to each other or farther from each other in response to leftward and rightward movements of the moving bracket 676, so that the moving assembly 630 fixed to the lower end of the link assembly 650 may move in upward and downward directions.

Meanwhile, the link assembly 650 may have a structure including at least one link, and the upper end of the link assembly 650 may be rotatably connected to the fixed assembly 640 and the lower end thereof may be rotatably connected to the moving assembly 630.

The link assembly 650 may include a pair of front links 651 and 652 and a pair of rear links 653 and 654 that are spaced apart from each other by a predetermined distance in a longitudinal direction. A link frame 655 coupled to the moving assembly 630 may be provided at lower ends of the front links 651 and 652 and the rear links 653 and 654.

At least one of left and right lower ends of the front links 651 and 652 and at least one of left and right lower ends of the rear links 653 and 654 may be movably coupled to the link frame 655. Specifically, the pair of front links 651 and 652 may be configured such that a front first link 651 and a front second link 652 formed in a "X"-shape may be coupled to each other to be rotatable on a center, in which the front first link 651 and the front second link 652 cross each other, as a rotation center. The pair of rear links 653 and 654 may be configured such that a rear first link 653 and a rear second link 654 formed in a "X"-shape may be coupled to each other to be rotatable on a center, in which the rear first link 653 and the rear second link 654 cross each other, as a rotation center.

The lower ends of the front first link 651 and the rear first link 653, which are installed to be spaced apart from each other in the longitudinal direction by a predetermined distance, may be connected to each other by a connection link 658. The lower ends of the front second link 652 and the rear second link 654 may be connected to each other by the connection link 658.

At least one of the left and right lower ends of the front links 651 and 652 and at least one of the left and right lower ends of the rear links 653 and 654 may be movably coupled to the link frame 655. In the embodiment, as shown in the drawing, the view shows a case in which the lower ends of the front first link 651 and the rear first link 653 are installed to be movable in a transverse direction of the link frame 655.

Therefore, a first link protrusion hole 657 may be formed in a left half portion of the link frame 655, so that lower end shafts of the front first link 651 and the rear first link 653 are inserted into the first link protrusion hole 657 to be movable in the transverse direction.

Figure 29:
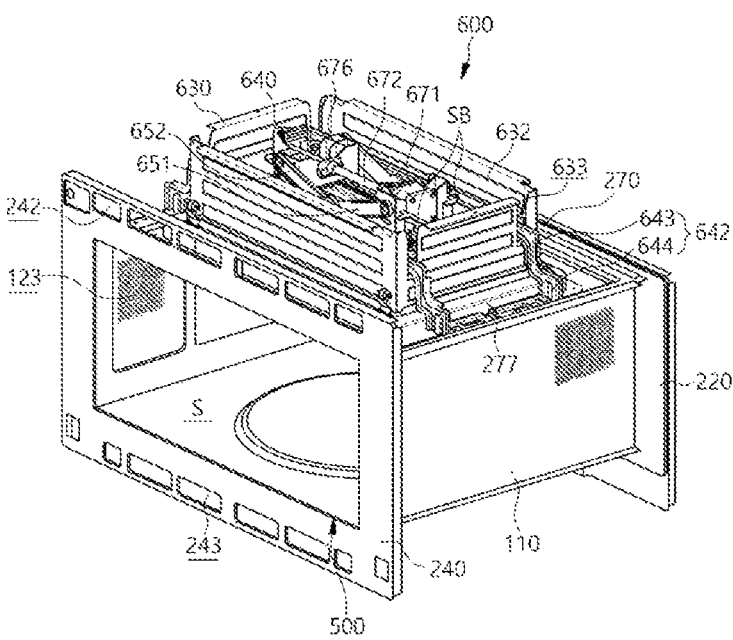
FIG. 29 is a perspective view showing the third heat source module in FIG. 27 arranged at a first location.
Figure 30:
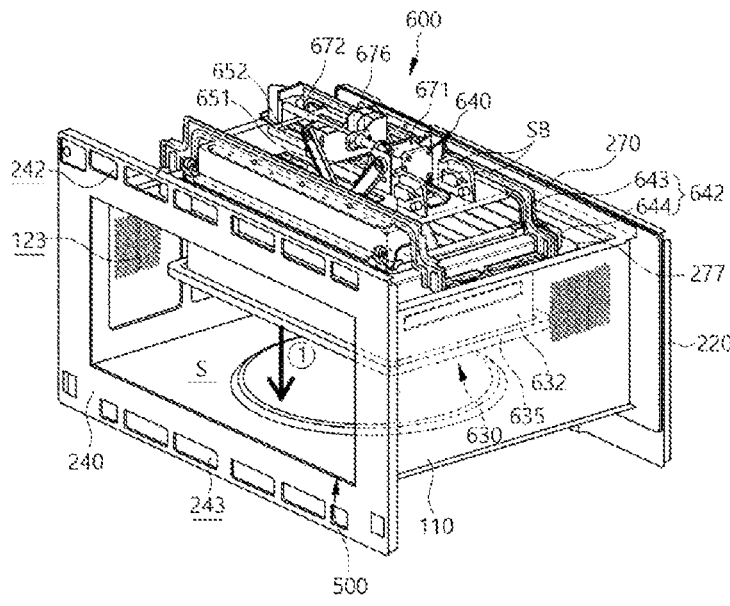
FIG. 30 is a perspective view showing the third heat source module in FIG. 27 arranged at a second location.

In FIG. 29, the moving assembly 630 is in the first location. In FIG. 30, the moving assembly 630 is in the second location. When the moving assembly 630 is in the second location, the heating units 610 are located closer to the food, so that the food may be heated up faster. As shown in FIG. 30, when the moving assembly 630 is in the second location, the fixed guide 642 and the motor 671 constituting the fixed assembly 640 may not be moved and fixed in initial locations.

Figure 31:
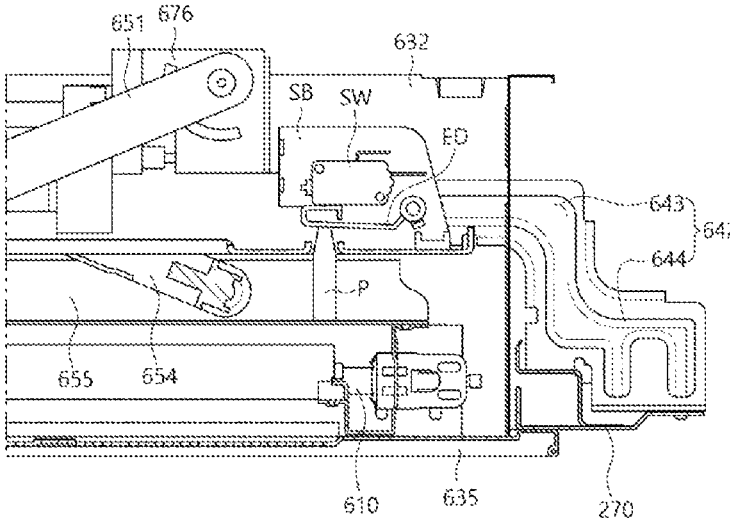
FIG. 31 is a sectional view showing a state where the third heat source module in FIG. 27 is arranged at a first location and a location switch thereof is pressed by an operation pin.

Meanwhile, in FIG. 31, a recovery switch SW arranged at the insulation upper plate 270 is pressed and an ON state is activated. The recovery switch SW is provided to detect recovery of the moving assembly 630 to the first location. The recovery switch SW may be turned in the ON state by being pressed by the moving assembly 630 recovered to the first location, and in the ON state, the main controller 700 may know that the moving assembly 630 is recovered.

When the recovery switch SW is turned to the ON state, the main controller 700 may detect recovery of the moving assembly 630 to the first location and may stop the motor 671. In other words, the main controller 700 may stop the motor 671 to prevent the moving assembly 630 from being raised above the first location. In the embodiment, the recovery switch SW may limit a rising height of the moving assembly 630, and the number of rotation of the motor 671 may limit a lowering height of the moving assembly 630.

The recovery switch SW is arranged at the insulation upper plate 270 or the fixed guide 642 so as to remain fixed regardless of movement of the moving assembly 630. The moving assembly 630 may include an operation pin P pressing and operating the recovery switch SW. The operation pin P may be arranged at the moving assembly 630, thereby being raised and lowered together with the moving assembly 630.

Herein, the recovery switch SW may include an elastic drive part ED. The elastic drive part ED may be a part that is actually pressed by the operation pin P. When the operation pin P presses the elastic drive part ED, the elastic drive part ED may press the recovery switch SW. The operation pin P may have a pin shape of which an upper end is narrower than a lower end, so that a contact portion of the recovery switch SW may be precisely pressed. In the embodiment, the operation pin P may press a wide surface of the elastic drive part ED and the elastic drive part ED may press the recovery switch SW, so that stable driving may be secured.

Both the recovery switch SW and the elastic drive part ED may be provided at a switch bracket SB. The switch bracket SB may be arranged at the fixed assembly 640. In the embodiment, the switch bracket SB may be arranged at the fixed guide 642 of the fixed assembly 640.

As shown in FIG. 30, two recovery switches SW may be included in the third heat source module 600. The pair of recovery switches SW may be arranged adjacent to the pair of fixed guides 642, respectively. Even when any one of the pair of recovery switches SW is broken, but a remaining recovery switch SW is normally operated, recovering of the moving assembly 630 to the first location may be detected. It is understood that only one recovery switch SW may be provided.

Figure 32:
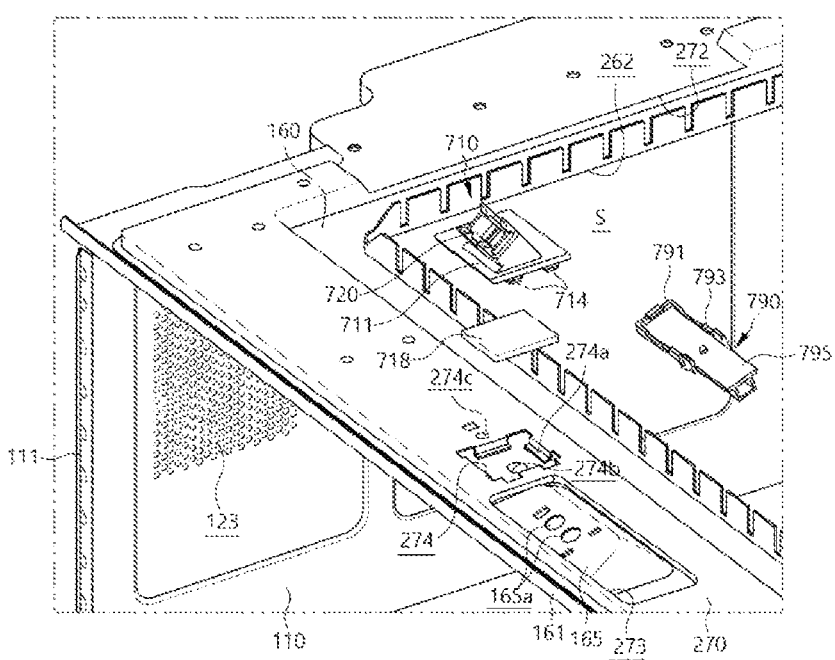
FIG. 32 is a perspective view showing a state where the distance sensor and a lighting fixture of the cooking appliance according to the embodiment of the present disclosure are separated from the outer upper plate.

Referring to FIG. 32, the cooking appliance may include the distance sensor 710. The distance sensor 710 may detect the existence of the food, the thickness of the food, and/or the height of the food. The distance sensor 710 may measure the thickness or the height of the food, and the main controller 700 may separately control operation and temperature of the first heat source module 400, the second heat source module 500, or the third heat source module 600 on the basis of the measured information. Furthermore, the distance sensor 710 may measure the thickness or the height of the food, which is changed in response to cooking time, and the main controller 700 may control a remaining cooking time or temperature. The distance sensor 710 may be an infrared sensor.

The distance sensor 710 may be arranged at the insulation upper plate 270. As shown in FIG. 3, the distance sensor 710 may be arranged at a front portion of the insulation upper plate 270. The distance sensor 710 may be arranged at an upper portion of the insulation upper plate 270, the upper portion being located close to the outer front plate 240. When the distance sensor 710 is arranged at the front portion of the insulation upper plate 270, air introduced from the outside space may pass through the distance sensor 710 first, so that the distance sensor 710 may be efficiently cooled.

The distance sensor 710 is preferably arranged at a center portion based on a transverse width of the insulation upper plate 270 to face the center portion of the cavity S. The inner upper plate 160 may be arranged below the insulation upper plate 270, but the inner upper plate 160 may have the sensing hole 163, so that the distance sensor 710 may sense the inside space of the cavity S through the sensing hole 163.

As described above, the distance sensor 710 may be arranged at the insulation upper plate 270 so that heat of the cavity S may be prevented from being directly transferred to the distance sensor 710. Therefore, the durability of the distance sensor 710 may be improved.

FIGS. 32 to 35 are views showing a structure of the distance sensor 710 according to an embodiment of the present disclosure. First, as shown in FIG. 32, the distance sensor 710 may be arranged at the sensor mounting portion 274 provided in the insulation upper plate 270. The sensor mounting portion 274 may be formed by vertically penetrating the insulation upper plate 270. A sensor housing 711 of the distance sensor 710 may be arranged at the sensor mounting portion 274.

Herein, the insulation cover 718 of the distance sensor 710 may be disposed on a sensor seating end 274a provided in the sensor mounting portion 274. A plurality of sensor seating ends 274a may be provided in the sensor mounting portion 274, and the plurality of sensor seating end 274a may have a structure that is stepped in a direction in which the width of the sensor mounting portion 274 is narrowed. Accordingly, the insulation cover 718 may be prevented, by being caught by the sensor seating end 274a, from falling downward. The sensor seating ends 274a may be provided at different surfaces of the sensor mounting portion 274.

The distance sensor 710 may include the sensor housing 711 and the distance sensing part 720. The sensor housing 711 may be fixed to the sensor mounting portion 274, and the distance sensing part 720 may be fixed to the sensor housing 711. An insulation cover 718 may be provided below the sensor housing 711. The insulation cover 718 may be made of a glass material for sensing. The insulation cover 718 may be provided to prevent heat in the cavity S from being transferred to the distance sensor 710.

Figure 33:
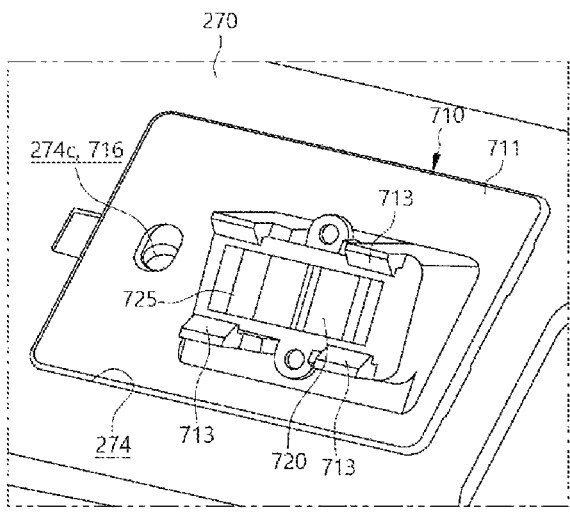
FIG. 33 is a perspective view showing a state where the distance sensor of the cooking appliance according to the embodiment of the present disclosure is arranged at the outer upper plate.

As shown in FIG. 33, the distance sensor 710 may be arranged at the insulation upper plate 270. The sensor housing 711 of the distance sensor 710 may be arranged at the sensor mounting portion 274 in a manner of covering the sensor mounting portion 274. The sensor housing 711 may include a plurality of fixing hooks 713. The fixing hooks 713 may grab and fix the distance sensing part 720. In the embodiment, the sensor housing 711 may include four fixing hooks 713.

Figure 34:
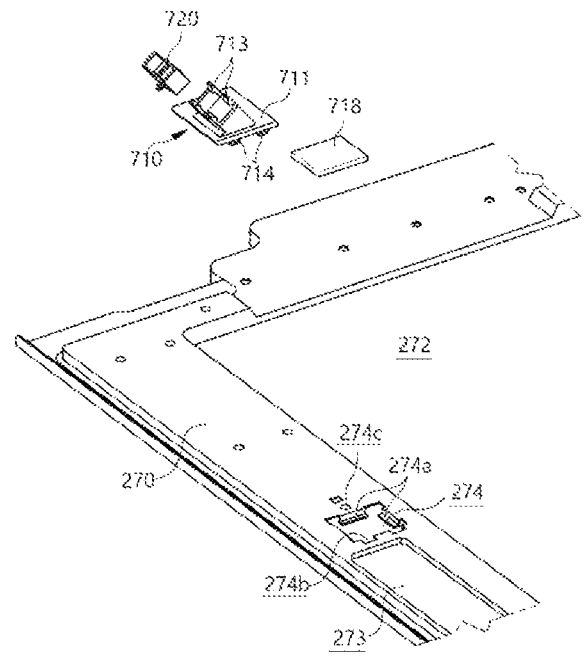
FIG. 34 is an exploded-perspective view showing components of the distance sensor of the cooking appliance according to the embodiment of the present disclosure.

As shown in FIGS. 32 to 34, the insulation upper plate 270 may have a locking groove 274b, and a locking step 714 of the sensor housing 711 may be caught to the locking groove 274b. While the sensor housing 711 is obliquely coupled to the sensor mounting portion 274 and the locking step 714 is caught to the locking groove 274b first, when the sensor housing 711 is rotated, the sensor housing 711 may completely cover the upper side of the sensor mounting portion 274.

Herein, the sensor housing 711 may have a second housing coupling hole 716 corresponding to a first housing coupling hole 274c of the insulation upper plate 270. When the second housing coupling hole 716 is connected to the first housing coupling hole 274c, a fastener (not shown), such as a screw, may be fastened to the first housing coupling hole 274c and the second housing coupling hole 716. The second housing coupling hole 716 may be coupled to the opposite side of the locking step 714.

In FIG. 34, both the distance sensing part 720 and the insulation cover 718 are disassembled from the sensor housing 711 of the distance sensor 710. As described above, the insulation cover 718 is first provided on the sensor seating end 274*a* of the sensor mounting portion 274, and then the assembly of the sensor housing 711 and the distance sensing part 720 may be assembled on the insulation cover 718 and the sensor seating end 274*a*.

Figure 35:
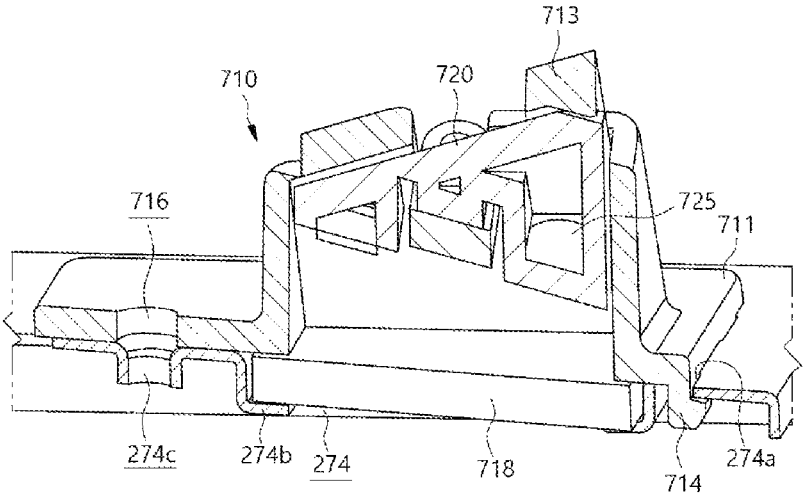
FIG. 35 is a sectional view showing a state where the distance sensor of the cooking appliance according to the embodiment of the present disclosure is arranged at the outer upper plate.

As shown in FIG. 35, the distance sensing part 720 arranged at the sensor housing 711 may be arranged in an inclined direction. Specifically, a sensing device 725 provided in the distance sensing part 720 may face in the inclined direction. Referring to FIG. 35, the sensing device 725 is arranged to face the left lower side. Therefore, the sensing device 725 may face the center portion of the cavity S. For example, as shown in FIG. 7, the distance sensor 710 may be mounted to be inclined toward the center portion of the cavity S.

Next, referring to FIGS. 36 to 42, the camera module 730 will be described according to an embodiment of the present disclosure. The camera module 730 may be provided to observe the inside space of the cavity S. The camera module 730 may allow the user to observe the food in the cavity S in real time, and the main controller 700 may analyze images recorded by the camera module 730 to control proper cooking temperature and time.

Figure 36:
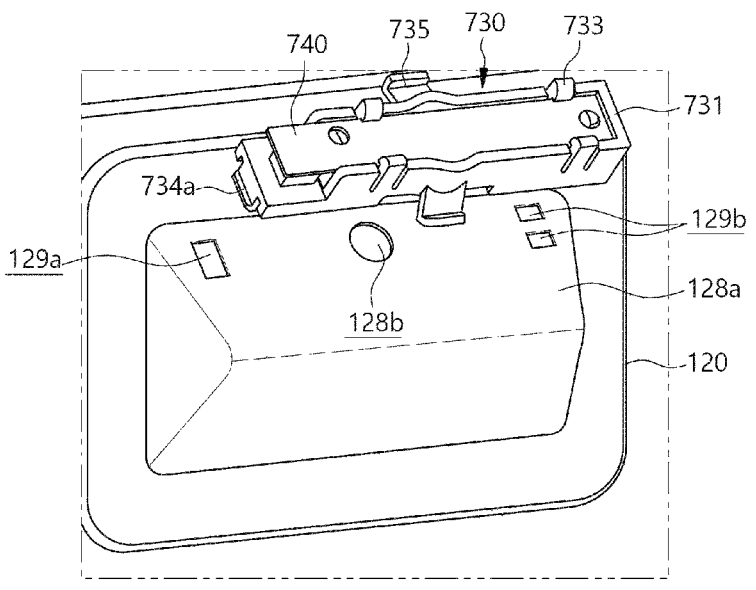
FIG. 36 is an exploded-perspective view showing a state where a camera sensor of the cooking appliance according to the embodiment of the present disclosure is separated from the inner casing.

The camera module 730 may be arranged at the camera mounting part 128 provided in the inner rear plate 120. As shown in FIG. 36, the camera mounting part 128 may protrude rearward from the inner rear plate 120. On the other hand, an insulation space 128*c* (referring to FIG. 41) recessed from the camera mounting part 128 may be formed inside the cavity S. This recessed insulation space 128*c* may provide an angle of view that may allow a camera sensor 745 of the camera module 730 to film wide the inside space of the cavity S. Alternately, the insulation space 128*c* may serve as a kind of an insulation space to prevent the camera sensor 745 from being damaged.

An upper portion of the camera mounting part 128 may have an inclined structure. The camera module 730 may be arranged at an inclined flat surface 128*a* of the camera mounting part 128. The camera sensor 745 may be arranged in the inclined direction, and may face the center portion of the cavity S.

The flat surface 128*a* of the camera mounting part 128 may have a filming hole 128*b*. The camera sensor 745 may be exposed inward of the cavity S through the filming hole 128*b*. Therefore, the center of the camera sensor 745 may need to be aligned on the filming hole 128*b*. Accordingly, the flat surface 128*a* of the camera mounting part 128 may have a plurality of housing fixing holes 129*a* and 129*b*. The housing fixing holes 129*a* and 129*b* may include the first fixing hole 129*a* and a second fixing hole 129*b*, and the camera module 730 may be fixed to the first and second fixing holes.

Specifically, based on the filming hole 128*b*, the first fixing hole 129*a* may be formed at one side of the filming hole 128*b* and the second fixing hole 129*b* may be formed at the opposite side thereof. In the embodiment, the second fixing hole 129*b* may include two holes, thereby reducing the vertical clearance.

Figure 37:
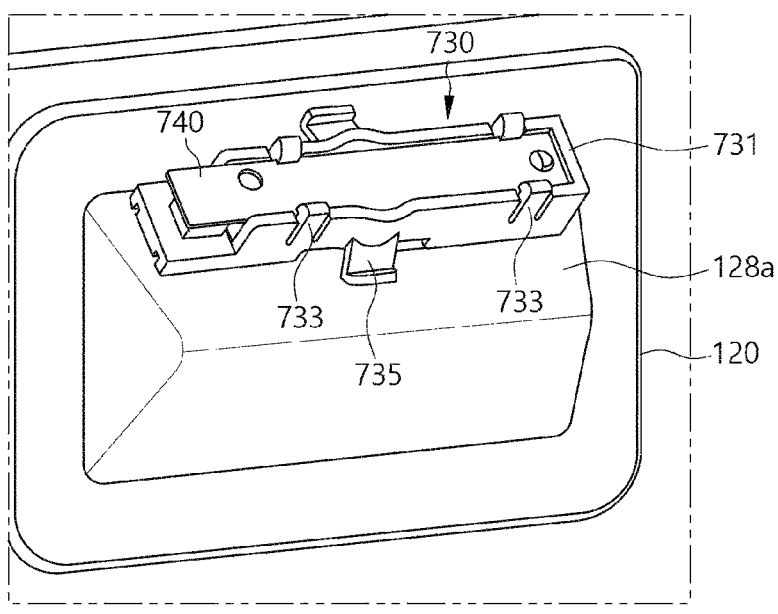
FIG. 37 is a perspective view showing a state where the camera sensor of the cooking appliance according to the embodiment of the present disclosure is arranged at the inner casing.

The camera module 730 may include a camera housing 731, and a camera substrate 740 mounted to the camera housing 731. The camera sensor 745 may be embedded in the camera substrate 740. After the camera substrate 740 is assembled to the camera housing 731 first, the camera module 730 may be mounted to the flat surface 128*a* of the camera mounting part 128. In FIG. 37, the camera module 730 is mounted to the flat surface 128*a* of the camera mounting part 128. For reference, both the camera substrate 740 and the camera sensor 745 may be regarded as one camera sensor.

Figure 38:
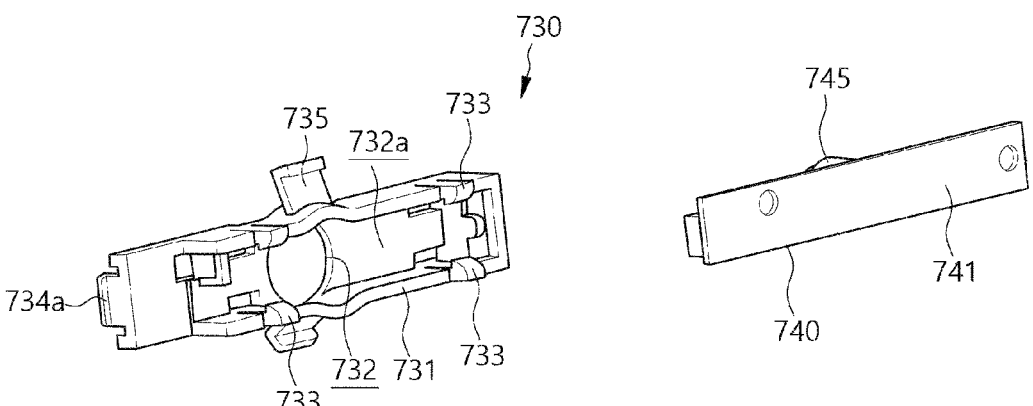
FIG. 38 is an exploded-perspective view showing components of the camera sensor shown in FIG. 36.

In FIG. 38, the camera module 730 is shown as being disassembled. As shown in the drawing, the camera housing 731 may have an approximately hexahedron shape that may be extended long in the transverse direction. The camera housing 731 may have a substrate mounting space 732*a* in which the camera substrate 740 may be arranged. The substrate mounting space 732*a* may be formed deeply than the thickness of the camera substrate 740.

The substrate mounting space 732*a* may have a lens exposing hole 732 that may expose a lens of the camera sensor 745. The lens exposing hole 732 may be open toward the inside space of the cavity S. The lens exposing hole 732 may overlap with the filming hole 128*b* of the flat surface 128*a* to form a continuous hole. For reference, in FIG. 8, the camera sensor 745 is exposed toward the inside space of the cavity S.

The camera housing 731 may include a substrate holding hook 733. The substrate holding hook 733 may be provided to hook an edge of the camera substrate 740 to fix the camera substrate 740. The substrate holding hook 733 may protrude from an edge of the camera housing. In the embodiment, total four substrate holding hooks 733 are provided in the camera housing 731, and three or five substrate holding hooks 733 may be provided.

Figure 39:
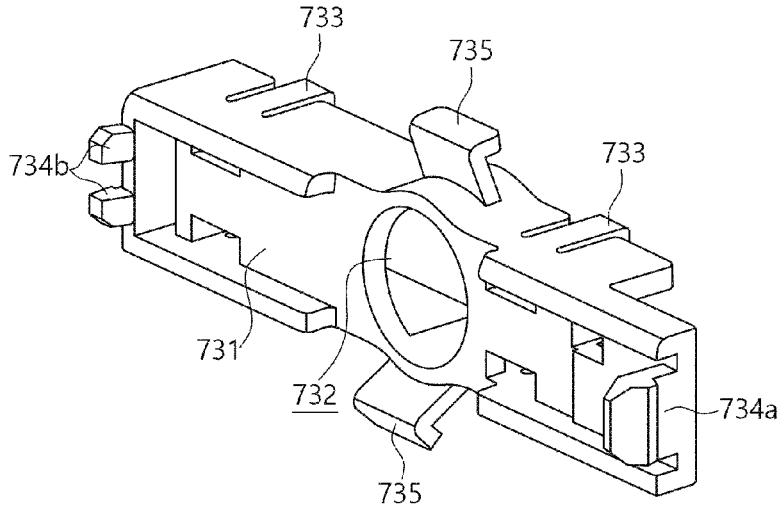
FIG. 39 is a perspective view showing the configuration of a camera housing among the components of the camera sensor shown in FIG. 36.
Figure 40:
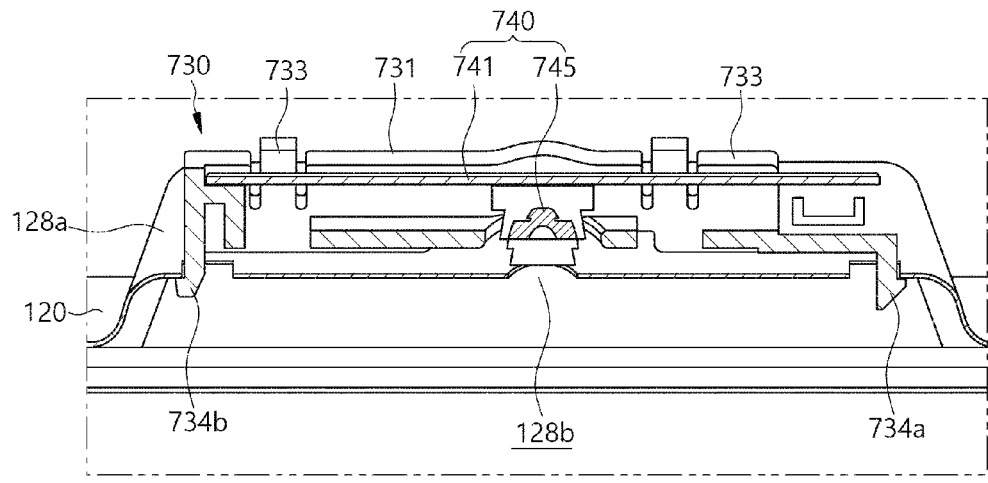
FIG. 40 is a sectional view showing a state where the camera sensor of the cooking appliance according to the embodiment of the present disclosure is arranged at the inner casing.

As shown in FIG. 39, the camera housing 731 may include camera mounting hooks 734*a* and 734*b* at the opposite side of the substrate mounting space 732*a*. The camera mounting hooks 734*a* and 734*b* may include a first mounting hook 734*a* and a second mounting hook 734*b* respectively provided at left and right portions of the camera housing 731. The first mounting hook 734*a* and the second mounting hook 734*b* may be respectively hooked by the first fixing hole 129*a* and the second fixing holes 129*b* provided in the flat surface 128*a*. Herein, the second mounting hook 734*b* may include two second mounting hooks to correspond to the second fixing holes 129*b*, thereby reducing the vertical clearance of the camera module 730. FIG. 40 is a view showing the first mounting hook 734*a* and the second mounting hook 734*b* respectively fixed to the first fixing hole 129*a* and the second fixing holes 129*b*.

Figure 41:
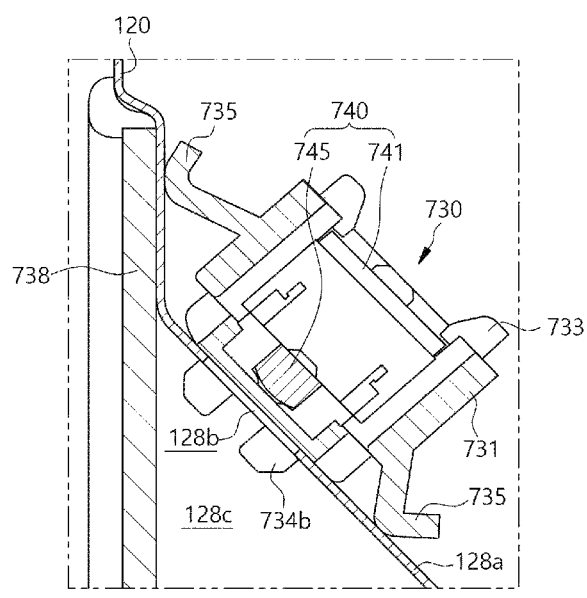
FIG. 41 is a sectional view taken at a different angle from FIG. 40, which shows a state where the camera sensor of the cooking appliance according to the embodiment of the present disclosure is arranged at the inner casing.
Figure 42:
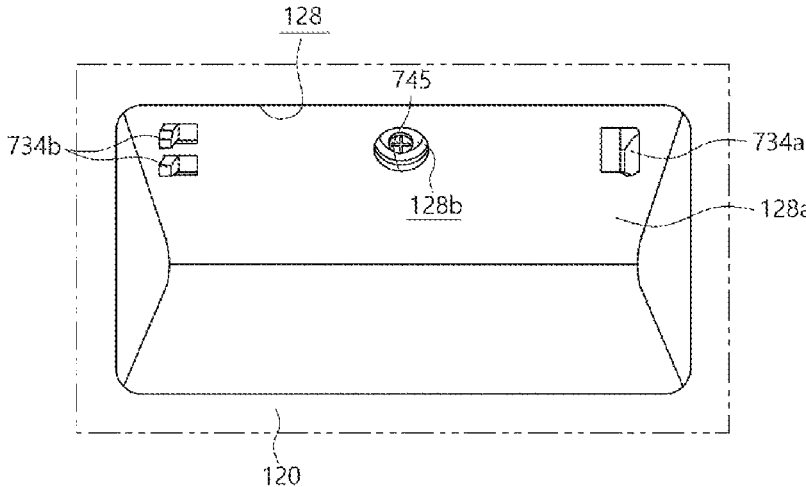
FIG. 42 is a perspective view taken from the inside space of a cavity, which shows a state where the camera sensor of the cooking appliance according to the embodiment of the present disclosure is arranged at the inner casing.

The camera housing 731 may include an elastic arm 735. The elastic arm 735 may have a cantilever shape protruding from the camera housing 731 toward the flat surface 128*a*. In the embodiment, the camera housing 731 may include a pair of elastic arms 735. The elastic arms 735 may be elastically deformed when the camera housing 731 is mounted to the camera mounting part 128, and may press against the flat surface 128*a*. In this state, the elastic arms 735 is in strong and close contact with the flat surface 128*a*, and even when vibrations are generate in an operation process of the cooking appliance, the camera module 730 may remain solidly fixed. In FIG. 41, the elastic arms 735 is in close contact with the flat surface 128*a*.

The pair of elastic arms 735 may be provided around the lens exposing hole 732. When the first mounting hook 734*a* and the second mounting hook 734*b* are arranged at left and right portions based on the lens exposing hole 732, the pair of elastic arms 735 may be arranged in the vertical direction based on the lens exposing hole 732. Accordingly, the camera module 730 may be securely fixed to the camera mounting part 128 in both the transverse direction and the vertical direction. Furthermore, since the pair of elastic arms

735 is elastically supported by the flat surface 128*a*, the camera module 730 may be fixed without the clearance in the longitudinal direction.

As shown in FIG. 41, the camera mounting part 128 may include a camera cover 738. In order to allow the camera sensor 745 to record or film the inside space of the cavity S, the camera cover 738 may be made of a transparent or translucent material. The camera cover 738 may be arranged at front of the camera module 730, and may prevent the camera sensor 745 from being damaged by heat in the cavity S. The camera cover 738 may be arranged at the opposite side of the flat surface 128*a*, but in the embodiment, the camera cover 738 may shield the recessed insulation space 128*c*.

Referring to FIG. 7, in the embodiment, the camera module 730 may be arranged to face the center portion of the cavity S. Specifically, the lens of the camera module 730 may be arranged to face a center portion of a bottom surface of the cavity S. Since the food may be arranged at the center portion of the bottom surface of the cavity S, the lens of the camera module 730 may be preferably arranged to face the center portion of the bottom surface of the cavity S.

Next, referring to FIG. 43, a humidity sensing module 750 and a second temperature sensor 760 will be described. The humidity sensing module 750 may detect the amount of moisture in the cavity S, i.e., humidity, and transmit the information to the main controller 700. The humidity sensing module 750 may include a humidity sensor detecting the humidity in the cavity S, and a signal converter converting a humidity detection signal of the humidity sensor into a digital signal, and a signal transmission module transmitting the humidity detection signal to the main controller 700.

Herein, the humidity sensing module 750 may be mounted by penetrating from the inside portion to the outside portion of an exhaust duct 940, which will be described below, thereby detecting the humidity in the cavity S. The exhaust duct 940 is a portion through which air in the cavity S is discharged. Therefore, the humidity sensing module 750 may be arranged in the exhaust duct 940 and may precisely measure the humidity in the cavity S. In the embodiment, the humidity sensing module 750 may be arranged at a position facing the outlet port 125 of the inner side plate 110, thereby increasing the sensing precision.

The exhaust duct 940 may include the second temperature sensor 760. The second temperature sensor 760 may measure the temperature in the cavity S. The second temperature sensor 760 may be arranged in the exhaust duct 940 and may precisely measure the temperature in the cavity S. The above-described first temperature sensor 578 may measure the temperature of the second heat source module 500, and the second temperature sensor 760 may measure the temperature in the cavity S. The main controller 700 may control the first heat source module 400, the second heat source module 500, or the third heat source module 600 on the basis of the temperature measured by the second temperature sensor 760.

Meanwhile, although not shown, the exhaust duct 940 may include a temperature block switch. The temperature block switch may be a safety switch that may cuts off the power when the temperature in the cavity S exceeds a preset temperature. Herein, instead of the second temperature sensor 760, the temperature block switch may be arranged.

Furthermore, an additional third temperature sensor (not shown) may be arranged at the first electric chamber ES1. The third temperature sensor may be printed on the insulation upper plate 270 or the inner upper plate 160. The third temperature sensor may adopt any one of a negative temperature coefficient (NTC) type, in which a resistance value is reduced when the temperature is increased, and a positive temperature coefficient (PTC) type in which a resistance value is increased when the temperature is increased.

Figure 18:
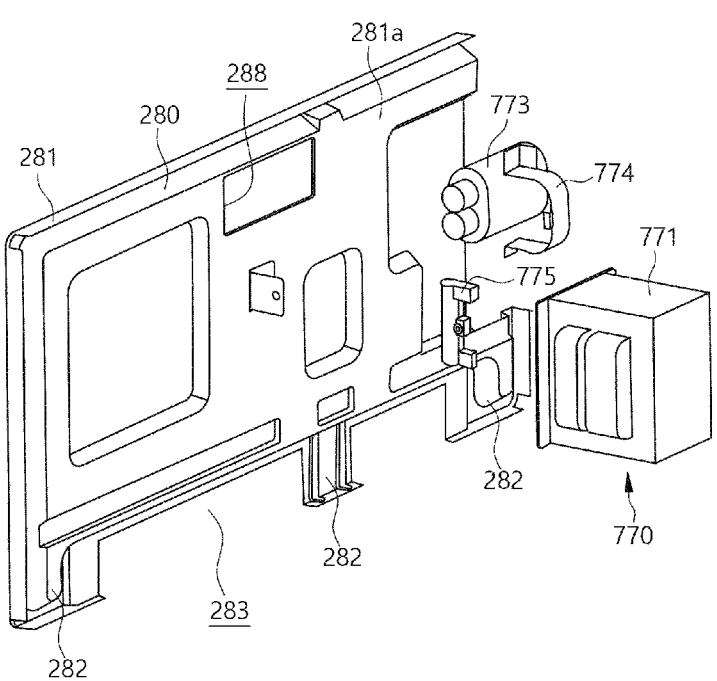
FIG. 18 is an exploded-perspective view showing the configuration of a power supply unit arranged at an insulation rear plate and an insulation rear plate of the cooking appliance according to the embodiment of the present disclosure.

Referring to FIGS. 6 and 18, the cooking appliance may include the power supply unit 770. The power supply unit 770 may serve to be supplied with external power and transfer the power to the internal parts of the cooking appliance. The power supply unit 770 may include the high voltage transformer 771, a high voltage capacitor 773, and a fuse 775. The components constituting the power supply unit 770 are only examples, and additional components may be provided or some parts may be omitted.

The high voltage transformer 771 may serve to apply high pressure a high voltage current to the magnetron 410. For example, the high voltage transformer 771 may be a part provided to boost the household voltage, which is usually 100-220V, to a high voltage. Furthermore, the high voltage transformer 771 may supply power to the working coil 570 of the second heat source module 500 or the heating units 610 of the third heat source module 600. In the drawing, a busbar or a wire harness, which is provided to connect the high voltage transformer 771, the magnetron 410, etc. to each other, is not shown.

In the embodiment, the power supply unit 770 may be arranged on a surface 281 of the insulation rear plate 280. The insulation rear plate 280 may be coupled to the inner rear plate 120, and may prevent heat of the inner rear plate 120 from being directly transferred to the power supply unit 770. As shown in FIG. 18, the insulation rear plate 280 may have an approximately rectangular plate shape, and may include a camera avoidance hole 288 preventing interference between the insulation rear plate 280 and the camera module 730.

The high voltage transformer 771 may be fixed to a rear surface 281*a* of the insulation rear plate 280, and the high voltage capacitor 773 may be mounted on the rear surface 281*a* of the insulation rear plate 280 by a separate capacitor bracket 774. In the embodiment, the high voltage transformer 771 may be arranged at a right side portion based on the center of the insulation rear plate 280. Specifically, as shown in FIG. 10, the high voltage transformer 771 may be arranged at a lower portion of the second cooling fan module 850.

As shown in FIG. 32, the lighting fixture 790 may be arranged on the inner upper plate 160. The lighting fixture 790 may be mounted on the lighting mounting part 165 of the inner upper plate 160 through the lighting through portion 273 of the insulation upper plate 270. The lighting mounting part 165 may be formed in an inclined direction, and a lighting hole 165*a* may be provided at a center portion of the lighting mounting part 165. Light emitted from a light source of the lighting fixture 790 may pass through lighting hole 165*a* to the cavity S.

The lighting fixture 790 may include a lighting housing 791 and a lighting substrate 795. The lighting housing 791 may include a lighting hook 793 to fix the lighting substrate 795. In the embodiment, the lighting fixture 790 may be directly mounted on the inner upper plate 160 without a separate insulation cover.

As shown in FIG. 2, the cooking appliance may include the cooling fan module 810, 850. The cooling fan module 810, 850 may cool the cooking appliance, suction external air and supply the air into the cavity S. The cooling fan module 810, 850 may suction air outside the cooking appliance and discharge air cooling the inside space of the cooking appliance to the outside space. In the embodiment, the cooling fan module 810, 850 may include the first cooling fan module 810 and the second cooling fan module 850. Both the first cooling fan module 810 and the second cooling fan module 850 may be arranged at positions closer to an upper portion of the cavity S than a lower portion thereof.

Both the first cooling fan module 810 and the second cooling fan module 850 may be arranged on the insulation upper plate 270. Herein, the first cooling fan module 810 and the second cooling fan module 850 may be arranged around the third heat source module 600 with the third heat source module 600 as the center. The cooling fan modules 810 and 850 arranged as described above may cool the third heat source module 600 in various directions.

Figure 9:
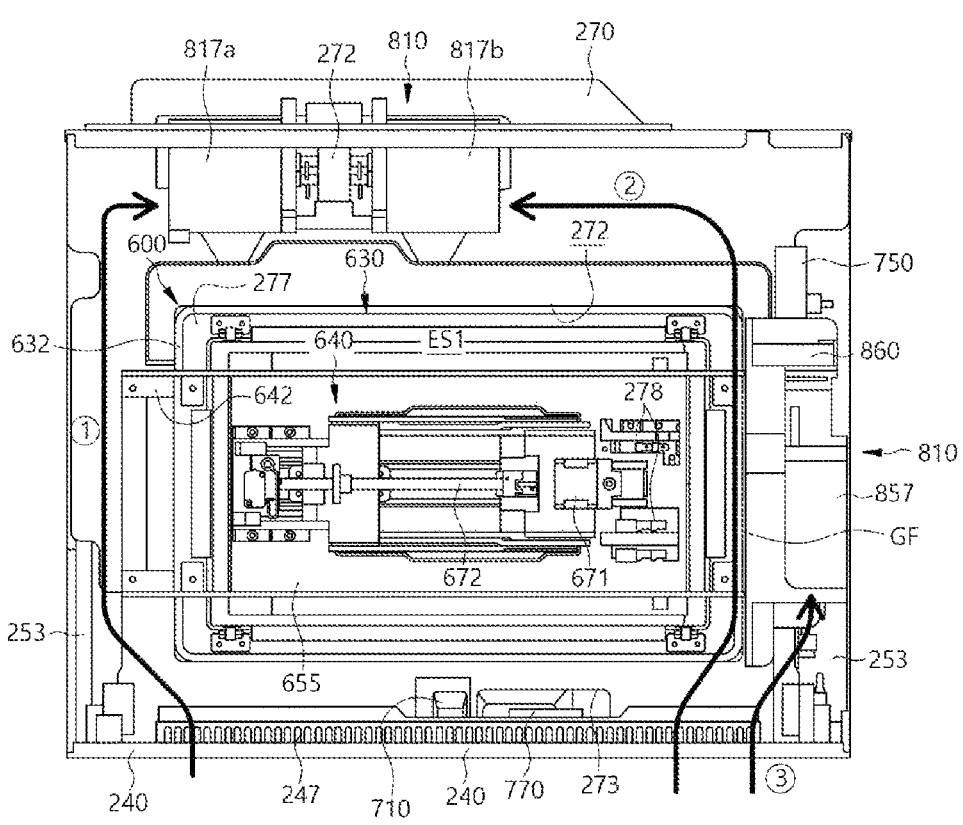
FIG. 9 is a plan view showing the cooking appliance according to the embodiment of the present disclosure without the door and a part of the outer casing among the components constituting the cooking appliance.

The first cooling fan module 810 and the second cooling fan module 850 may be arranged in a direction orthogonal to each other. The cooling fan modules 810 and 850 arranged as described above may form a continuous flow path through which air flows. Referring to FIG. 9, the second cooling fan module 850 may suction air from the front side of the cooking appliance (lower side in FIG. 9). A portion of the suctioned air may be transferred to the second cooling fan module 850 (arrow ③), and a portion of the suctioned air may be introduced toward the first cooling fan module 810 (arrow ②). In other words, the second cooling fan module 850 may guide the external air to be suctioned toward the first cooling fan module 810.

Furthermore, the first cooling fan module 810 and the second cooling fan module 850 may respectively discharge air toward different surfaces of the inner casing 100. The first cooling fan module 810 may discharge air toward a rear surface of the inner casing 100, more specifically, toward the third electric chamber ES3. The second cooling fan module 850 may discharge air toward a side surface of the inner casing 100, more specifically, toward the fifth electric chamber ES5. The air may meet the second electric chamber ES2 and then be discharged to the outside space through the air outlet part 243.

FIG. 17 is a view showing the first cooling fan module 810 according to an embodiment of the present disclosure. The first cooling fan module 810 may be arranged on the insulation upper plate 270. The first cooling fan module 810 may be mounted to a fan plate 811. The fan plate 811 may be attached to the insulation upper plate 270, and the first cooling fan module 810 may be mounted to the fan plate 811. The fan plate 811 may be laminated on the insulation upper plate 270. The fan plate 811 may be omitted or may be provided integrally with the insulation upper plate 270.

Herein, the fan plate 811 may have a plate hole to allow air discharged from the first cooling fan module 810 to pass through the hole. The plate hole may be connected to the first through portion 278a provide at the insulation upper plate 270 and the second through portion 278b. For this structure, the plate hole may include a first plate hole 812a connected to the first through portion 278a and a second plate hole 812b connected to the second through portion 278b.

The fan plate 811 may include a first fan bracket 815. The first cooling fan module 810 may be mounted to the insulation upper plate 270 via the first fan bracket 815. In the embodiment, a pair of first fan brackets 815 may be arranged to be spaced apart from each other, and the pair of first fan brackets 815 may be respectively coupled to a first drive housing 817a and a second drive housing 817b.

Figure 12:
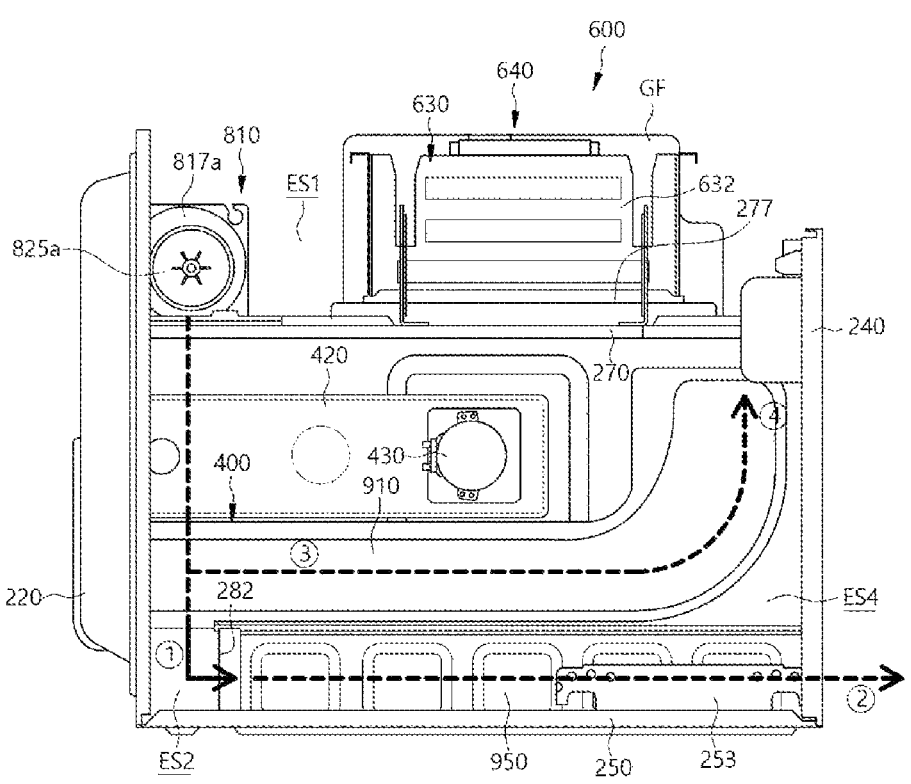
FIG. 12 is a left side view showing the cooking appliance according to the embodiment of the present disclosure without the door and a part of the outer casing among the components constituting the cooking appliance.

Any one of the pair of first fan brackets 815 may include a first fan motor 820. The first fan motor 820 may be connected to a shaft (not shown), and a pair of first fan blades 825a and 825b may be coupled to the shaft. The shaft may be extended in opposite sides from the first fan motor 820, and the pair of first fan blades 825a and 825b may be coupled to opposite portions of the shaft. FIG. 17 shows only the right first drive blade 825a among the pair of first fan blades 825a and 825b, and FIG. 12 showing the cooking appliance from the left shows the second drive blade 825b.

The pair of first fan blades 825a and 825b may discharge air in a downward direction, i.e., in a direction of gravity. As shown in FIG. 10, two air streams may be discharged downward from the first cooling fan module 810. The two air streams may be respectively discharged toward the third electric chamber ES3. The third electric chamber ES3 may accommodate the high voltage transformer 771 of the power supply unit 770 and the magnetron 410 of the first heat source module 400. Therefore, the high voltage transformer 771 and the magnetron 410 may be cooled by the first cooling fan module 810.

Specifically, the magnetron 410 constituting the first heat source module 400 may be arranged below the first drive housing 817a, and the high voltage transformer 771 constituting the power supply unit 770 may be arranged below the second drive housing 817b. Therefore, the first cooling fan module 810 may cool both the power supply unit 770 and the first heat source module 400.

Furthermore, air discharged from the first cooling fan module 810 may pass through the third electric chamber ES3, and move downward and then be introduced into the second electric chamber ES2. In FIG. 12, air discharged from the first cooling fan module 810 may move downward (direction of arrow ①) and then move forward (direction of arrow ②). In this process, the second heat source module 500 may be cooled together.

Figure 44:
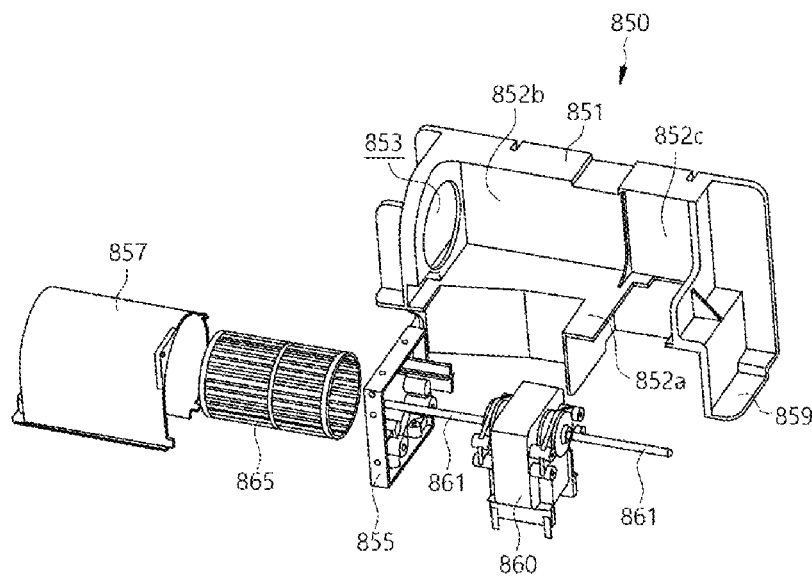
FIG. 44 is an exploded-perspective view showing components of a second cooling fan module of the cooking appliance according to the embodiment of the present disclosure.

Next, FIG. 44 is a view showing the second cooling fan module 850 according to an embodiment of the present disclosure. The second cooling fan module 850 may cool the cooking appliance like the first cooling fan module 810, and may efficiently supply external air into the cavity S. In the structure of the second cooling fan module 850, the second cooling fan module 850 may include a second fan casing 852 forming a frame, a second fan bracket 855 mounted to the second fan casing 852, and a second fan motor 860.

Referring to FIG. 5, the second fan casing 852 may be mounted to the insulation upper plate 270. Herein, a separate guide fence GF may be vertically provided on the insulation upper plate 270, and the second fan casing 852 may be mounted to the guide fence GF. The guide fence GF may have an approximately plate shaped structure. The guide fence GF may be arranged in a longitudinal direction, i.e., a depth direction of the cavity S.

Herein, the guide fence GF may guide a flow of air introduced into the upper portion of the cooking appliance, i.e., into the first electric chamber ES1. As shown in FIG. 9, an air flow path may be provided between the heater housing 632 and the guide fence GF. When the first cooling fan module 810 is operated, air may be introduced toward the first cooling fan module 810 (in direction of arrow ②) through the air flow path.

In other words, the guide fence GF to which the second cooling fan module 850 is mounted may provide a separate air flow path partitioned from the air flow path suctioned toward the second cooling fan module 850 (direction of arrow ①). Air suctioned toward the first cooling fan module 810 (direction of arrow ②) may cool the third heat source module 600 in the suctioning process.

Herein, when the third heat source module 600 is in the first location (referring to FIG. 29), both the first cooling fan module 810 and the second cooling fan module 850 may cool the periphery of the heater housing 632. When the third heat source module 600 is in the second location (referring to FIG. 30), both the first cooling fan module 810 and the second cooling fan module 850 may cool the third heat source module 600 throughout while passing through an upper portion of the third heat source module 600.

As shown in FIG. 44, the second fan casing 852 may include a bracket mounting portion 852*a* to which the second fan bracket 855 is mounted. Based on the bracket mounting portion 852*a*, a housing mounting portion 852*b* at which a second fan housing 857 is arranged is arranged at one portion, and a motor mounting portion 852*c* to which the second fan motor 860 is mounted may be arranged at the opposite portion. The second fan housing 857 may be arranged closer to the door 300 than the second fan motor 860. Reference numeral 859 represents a coupling portion to allow the second fan casing 852 to be fixed to the insulation upper plate 270.

Herein, the bracket mounting portion 852*a*, the housing mounting portion 852*b*, and the motor mounting portion 852*c* may be provided above a lower end of the second fan casing 852. Accordingly, both the second fan motor 860 and a second fan blade 865 may be arranged above the lower end of the second fan casing 852. Both the second fan motor 860 and the second fan blade 865 may be spaced apart from the insulation upper plate 270. As described above, when the second fan blade 865 is spaced apart from the insulation upper plate 270, the intake performance of the second fan blade 865 may be improved.

A shaft 861 is connected to the second fan motor 860, and the shaft 861 may be connected to the second fan blade 865. Herein, the second fan blade 865 may be stored inside the second fan housing 857, and air may be introduced through an opening of the second fan housing 857. The second fan blade 865 may discharge air toward a portion, which is open downward, of the second fan housing 857. In the embodiment, the shaft 861 may be connected only to one second fan blade 865, but second fan blades 865 may be respectively connected to opposite portions of the shaft 861.

As shown in FIG. 6, air is circulated by the second cooling fan module 850. As shown in the drawing, air discharged downward (direction of arrow ④) from the second cooling fan module 850 may cool the main controller 700 by passing through the main controller 700 arranged in the fourth electric chamber ES4. Air flowing further downward may be then introduced into the second electric chamber ES2, and flowing forward (direction of arrow ⑤) to the door 300 to be discharged through the air outlet part 243 of the outer front plate 240. In this process, the second heat source module 500 may be cooled together.

Referring to FIGS. 4 and 12, the supply duct 910 may be arranged in the inner casing 100. The supply duct 910 may be provided to cover the inlet port 123 of the inner casing 100. The supply duct 910 may provide a path through which air of the electric chamber may be introduced into the cavity S. Air introduced into the cavity S through the supply duct 910 and the inlet port 123 may remove moisture in the cavity S. Herein, air supplied through the inlet port 123 may be a part of air acting heat dissipation (cooling) while passing through the inside space of the casing 100, 200.

As shown in FIG. 12, the supply duct 910 may be extended in a shape of which a first end is bent. This shape is for the supply duct 910 to avoid interference with the wave guide 420 of the first heat source module 400. In other words, the supply duct 910 may be arranged at one of the pair of inner side plates 110 of the inner casing 100 with the wave guide 420, and the supply duct 910 may be arranged at a different height from the wave guide 420.

The first end of the supply duct 910 may cover the inlet port 123, and a remaining portion of the supply duct 910 may provide a flow path in the cooking appliance while being in close contact with an outer surface of the inner side plate 110. This supply duct 910 may transfer air discharged from the first cooling fan module 810 to the inlet port 123, so that air supply into the cavity S may be efficiently performed.

A duct assembly 920 may be provided at a second end of the supply duct 910. The duct assembly 920 may be an opening and closing device to block air inflow. As shown in FIG. 10, the duct assembly 920 may be arranged in the third electric chamber ES3. Specifically, the duct assembly 920 may be arranged at a lower portion of the first drive housing 817*a* of the first cooling fan module 810. Therefore, air discharged from the first drive housing 817*a* may be transferred to the duct assembly 920.

The duct assembly 920 may connect or block the supply duct 910 to or from the third electric chamber ES3. In other words, the duct assembly 920 may selectively supply air into the cavity S via the supply duct 910. For this operation, the duct assembly 920 may include a duct motor 930, and operation of the duct motor 930 may be controlled by the main controller 700.

Figure 45:
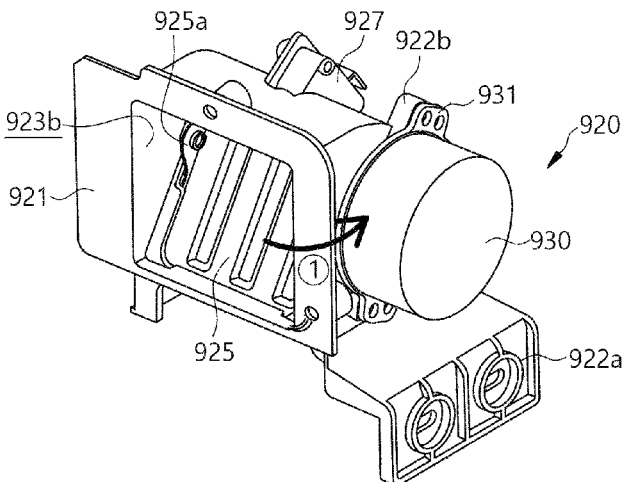
FIG. 45 is a perspective view showing the structure of a duct module of the cooking appliance according to the embodiment of the present disclosure.
Figure 46:
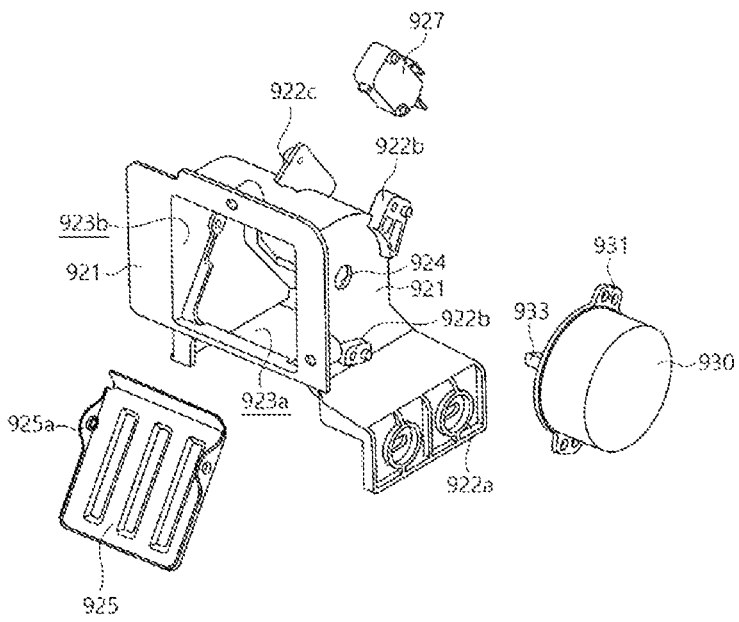
FIG. 46 is an exploded-perspective view showing components of the duct module of the cooking appliance according to the embodiment of the present disclosure.

FIGS. 45 and 46 are views showing the duct assembly 920 according to an embodiment of the present disclosure. For example, the duct assembly 920 may include a duct housing 921, a duct blade 925 rotatably coupled to the duct housing 921, and the duct motor 930 rotating the duct blade 925. The duct housing 921 may include a duct bracket 922*a* that may fix the duct assembly 920 to the casing 100, 200 or the insulation rear plate 280.

The duct blade 925 may be assembled to an operation space 923*b* (referring to FIG. 46) of the duct housing 921. The duct blade 925 may open and close an entrance 923*a* of the duct housing 921 by rotation thereof. The duct blade 925 may open the entrance 923*a* of the duct housing 921 while being rotated in an inward direction of the duct housing 921 (direction of arrow in FIG. 45). Reference numeral 925*a* represents a hinge portion coupled to a shaft of the duct blade 925.

The duct housing 921 may include a duct switch 927. The duct switch 927 may be mounted to a switch piece 922*c* of the duct housing 921. The duct switch 927 may be turned into the ON state by being pressed in the process where the duct blade 925 is rotated. When the duct switch 927 is in the ON state, the main controller 700 may detect that the duct blade 925 is completely opened.

The duct motor 930 may be arranged at a motor mounting piece 922*b* of the duct housing 921. The duct motor 930 may supply a rotation force to the duct blade 925. The duct motor 930 may be arranged on a surface of the duct housing 921, and a shaft 933 of the duct motor 930 may be connected to the hinge portion 925*a* of the duct blade 925. Reference numeral 931 represents a fixed piece of the duct motor 930 coupled to the motor mounting piece 922*b*.

Meanwhile, referring to FIG. 5, the exhaust duct 940 may be arranged in the fifth electric chamber ES5. The exhaust duct 940 may cover the outlet port 125 of the inner casing 100. The exhaust duct 940 may be arranged in the fifth electric chamber ES5, and may guide movement of air discharged from the outlet port 125. The exhaust duct 940 may be arranged on a surface of one of the inner side plates 110. Accordingly, air in the cavity S discharged to the outlet port 125 may move downward. The air moving downward may be guided to the second electric chamber ES2, and may be discharged to the air outlet part 243 of the outer front plate 240.

Figure 11:
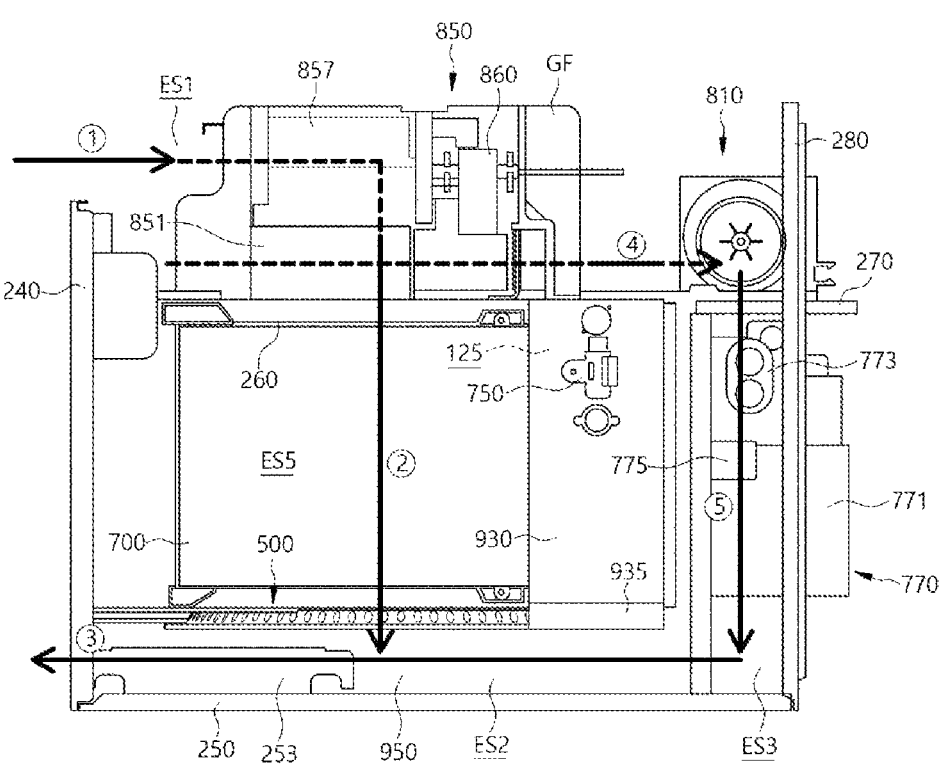
FIG. 11 is a right side view showing the cooking appliance according to the embodiment of the present disclosure without the door and a part of the outer casing among the components constituting the cooking appliance.

As shown in FIG. 11, the exhaust duct 940 may be arranged on one of the inner side plate 110 of the inner casing 100 with the main controller 700. In other words, the exhaust duct 940 may be arranged on the surface of the inner side plate 110 together with the main controller 700. Herein, the exhaust duct 940 may be arranged at a position farther from the door 300 than the main controller 700. Therefore, air in the cavity S may be discharged from a rear portion of the casing 100, 200 farther from the door 300, and in a process in which air is discharged along the second electric chamber ES2, air may pass through a lower portion of the second heat source module 500, so that the second heat source module 500 may be cooled by the air.

Figure 43:
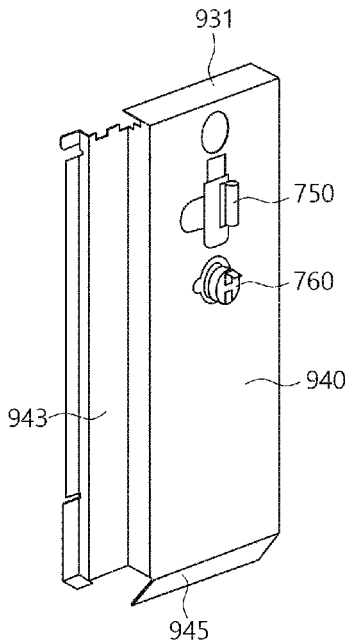
FIG. 43 is a perspective view showing the configuration of an exhaust duct, a humidity sensor arranged at the exhaust duct, and a temperature sensor of the cooking appliance according to the embodiment of the present disclosure.

FIG. 43 is a view showing the structure of the exhaust duct 940 in detail. As shown in the drawing, the exhaust duct 940 may have an approximately vertically long shape. A prevention portion 941 may be provided along an edge of the exhaust duct 940 to prevent leakage of air. A step portion 943 may be provided at one portion of the exhaust duct 940 with a relatively less thickness, and a portion of the main controller 700 may be provided at the step portion 943. Furthermore, in the embodiment, as described above, the second temperature sensor 760 and the humidity sensing module 750 may be arranged on the exhaust duct 940.

A guide blade 945 may be provided at a lower end of the exhaust duct 940. The guide blade 945 may be extended in a downward inclined direction unlike the prevention portion 941. Accordingly, the guide blade 945 may serve as an outlet through which air is discharged. The guide blade 945 may be extended toward the second electric chamber ES2, thereby discharging air in the exhaust duct 940 to the second electric chamber ES2.

As shown in FIGS. 4 and 6, an air barrier 950 may be arranged between the outer front plate 240 and the insulation rear plate 280. The air barrier 950 may prevent or substantially prevent air discharged by the first cooling fan module 810 and the second cooling fan module 850 from being re-suctioned into the first cooling fan module 810 or the second cooling fan module 850. In other words, the air barrier 950 may prevent air, which is discharged from the first cooling fan module 810 and the second cooling fan module 850 and is introduced into the second electric chamber ES2 through the third electric chamber ES3 and the fifth electric chamber ES5, from being transferred to the fourth electric chamber ES4.

As shown in FIG. 6, air discharged toward the third electric chamber ES3 (direction of arrow ①, ②) may be transferred to the second electric chamber ES2 by the first cooling fan module 810. Herein, the air barrier 950 arranged at the left side in the drawing may prevent air discharged from the first cooling fan module 810 from passing over the air barrier 950 to the fourth electric chamber ES4. Accordingly, air discharged from the first cooling fan module 810 may move forward (direction of arrow ⑤) to be discharged outward via an air outlet provided in the outer front plate 240.

Furthermore, air discharged downward through the exhaust duct 940 (direction of arrow ③), and air discharged toward the fifth electric chamber ES5 (direction of arrow ④) by the second cooling fan module 850 may be transferred to the second electric chamber ES2. Herein, the air barrier 950 at the left side may prevent the air discharged from the exhaust duct 940 and the second cooling fan module 850 from moving over the air barrier 950 to the fourth electric chamber ES4. Accordingly, the air discharged from the exhaust duct 940 and the second cooling fan module 850 may move forward (direction of arrow ⑤) and may be discharged to the outside space through the air outlet provided in the outer front plate 240.

In order to control the flow of air, the air barrier 950 may be arranged to cross between the outer front plate 240 and the insulation rear plate 280. Furthermore, the air barrier 950 may connect the outer front plate 240 to the insulation rear plate 280, and support the lower portion of the casing 100, 200 and reinforce the strength of the entire casing 100, 200.

FIGS. 5 to 13 are views showing an air circulation structure in the cooking appliance according to an embodiment of the present disclosure. The cooking appliance of the embodiment may include the first heat source module 400, the second heat source module 500, and the third heat source module 600, so that heat generated from the heat sources may need to be efficiently cooled. Hereinbelow, a cooling structure of the heat sources and other parts will be described.

First, as parts required to be cooled in the embodiment: (i) in the first electric chamber ES1, the lighting fixture 790, cooling of the distance sensor 710, the third heat source module 600, and the third temperature sensor (not shown) may be required; (ii) in the second electric chamber ES2, cooling of the second heat source module 500 may be required; (iii) in the third electric chamber ES3, cooling of the power supply unit 770 and the camera module 730 may be required and (iv) in the fifth electric chamber ES5, the main controller 700, the humidity sensing module 750, the second temperature sensor 760, and the temperature block switch (not shown) may be required.

In order to perform the cooling of the parts, the embodiment may include the first cooling fan module 810 and the second cooling fan module 850 described above. The first cooling fan module 810 may cool the second electric chamber ES2 and the third electric chamber ES3, and the second cooling fan module 850 may cool the first electric chamber ES1, the second electric chamber ES2, and the fifth electric chamber ES5. It is understood that the first cooling fan module 810 may also be arranged at the upper portion of the casing 100, 200, thereby cooling a part of the first electric chamber ES1. Furthermore, the first cooling fan module 810 may discharge air toward the duct assembly 920 arranged at the third electric chamber ES3, so that the first cooling fan module 810 may serve to supply the air into the cavity S.

Specifically, as shown in FIG. 5, in the embodiment, both the air inlet part 242 through which external air is suctioned and the air outlet part 243 through which air is discharged may be arranged at a front surface of the cooking appliance. The external air may be introduced into an upper portion of the front surface of the cooking appliance and circulate in the cooking appliance and then be discharged through a lower portion of the front surface of the cooking appliance Therefore, in the embodiment, even when the cooking appliance is installed in a built-in manner, efficient air circulation may be performed.

Furthermore, as shown in FIGS. 5 and 6, the plurality of electric chambers may be provided outside the inner casing 100, and air may efficiently cool the parts while flowing through the electric chambers. Herein, the air barrier 950 may prevent air introduced into the second electric chamber ES2 from moving upward through the fourth electric chamber ES4, and therefore, the air may cool the second heat source module 500 of the second electric chamber ES2 and then move forward to flow through the air outlet part 243.

The insulation upper plate 270 and the insulation rear plate 280 may be arranged outside the inner casing 100 and may prevent heat in the cavity S from being directly transferred to the parts. The insulation upper plate 270 and the insulation rear plate 280 may perform the cooling performance of the cooking appliance together with the first cooling fan module 810 and the second cooling fan module 850.

As shown in FIG. 5, the first cooling fan module 810 may be arranged at the insulation upper plate 270, more specifically, at a position closer to the third electric chamber ES3 and the fourth electric chamber ES4 (left side in the drawing) based on a center portion of the insulation upper plate 270. The second cooling fan module 850 may also be arranged at the insulation upper plate 270, more specifically, at a position closer to the fifth electric chamber ES5 based on a center portion of the insulation upper plate 270.

As shown in FIG. 9, flows of air suctioned by the first cooling fan module 810 and the second cooling fan module 850 are represented. Air suctioned through the outer front plate 240 may be introduced into the first cooling fan module 810. Herein, the first cooling fan module 810 may include the first drive housing 817a and the second drive housing 817b, so that air may be introduced in two streams. Herein, air introduced along the left side (direction of arrow ①) of the cooking appliance by the first drive housing 817a may flow along a gap between the heater housing 632 of the third heat source module 600 and the outer upper plate 230 (which is omitted in FIG. 9) arranged at a left edge of the casing 100, 200. Air introduced along the right side (direction of arrow ②) of the cooking appliance by the second drive housing 817b may flow along a gap between the heater housing 632 of the third heat source module 600 and the guide fence GF. In this process, the distance sensor 710, the lighting fixture 790, and the third heat source module 600 may be cooled.

At the same time, the second cooling fan module 850 may also suction external air through the outer front plate 240. Air introduced toward the second cooling fan module 850 (direction of arrow ③) may cool the first electric chamber ES1 while flowing toward the second cooling fan module 850.

The air suctioned by the first cooling fan module 810 and the second cooling fan module 850 may then flow to the lower portion of the cooking appliance. Referring to FIG. 6, the air suctioned by the first cooling fan module 810 may be discharged downward, i.e., toward the third electric chamber ES3 (direction of arrow ①, ②). In this process, the power supply unit 770 may be cooled. Specifically, the high voltage transformer 771 generating high temperature heat may be arranged below the second drive housing 817b of the first cooling fan module 810, so that the high voltage transformer 771 may be efficiently cooled.

Air passing through the third electric chamber ES3 may be introduced into the second electric chamber ES2 through the ventilation part 283 provided at the lower portion of the insulation rear plate 280. Air cooling the second heat source module 500 in the second electric chamber ES2 may be discharged to the outside space (direction of arrow ⑤) through the air outlet part 243.

Meanwhile, air suctioned by the second cooling fan module 850 may also be discharged downward, i.e., toward the fifth electric chamber ES5 (direction of arrow ④ in FIG. 6). In this process, the main controller 700 and the humidity sensing module 750 arranged at the exhaust duct 940, and the second temperature sensor 760 may be cooled. Specifically, the main controller 700 generating high temperature heat may be arranged below the second fan blade 865, so that the main controller 700 may be efficiently cooled.

Next, air passing through the fifth electric chamber ES5 may be introduced into the second electric chamber ES2. Air cooling the second heat source module 500 in the second electric chamber ES2 may flow forward (direction of arrow ⑤), and as a result, the air may be discharged to the outside space (direction of arrow ⑤) through the air outlet part 243.

As shown in FIG. 6, air may also be transferred toward the second electric chamber ES2 through the exhaust duct 940. The exhaust duct 940 may guide air, which is discharged from the cavity S, downward (direction of arrow ③) to transfer the air to the second electric chamber ES2. The air discharged from the cavity S may also be discharged to the outside space (direction of arrow ⑤) through the air outlet part 243.

Figure 13:
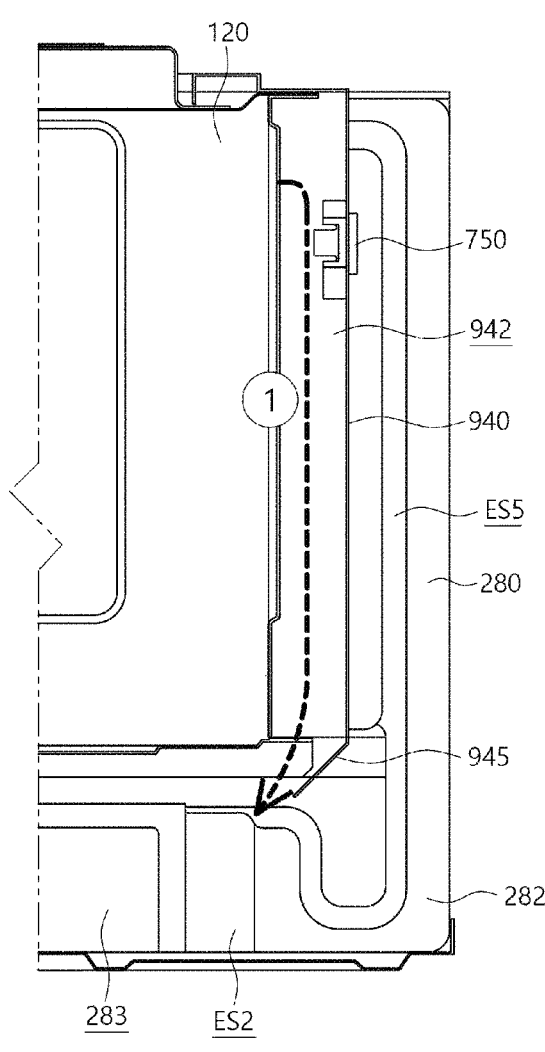
FIG. 13 is a front view showing an exhaust duct constituting the cooking appliance according to the embodiment of the present disclosure mounted to an inner casing.

Referring to FIG. 13, a duct flow path 942 may be provided inside the exhaust duct 940, and air may flow downward (direction of arrow ①) along the duct flow path 942. Air may then be introduced into the second electric chamber ES2 through the guide blade 945 provided in a lower portion of the exhaust duct 940.

As shown in FIG. 10, the magnetron 410 constituting the first heat source module 400 may be arranged below the first drive housing 817a of the first cooling fan module 810. Therefore, air discharged downward (direction of arrow ②) from the first drive housing 817a may cool the magnetron 410 while flowing. As described above, the high voltage transformer 771 arranged below the second drive housing 817b may be cooled as air discharged downward (direction of arrow ①) from the first drive housing 817a flows.

Referring to FIG. 11, the second cooling fan module 850 may suction external air (direction of arrow ①). The second cooling fan module 850 may then discharge air downward (direction of arrow ②) to the fifth electric chamber ES5. Air cooling the main controller 700 arranged in the fifth electric chamber ES5 may be introduced into the second electric chamber ES2 and then flows forward (direction of arrow ③) to be discharged.

Air introduced through the first cooling fan module 810 may then be introduced the rear side of the guide fence GF (direction of arrow ④), and the first cooling fan module 810 may discharge air downward (direction of arrow ⑤) to the third electric chamber ES3. Air cooling the power supply unit 770 arranged in the third electric chamber ES3 may be introduced into the second electric chamber ES2 and then flow forward (direction of arrow ③) to be discharged.

Herein, the air introduced into the second electric chamber ES2 by the first cooling fan module 810 and the second cooling fan module 850 may flow only forward, and may not be re-introduced into the fourth electric chamber ES4. This is because the air barrier 950 may be arranged below the fourth electric chamber ES4. As shown in FIGS. 6 and 11, the air barrier 950 may guide air forward.

FIG. 12 is a view showing the fourth electric chamber ES4. As shown in the drawing, the wave guide 420 constituting the first heat source module 400 and the supply duct 910 may be arranged in the fourth electric chamber ES4. Air discharged to the lower side of the first drive housing 817a (arrow ①) may be introduced into the supply duct 910. Herein, although not shown in FIG. 12, when the duct assembly 920 provided in the supply duct 910 is opened, the air discharged from the first cooling fan module 810 may be introduced into the supply duct 910 through the duct assembly 920. The air flowing forward (direction of arrow ③) along the supply duct 910 may be introduced into the cavity S through the inlet port 123 (referring to FIG. 7). Arrow ④ represents a moving direction of air introduced into the cavity S. In FIG. 12, arrow ② represents a direction in which air discharged from the first cooling fan module 810 and introduced into the second electric chamber ES2 flows along the opposite portion of the air barrier 950.

Next, a method for controlling the cooking appliance in the embodiment will be described. First, a cooking level may be input via the display module 350. The cooking level may be input directly by the user, or may be automatically selected by the main controller 700 on the basis of an image of food filmed by the camera module 730 or the height of the food measured by the distance sensor 710.

When the cooking level is input, in response to the input cooking level, the main controller 700 may select operation modes of the first heat source module 400, the second heat source module 500, and the third heat source module 600, respectively. Herein, the operation modes of the first heat source module 400, the second heat source module 500, and the third heat source module 600 may be differently set, and some or all the first heat source module 400, the second heat source module 500, and the third heat source module 600 may be operated at the same time.

The operation mode of the first heat source module 400 may be set such that a value of multiplying the input cooking level of the first heat source module 400 and a preset reference time is set as a cooking time of the first heat source module 400. For example, in a case in which the reference time is 3 seconds, when the cooking level of the first heat source module 400 is input as 10, the first heat source module 400 may be operated for 30 seconds (10*3). Herein, an additional time may be added to the operation time of the first heat source module 400. For example, when 2 seconds are added, the first heat source module 400 may be operated for total 32 seconds.

The operation mode of the second heat source module 500 may be configured such that drive power thereof is adjusted in response to the input second heat source module 500. The main controller 700 may control the drive power of the second heat source module 500 by the inverter control. The second heat source module 500 may be operated by the selected drive power for the preset cooking time. For example, when the preset cooking time is 12 seconds and the input cooking level is 10, the second heat source module 500 may be operated by heating power of 1600 W for 12 seconds.

Meanwhile, the operation mode of the third heat source module 600 is configured such that a value obtained by multiplying the input cooking level of the third heat source module 600 and the preset reference time may be set as the cooking time of the third heat source module 600. For example, in a case in which the reference time is 10 seconds, when the cooking level of the third heat source module 600 is input as 10, the third heat source module 600 may be operated for 100 seconds (10*10). Herein, the heating power of the third heat source module 600 may be 1600 W, and the operation mode of the third heat source module 600 may be selected by controlling the number of the driven heating units 610.

As described above, in the embodiment, in the case of the first heat source module 400 and the third heat source module 600, the operation mode may be selected by adjusting the cooking time. In the case of the second heat source module 500, the operation mode may be selected by adjusting the drive power through the inverter control.

Herein, the third heat source module 600 may move toward the bottom surface of the cavity S, the cooking level of the third heat source module 600 may be selected by operating some or all of the plurality of heating units 610 included in the third heat source module 600, or by adjusting positions of the heating units 610.

Meanwhile, the first heat source module 400 may be operated only when the third heat source module 600 is in the first location farthest from the bottom surface of the cavity S. This operation is because microwaves generated by the magnetron 410 do not interfere with the third heat source module 600.

FIGS. 47 to 52 are views showing a cooking appliance according to another embodiment of the present disclosure. In FIGS. 47 to 52, in addition to the first heat source module 400 to the third heat source module 600 described above, a fourth heat source module 1100 may be included in the cooking appliance. The fourth heat source module 1100 may be arranged at a rear surface of the casing 100, 200. A power supply unit 1770 may be arranged on an upper surface of the casing 100, 200, not the rear surface of the casing 100, 200. Hereinbelow, the same reference numerals are given to the same structures as in the previous embodiment, detailed descriptions are omitted, and a structure different from the previous embodiment will be described.

Figure 47:
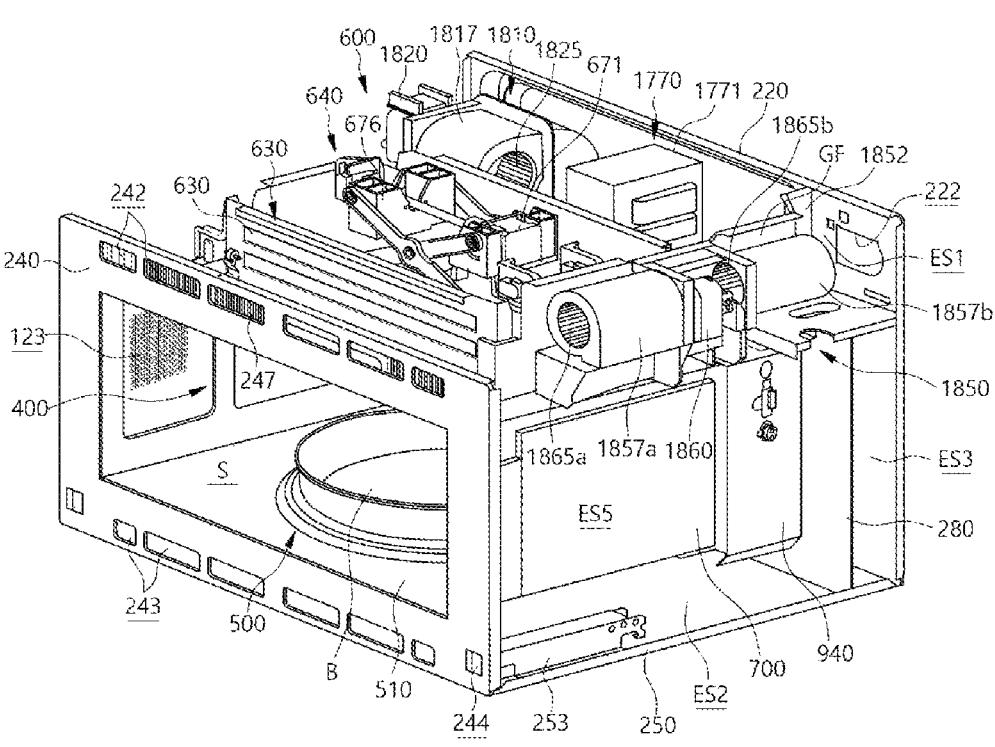
FIG. 47 is a perspective view showing a cooking appliance according to a second embodiment of the present disclosure.
Figure 48:
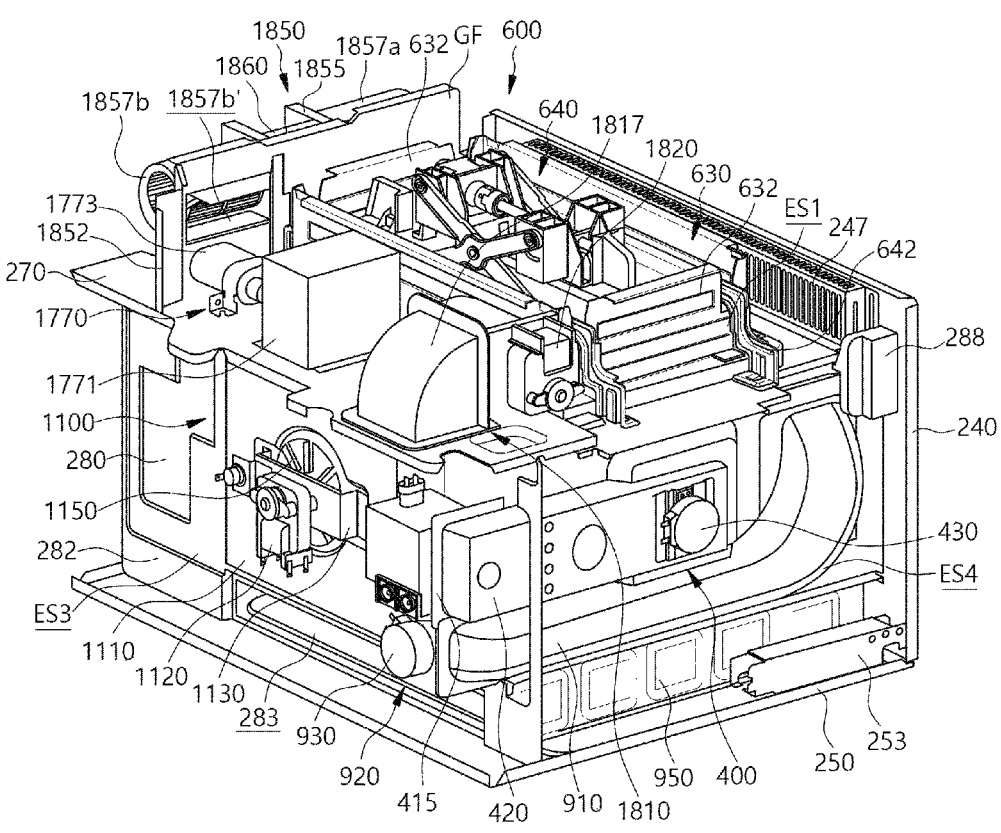
FIG. 48 is a perspective view taken at a different angle from FIG. 47, which shows the second embodiment shown in FIG. 47.

As shown in FIGS. 47 and 48, the power supply unit 1770 may be arranged on the insulation upper plate 270. The power supply unit 1770 may include a high voltage transformer 1771, and the high voltage transformer 1771 may have relatively large volume and generate high temperature heat. Accordingly, it is important to efficiently cool the high voltage transformer 1771.

For reference, in FIG. 47, the outer rear plate 220 is shown, but in FIG. 48, the outer rear plate 220 is omitted. In FIG. 47, the fourth heat source module 1100 may be arranged in the third electric chamber ES3 provided between the outer rear plate 220 and the insulation rear plate 280. As shown in FIG. 48, the fourth heat source module 1100 may be provided at the insulation rear plate 280 arranged in front of the outer rear plate 220. The fourth heat source module 1100 may be a convection heater. In other words, the fourth heat source module 1100 may provide heat for convection-heating of food in the cavity S.

As described above, in the embodiment, the first heat source module 400, the second heat source module 500, the third heat source module 600, and the fourth heat source module 1100 may be arranged in the electric chambers differently from each other in the casing 100, 200. In other words, the first heat source module 400, the second heat source module 500, the third heat source module 600, and the fourth heat source module 1100 may be arranged at different surfaces of the casing 100, 200 from each other. Furthermore, the plurality of heat sources may be composed of different types of heat sources. Accordingly, the plurality of heat sources may provide different types of heating means to the food from different directions.

The fourth heat source module 1100 may be a convection heater. The fourth heat source module 1100 may generate convection heat inside the cavity S together with a convection fan, thereby improving the uniformity of the food. Otherwise, the convection fan is omitted in the fourth heat source module 1100, and like the third heat source module 600, the fourth heat source module 1100 may provide the radiant heat to food by using a heating wire.

As shown in FIG. 48, the fourth heat source module 1100 include the convection housing 1110. The convection housing 1110 may be arranged at the insulation rear plate 280, a convection chamber may be provided inside the convection housing 1110, and a convection heater (not shown) may be arranged in the convection chamber. The convection heater may have a bar type having a predetermined length and a predetermined diameter. For example, the convection heater may be a sheath heater with a metal protection tube of the heating wire. Otherwise, the convection heater may be a carbon heater, a ceramic heater, and a halogen heater in which a filament is sealed inside a tube made of a transparent or translucent material.

A motor bracket 1130 may be arranged in the convection housing 1110, and a convection motor 1120 may be mounted to the motor bracket 1130. The convection motor 1120 may rotate the convection fan (not shown) in the convection housing 1110. When the convection fan is rotated by the convection motor 1120, heat of the convection heater may heat food while performing convection inside the cavity S. Reference numeral 1150 represents an outlet through which heat in the convection chamber is discharged to the outside space.

When operation of the fourth heat source module 1100 is input, power may be applied to the convection motor 1120 to rotate the convection fan, and power is applied to the convection heater to heat the convection heater. Therefore, the convection fan generates forced convection between the cavity S and the convection chamber in the convection housing 1110, and the forced convection by the convection fan becomes hot air by receiving heat from the convection heater, so that the temperature in the cavity S may be increased and food may be heated.

Although not shown in the drawings, the inner rear plate 120 of the inner casing 100 may have a convection supply portion that is open to allow heat of the convection heater to be discharged into the cavity S. Furthermore, the inner rear plate 120 may have a separate convection outlet (not shown) distinguish from the convection supply portion. Heat of the convection heater may be discharged through the convection supply portion and circulate in the cavity S, and then the heat may be discharged into the convection chamber again through the convection outlet.

Figure 49:
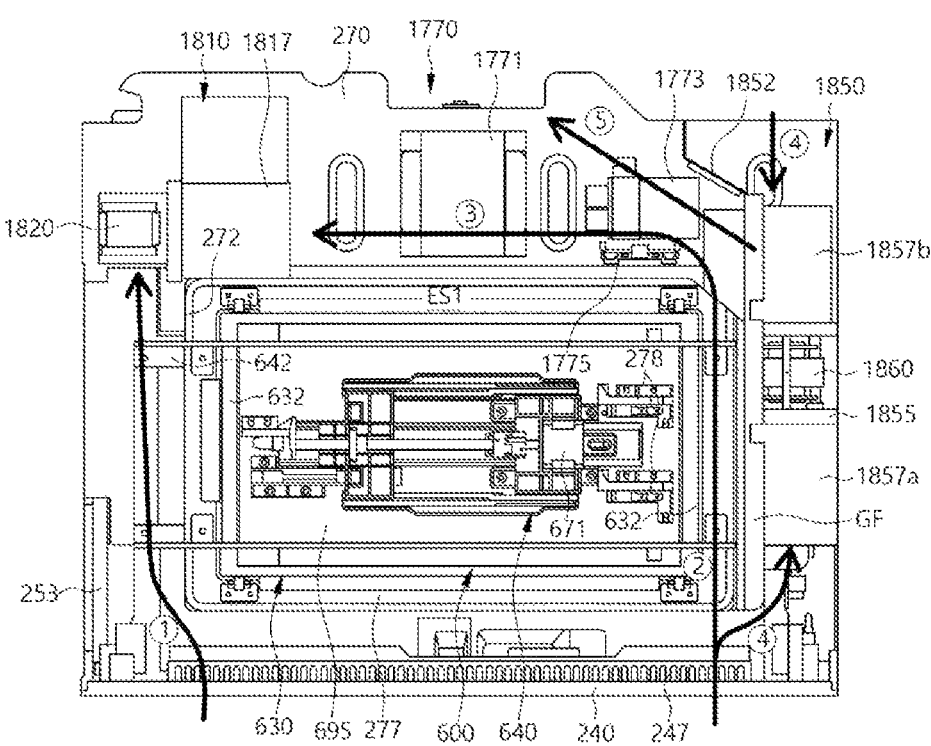
FIG. 49 is a plan view showing the structure of the second embodiment shown in FIG. 47.

Meanwhile, in the embodiment, the power supply unit 1770 may be arranged in the second electric chamber ES2, i.e., the upper side of the casing 100, 200. Specifically, the power supply unit 1770 may be arranged at the insulation upper plate 270. Since the fourth heat source module 1100 may be arranged at the third electric chamber ES3, the power supply unit 1770 may be arranged in the second electric chamber ES2 so as to avoid to be heated by the fourth heat source module 1100. As shown in FIGS. 48 and 49, the power supply unit 1770 may include the high voltage transformer 1771, the high voltage capacitor 773, and a fuse 1775.

Herein, the power supply unit 1770 may be arranged between a first cooling fan module 1810 and a second cooling fan module 1850. As shown in FIG. 49, the first cooling fan module 1810 may be arranged at the left side of the power supply unit 1770, and the second cooling fan module 1850 may be arranged at the right lower side of the power supply unit 1770. Accordingly, a portion of external air suctioned by the first cooling fan module 1810 may flow toward the first cooling fan module 1810 (direction of arrow ①) between the heater housing of the third heat source module 600 and a left end of the casing 100, 200, and another portion of the external air may flow toward the rear portion of the casing 100, 200 (direction of arrow ②) along a gap between the heater housing of the third heat source module 600 and the guide fence GF.

Since the power supply unit 1770 is arranged on the path through which air is suctioned toward the first cooling fan module 1810, the external air suctioned by the first cooling fan module 1810 may pass through the power supply unit 1770 (direction of arrow ③). Therefore, the power supply unit 1770 may be cooled.

Since the power supply unit 1770 is arranged above the insulation upper plate 270, high temperature heat in the cavity S may not be transferred to the power supply unit 1770 through the inner upper plate 160. Furthermore, (i) the power supply unit 1770 may be arranged at a different surface from the magnetron 410 of the first heat source module 400 arranged in the third electric chamber ES3 to be spaced apart from each other, (ii) the power supply unit 1770 may be spaced apart from the second heat source module 500 arranged at the bottom of the casing 100, 200, (iii) a gap between the power supply unit 1770 and the heating unit 610 of the third heat source module 600 is partitioned by the heater housing 632, and (iv) the power supply unit 1770 may be spaced apart from the fourth heat source module 1100 arranged in the third electric chamber ES3. Therefore, the power supply unit 1770 may be prevented from being heated by the heat source. Specifically, the main controller 700, which is another heating element, may be arranged in the fifth electric chamber ES5, so that heat generated from the main controller 700 does not affect directly to the power supply unit 1770.

In the embodiment, the first cooling fan module 1810 and the second cooling fan module 1850 may be included for cooling. Both the first cooling fan module 1810 and the second cooling fan module 1850 may be provided to cool the cooking appliance Among the cooling fan modules, the first cooling fan module 1810 may serve to introduce air into the cavity S.

FIG. 47 is a view showing the first cooling fan module 1810. The first cooling fan module 1810 may be arranged on the insulation upper plate 270. The first cooling fan module 1810 may include a first fan housing 1817. A first fan motor 1820 may be provided at one portion of the first fan housing 1817. The first fan motor 1820 may be connected to a shaft (not shown), and the shaft may be coupled to a first fan blade 1825.

Figure 50:
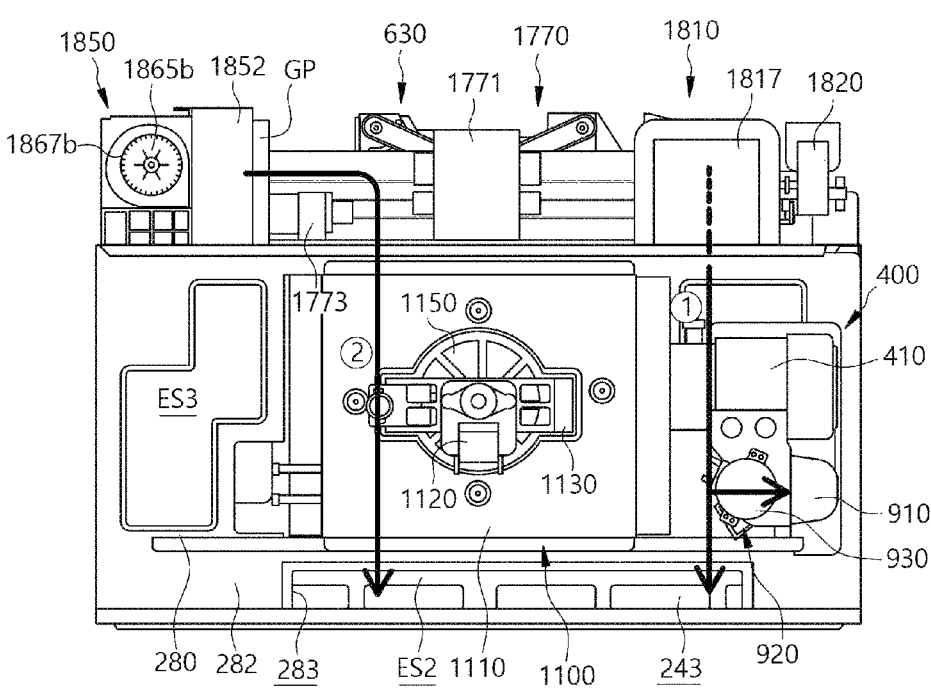
FIG. 50 is a rear view showing the structure of the second embodiment shown in FIG. 47.

The first fan blade 1825 may discharge air downward, i.e., a direction of gravity. As shown in FIG. 50, air is discharged downward from the first cooling fan module 1810. The discharged air may be discharged into the third electric chamber ES3. The fourth heat source module 1100 and the magnetron 410 of the first heat source module 400 are arranged in the third electric chamber ES3, so that the fourth heat source module 1100 and the magnetron 410 may be cooled by the first cooling fan module 1810.

Figure 51:
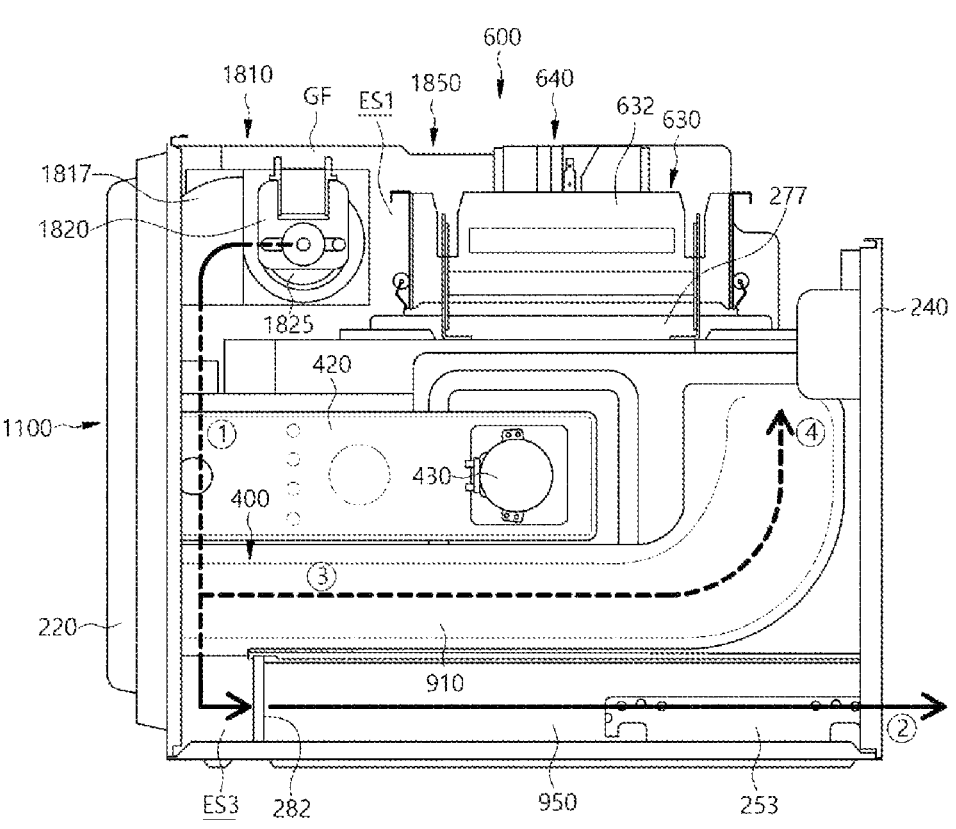
FIG. 51 is a left side view showing the structure of the second embodiment shown in FIG. 47.

Furthermore, air discharged from the first cooling fan module 1810 may pass through the third electric chamber ES3, and may flow downward to be introduced into the second electric chamber ES2. As shown in FIGS. 50 and 51, a part of the air discharged from the first cooling fan module 1810 may move forward to the door 300 (direction of arrow ③ in FIG. 51) along the supply duct 910, and may be guided toward the inside space of the cavity S (arrow ④).

As shown in FIG. 47, the second cooling fan module 1850 is shown in the view. The second cooling fan module 1850 may cool the cooking appliance like the first cooling fan module 1810, and may allow external air to be efficiently supplied into the cavity S. When showing a structure of the second cooling fan module 1850, the second cooling fan module 1850 may include a second fan housing 1857*a*, 1857*b* forming a frame and a second fan motor 1860 arranged at one portion of the second fan housing 1857*a*, 1857*b*.

The second fan housing 1857*a*, 1857*b* may include a first drive housing 1857*a* and a second drive housing 1857*b* respectively arranged at opposite sides. The second fan motor 1860 may be arranged between the first drive housing 1857*a* and the second drive housing 1857*b*. The second fan motor 1860 may be connected to a shaft (not shown), and the shaft may be coupled to a pair of second fan blades 1865*a* and 1865*b*. The shaft may be extended in opposite directions from the second fan motor 1860, and the pair of second fan blades 1865*a* and 1865*b* may be respectively coupled to opposite portions of the shaft.

Figure 52:
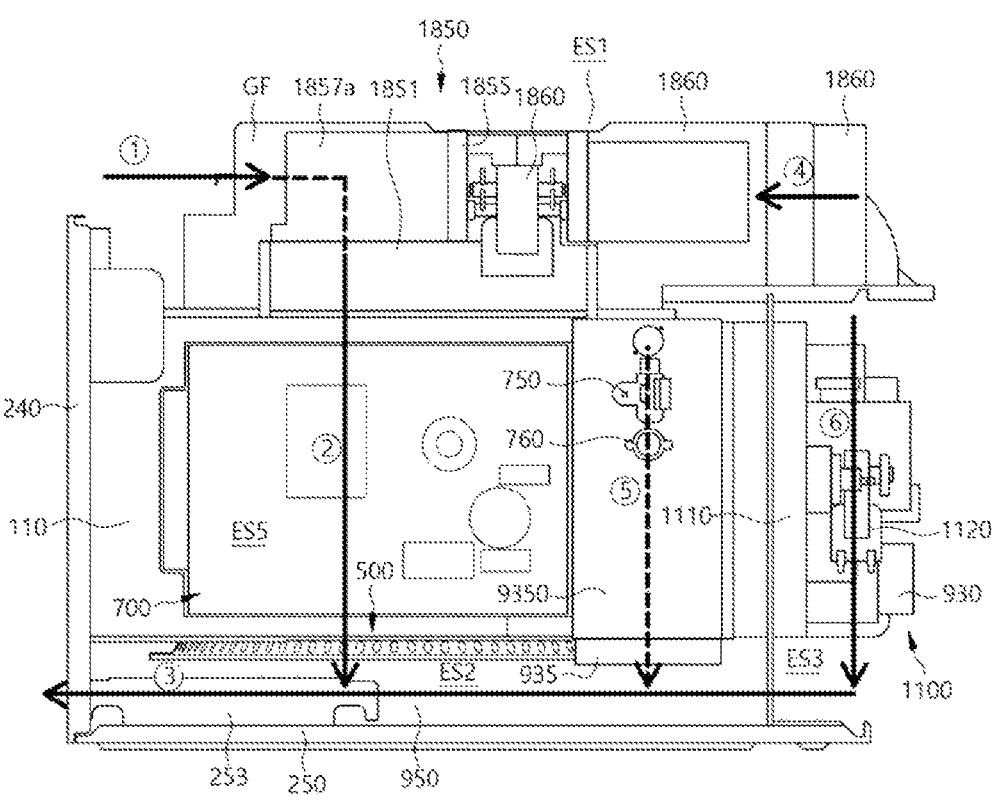
FIG. 52 is a right side view showing the structure of the second embodiment shown in FIG. 47.

Herein, the pair of second fan blades 1865*a* and 1865*b* may be respectively arranged in the first drive housing 1857*a* and the second drive housing 1857*b*. One 1865*a* of the pair of second fan blades 1865*a* and 1865*b* may discharge air in the direction of gravity, and the rest 1865*b* may discharge air in a direction perpendicular to the direction of gravity, i.e., a direction of the first electric chamber ES1. As shown in FIG. 52, the first drive housing 1857*a* may be open downward, so that the second fan blade 1865*a* provided in the first drive housing 1857*a* may discharge air downward (direction of arrow ②). Accordingly, the main controller 700 arranged in the fifth electric chamber ES5 may be cooled.

Meanwhile, referring to FIG. 48, an outlet 1857*b*' of the second drive housing 1857*b* may be open toward the first electric chamber ES1. Accordingly, the second fan blade 1865*b* arranged in the second drive housing 1857*b* may discharge air toward the first electric chamber ES1, more specifically, toward the power supply unit 1770 through the outlet 1857*b*' of the second drive housing 1857*b*. Accordingly, the second cooling fan module 1850 may cool the power supply unit 1770.

The air cooling the power supply unit 1770 may flow downward. As shown in FIG. 52, air is introduced into an inward direction (arrow ④) of the second drive housing 1857*b*, and then may flow toward the third electric chamber ES3 (arrow ⑥) by passing through the power supply unit 1770. In this process, the fourth heat source module 1100 may be cooled.

FIGS. 49 to 52 are views showing an air circulation structure in the cooking appliance according to an embodiment of the present disclosure. The cooking appliance may include the first heat source module 400, the second heat source module 500, the third heat source module 600, and the fourth heat source module 1100, so that heat generated from the heat sources needs to be cooled. Hereinbelow, a cooling structure of the heat sources and other parts will be described.

First, as parts required to be cooled in the embodiment: (i) in the first electric chamber ES1, the lighting fixture 790, cooling of the distance sensor 710, the third heat source module 600, the third temperature sensor (not shown), and the power supply unit 1770 may be required; (ii) in the second electric chamber ES2, cooling of the second heat source module 500 may be required; (iii) in the third electric chamber ES3, cooling of the fourth heat source module 1100 and the camera module 730 may be required; and (iv) in the fifth electric chamber ES5, the main controller 700, the humidity sensing module 750, the second temperature sensor 760, and the temperature block switch (not shown) may be required.

In order to perform the cooling of the parts, the embodiment may include the first cooling fan module 1810 and the second cooling fan module 1850 described above. The first cooling fan module 1810 may cool the second electric chamber ES2 and the third electric chamber ES3, and the second cooling fan module 1850 may cool the first electric chamber ES1, the second electric chamber ES2, and the fifth electric chamber ES5. Of course, the first cooling fan module 1810 may also be arranged at the upper portion of the casing 100, 200, thereby cooling a part of the first electric chamber ES1. Furthermore, the first cooling fan module 1810 may discharge air toward the duct assembly 920 arranged in the third electric chamber ES3, so that the first cooling fan module 1810 may serve to supply the air into the cavity S.

Specifically, as shown in FIG. 47, both the air inlet part 242 through which external air is suctioned and the air outlet part 243 through which air is discharged may be arranged at a front surface of the cooking appliance. The external air may be introduced into an upper portion of the front surface of the cooking appliance and circulate in the cooking appliance and then be discharged through a lower portion of the front surface of the cooking appliance. Accordingly, even when the cooking appliance is installed in a built-in manner, efficient air circulation may be performed.

Furthermore, as shown in FIGS. 47 and 48, the plurality of electric chambers may be provided outside the inner casing 100, and air may efficiently cool the parts while flowing through the electric chambers. Herein, the air barrier 950 may prevent air introduced into the second electric chamber ES2 from moving upward through the fourth electric chamber ES4, and therefore, the air may cool the second heat source module 500 of the second electric chamber ES2 and then move forward to flow through the air outlet part 243.

The insulation upper plate 270 and the insulation rear plate 280 may be arranged outside the inner casing 100 and may prevent heat in the cavity S from being directly transferred to the parts. The insulation upper plate 270 and the insulation rear plate 280 may perform the cooling performance of the cooking appliance together with the first cooling fan module 1810 and the second cooling fan module 1850.

As shown in FIG. 47, the first cooling fan module 1810 may be arranged at the insulation upper plate 270, more specifically, at a position closer to the third electric chamber ES3 and the fourth electric chamber ES4 (left side in the drawing) based on a center portion of the insulation upper plate 270. The second cooling fan module 1850 may also be arranged at the insulation upper plate 270, more specifically, at a position closer to the fifth electric chamber ES5 based on a center portion of the insulation upper plate 270.

As shown in FIG. 49, the view shows flows of air suctioned by the first cooling fan module 1810 and the second cooling fan module 1850. Air suctioned through the outer front plate 240 may be introduced into the first cooling fan module 1810. Herein, the air may be introduced toward the first cooling fan module 1810 in two streams. Herein, air introduced along the left side (direction of arrow ①) of the cooking appliance by the first cooling fan module 1810 may flow along a gap between the heater housing 632 of the third heat source module 600 and the outer upper plate 230 (which is omitted in FIG. 49) arranged at a left edge of the casing 100, 200. Air introduced along the right side (direction of arrow ②) of the cooking appliance by the first cooling fan module 1810 may flow along a gap between the heater housing 632 of the third heat source module 600 and the guide fence GF.

As described above, in the process in which air is suctioned into the first cooling fan module 1810, the distance sensor 710, the lighting fixture 790, and the third heat source module 600 may be cooled. Furthermore, the power supply unit 1770 arranged on the flow path of air may be cooled. Arrow ③ represents a direction in which air suctioned into the first cooling fan module 1810 pass through the power supply unit 1770. Therefore, the power supply unit 1770 may be cooled by the first cooling fan module 1810.

At the same time, the second cooling fan module 1850 may also suction external air through the outer front plate 240. Air introduced toward the second cooling fan module 1850 (direction of arrow ④) may cool the first electric chamber ES1 while flowing toward the second cooling fan module 1850. Herein, two streams of air may be suctioned toward the first drive housing 1857a and the second drive housing 1857b included in the second cooling fan module 1850. Air suctioned toward the first drive housing 1857a may be introduced through the air inlet part 242 of the outer front plate 240, and may cool a front portion of the first electric chamber ES1 closer to the door 300.

The air suctioned by the first cooling fan module 1810 and the second cooling fan module 1850 may flow to the lower portion of the cooking appliance Referring to FIG. 5, the air suctioned by the first cooling fan module 1810 may be discharged downward, i.e., toward the third electric chamber ES3 (direction of arrow ①). In this process, the magnetron 410 of the first heat source module 400 may be cooled. The magnetron 410 constituting the first heat source module 400 is arranged at a lower portion of the first cooling fan module 1810, so that air discharged downward (direction of arrow ①) from the first cooling fan module 1810 may cool the magnetron 410 while flowing. Air passing through the third electric chamber ES3 may then be introduced into the second electric chamber ES2 through the ventilation part 283 provided at the lower portion of the insulation rear plate 280.

Meanwhile, as shown in FIG. 52, air suctioned into the first drive housing 1857a of the second cooling fan module 1850 may be discharged downward, i.e., toward the fifth electric chamber ES5 (direction of arrow ④). In this process, the main controller 700 and the humidity sensing module 750 arranged at the exhaust duct 940, and the second temperature sensor 760 may be cooled. Specifically, the main controller 700 generating high temperature heat may be arranged below the first drive housing 1857a, so that the main controller 700 may be efficiently cooled.

Next, air passing through the fifth electric chamber ES5 may be introduced into the second electric chamber ES2, air cooling the second heat source module 500 in the second electric chamber ES2 may be discharged to the outside space (direction of arrow ③) through the air outlet part 243.

Meanwhile, air suctioned into the second drive housing 1857b of the second cooling fan module 1850 may be discharged in a horizontal direction, not the direction of gravity. Specifically, as shown in FIG. 50, air suctioned into the second drive housing 1857b may be discharged toward the first electric chamber ES1, i.e., the power supply unit 1770 through an outlet 1857b' of the second drive housing 1857b (referring to FIG. 48). Accordingly, the second cooling fan module 1850 may cool the power supply unit 1770.

The air cooling the power supply unit 1770 may flow downward. As shown in FIG. 50, air discharged from the second drive housing 1857b may be discharged toward the power supply unit 1770 and then flow downward to the third electric chamber ES3 (arrow ②). In this process, the fourth heat source module 1100 may be cooled. Air passing through the fourth heat source module 1100 may be finally introduced into the second electric chamber ES2 and then flow forward to be discharged through the air outlet part 243.

As shown in FIG. 52, air may also be transferred toward the second electric chamber ES2 through the exhaust duct 940. The exhaust duct 940 may guide air, which is discharged from the cavity S, downward (direction of arrow ⑤) to transfer the air to the second electric chamber ES2. The air discharged from the cavity S may also be discharged to the outside space (direction of arrow ③) through the air outlet part 243.

Herein, the air introduced into the second electric chamber ES2 by the first cooling fan module 1810 and the second cooling fan module 1850 may flow only forward, and may not be re-introduced into the fourth electric chamber ES4. This is because the air barrier 950 may be arranged below the fourth electric chamber ES4. As shown in FIG. 52, the air barrier 950 may guide air forward.

FIG. 51 is a view showing the fourth electric chamber ES4. As shown, the wave guide 420 constituting the first heat source module 400 and the supply duct 910 may be arranged in the fourth electric chamber ES4. Air discharged to the lower side of the first cooling fan module 1810 (arrow ①) may be introduced into the supply duct 910. Herein, although not shown in FIG. 51, when the duct assembly 920 provided in the supply duct 910 is opened, the air discharged from the first cooling fan module 1810 may be introduced into the supply duct 910 through the duct assembly 920. The air flowing forward (direction of arrow ③) along the supply duct 910 may be introduced into the cavity S through the inlet port 123 (referring to FIG. 47). Arrow ④ represents a moving direction of air introduced into the cavity S. In FIG. 51, arrow ② represents a direction in which air discharged from the first cooling fan module 1810 and introduced into the second electric chamber ES2 flows along the opposite portion of the air barrier 950.

Through the flow of air as described above, the first heat source module 400 to the fourth heat source module 1100, the power supply unit 1770, the magnetron 410, the main controller 700, etc. may be cooled. Furthermore, the flow paths of the embodiment may prevent air from flowing backward, and may guide air in a constant direction to perform efficient cooling. Specifically, in the embodiment, even when a separate tubular structure is not provided, a flow of air may be generated by using a gap between the parts.

Embodiments of the present disclosure are described with reference to the accompanying drawings. The disclosure may, however, be embodied in many different manners and should not be construed as limited to the embodiments set forth herein. It is understood that a person having ordinary skill in the art to which the present disclosure art would implement this disclosure in other specific manners without changing the technical idea or necessary features of the present disclosure. For this reason, the disclosed embodiments are intended to be illustrative in all aspects, and not restrictive.

What is claimed is:

1. A cooking appliance comprising:
a casing having a cavity therein;
a first heat source arranged in the casing, to emit microwaves toward the cavity; and
a second heat source at a bottom surface of the casing, to emit magnetic fields toward the cavity,
wherein the second heat source comprises:
a base plate having a base hole that is open at a center portion thereof;
a supporter arranged below the base plate;

a coil assembly arranged between the base plate and the supporter, and comprising a coil base and a working coil; and a shield filter provided above the working coil, an outer end of the shield filter arranged between the base plate and the coil base, and wherein upper and lower surfaces of the outer end of the shield filter are respectively in surface-contact with the base plate and the coil base.

2. The cooking appliance of claim 1, wherein the outer end of the shield filter is pressed between the base plate and the coil base.

3. The cooking appliance of claim 1, wherein the base plate comprises a filter cover arranged along a rim of the base hole, and the filter cover is stacked on the shield filter.

4. The cooking appliance of claim 3, wherein an outer end of the coil base comprises a filter supporter arranged parallel to the filter cover, and the filter supporter is stacked under the shield filter.

5. The cooking appliance of claim 4, wherein the filter cover is connected to a first inclined portion, the filter supporter is connected to a second inclined portion, and the first inclined portion and the second inclined portion are arranged to face each other at positions outside the outer end of the shield filter in a radial direction of the shield filter.

6. The cooking appliance of claim 5, wherein both the first inclined portion and the second inclined portion extend to incline downward toward the supporter, or wherein a gap between the first inclined portion and the second inclined portion narrows going further away from the outer end of the shield filter.

7. The cooking appliance of claim 3, wherein the coil base has a clearance between the filter cover and an outer end of the working coil, and the clearance is continuous along a circumferential direction of the coil base.

8. The cooking appliance of claim 4, wherein an outer end of the working coil and the filter supporter of the coil base are spaced apart from each other in a radial direction of the working coil, and a space is formed between the outer end of the working coil and the filter supporter of the coil base.

9. The cooking appliance of claim 1, wherein the shield filter has a structure in which a graphite filter and a mica sheet are stacked.

10. The cooking appliance of claim 1, wherein a diameter of the shield filter is larger than a diameter of the working coil, and is smaller than a diameter of the supporter, and the diameter of the shield filter is larger than a diameter of the base hole, and is smaller than a diameter of the coil base.

11. The cooking appliance of claim 1, wherein the shield filter is composed of any one of graphite, graphene, carbon fabric, carbon paper, and carbon felt.

12. The cooking appliance of claim 3, wherein the base plate comprises:

a filter cover provided to surround an edge of the base hole;

a first inclined portion connected to the filter cover, and extending while inclined;

a depressed portion connected to the first inclined portion, and depressed in a direction toward the supporter; and a seating portion connected to the depressed portion, to support a cover plate.

13. The cooking appliance of claim 12, wherein the seating portion is positioned higher than the filter cover with respect to the supporter.

14. The cooking appliance of claim 12, wherein an outer end of the seating portion is connected to a seating fence, and the seating fence protrudes upward with respect to the seating portion and surrounds an edge of the cover plate.

15. The cooking appliance of claim 14, wherein both the seating fence and the cover plate provide a bottom surface of the cavity, and a surface of the seating fence and a surface of the cover plate form a continuous surface together.

16. The cooking appliance of claim 1, further comprising:

a mounting bracket arranged between the base plate and the supporter, and wherein the mounting bracket comprises:

a bracket lower portion coupled to the supporter;

a bracket upper portion coupled to the base plate; and a bracket connection portion connecting the bracket lower portion to the bracket upper portion, and having a bracket heat dissipation hole.

17. The cooking appliance of claim 16, wherein the bracket upper portion is in surface-contact with a seating portion of the base plate.

18. The cooking appliance of claim 1, wherein a cover plate covering the base hole is arranged above an upper portion of the shield filter, and wherein an upper surface of the cover plate and an upper surface of the base plate form a continuous surface together.

19. The cooking appliance of claim 16, wherein the supporter has a guide protrusion that protrudes from the supporter, and the mounting bracket has a guide hole into which the guide protrusion is fitted.

20. A cooking appliance comprising:

an inner casing comprising an inner side plate, an inner rear plate, and an inner upper plate;

an outer casing arranged outside the inner casing, and comprising an outer side plate, an outer rear plate, an outer upper plate, and an outer lower plate;

a first heat source arranged between the inner side plate and the outer side plate, to emit microwaves; and a second heat source arranged above the outer lower plate, and providing a bottom surface of the inner casing, wherein the second heat source comprises:

a base plate having a base hole that is open at a center portion thereof;

a supporter arranged below the base plate;

a coil assembly arranged between the base plate and the supporter; and a shield filter to pass magnetic fields generated by the coil assembly, and block the microwaves emitted from the first heat source, wherein an edge of the shield filter is pressed between the base plate and the coil assembly, and wherein upper and lower surfaces of the edge of the shield filter are respectively in surface-contact with the base plate and a coil base of the coil assembly.

* * * * *